(12) United States Patent
Miura et al.

(10) Patent No.: US 11,804,697 B2
(45) Date of Patent: Oct. 31, 2023

(54) LASER SYSTEM AND ELECTRONIC DEVICE MANUFACTURING METHOD

(71) Applicant: Gigaphoton Inc., Tochigi (JP)

(72) Inventors: Taisuke Miura, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 429 days.

(21) Appl. No.: 17/192,205

(22) Filed: Mar. 4, 2021

(65) Prior Publication Data
US 2021/0194215 A1 Jun. 24, 2021

Related U.S. Application Data

(63) Continuation of application No. PCT/JP2018/039341, filed on Oct. 23, 2018.

(51) Int. Cl.
*H01S 5/068* (2006.01)
*H01S 3/225* (2006.01)
(Continued)

(52) U.S. Cl.
CPC ........ *H01S 5/4012* (2013.01); *H01S 5/06821* (2013.01); *H01S 5/06837* (2013.01); *H01S 5/50* (2013.01)

(58) Field of Classification Search
CPC .............. H01S 5/4012; H01S 5/06821; H01S 5/06837; H01S 5/50; H01S 5/0683;
(Continued)

(56) References Cited

U.S. PATENT DOCUMENTS 6,373,869 B1 4/2002 Jacob
7,593,437 B2 * 9/2009 Staroudoumov ..... G02F 1/3534
372/21
(Continued)

FOREIGN PATENT DOCUMENTS

CN 107210576 A 9/2017
CN 108352673 A 7/2018
(Continued)

OTHER PUBLICATIONS

International Search Report issued in PCT/JP2018/039341; dated Jan. 15, 2019.
(Continued)

*Primary Examiner* — Xinning(Tom) Niu
(74) *Attorney, Agent, or Firm* — Studebaker & Brackett PC

(57) ABSTRACT

A laser system according to one aspect of the present disclosure includes a first solid-state laser device, a wavelength conversion system, an excimer amplifier, and a control unit. The first solid-state laser device includes a first multiple semiconductor laser system, a first semiconductor optical amplifier, and a first fiber amplifier. The first multiple semiconductor laser system includes a plurality of first semiconductor lasers configured to perform continuous wave oscillation in a single longitudinal mode with different wavelengths, a first spectrum monitor, and a first beam combiner. The control unit controls an oscillation wavelength and light intensity of each line of a first multiline spectrum generated by the first semiconductor lasers to obtain an excimer laser beam having at least a target center wavelength or a target spectral line width instructed by an external device.

20 Claims, 69 Drawing Sheets

(51) Int. Cl.
  *H01S 3/23* (2006.01)
  *H01S 5/40* (2006.01)
  *H01S 5/0683* (2006.01)
  *H01S 5/50* (2006.01)

(58) Field of Classification Search
  CPC .. H01S 5/0687; H01S 3/06754; H01S 3/2308; H01S 3/2366; H01S 5/0092; H01S 3/225; H01S 3/2375; G02F 1/353; G02F 1/392
  See application file for complete search history.

(56) References Cited

U.S. PATENT DOCUMENTS

| | | | |
|---|---|---|---|
| 9,812,841 B2* | 11/2017 | Onose | H01S 3/2391 |
| 9,929,529 B2* | 3/2018 | Onose | H01S 3/10015 |
| 2004/0012844 A1 | 1/2004 | Ohtsuki et al. | |
| 2006/0222372 A1* | 10/2006 | Spinelli | H01S 3/2383 398/183 |
| 2013/0064259 A1 | 3/2013 | Wakabayashi et al. | |
| 2013/0215916 A1 | 8/2013 | Kakizaki et al. | |
| 2017/0338619 A1 | 11/2017 | Onose et al. | |
| 2018/0196330 A1* | 7/2018 | Kobayashi | H01S 3/067 |
| 2018/0254600 A1 | 9/2018 | Kumazaki et al. | |
| 2019/0245321 A1 | 8/2019 | Kakizaki et al. | |

FOREIGN PATENT DOCUMENTS

| | | |
|---|---|---|
| JP | 2011-187521 A | 9/2011 |
| JP | 2011-249399 A | 12/2011 |
| JP | 2013-062484 A | 4/2013 |
| WO | 2011/148895 A1 | 12/2011 |
| WO | 2016/142996 A1 | 9/2016 |
| WO | 2018/105082 A1 | 6/2018 |

OTHER PUBLICATIONS

International Preliminary Report on Patentability and Written Opinion issued in PCT/JP2018/039341; dated Apr. 27, 2021.

An Office Action; "Decision to Grant a Patent," mailed by the Japanese Patent Office dated Oct. 12, 2022, which rresponds to Japanese Patent Application No. 2020-551744 and is related to U.S. Appl. No. 17/192,205; with English language translation.

Notice of Decision of Granting Patent Right mailed by China National Intellectual Property Administration dated May 29, 2023, which corresponds to Chinese Patent Application No. 201880097096.4 and is related to U.S. Appl. No. 17/192,205; with English language translation.

* cited by examiner

LASER SYSTEM AND ELECTRONIC DEVICE MANUFACTURING METHOD

CROSS-REFERENCE TO RELATED APPLICATIONS

The present application is a continuation application of International Application No. PCT/JP2018/039341, filed on Oct. 23, 2018, the entire contents of which are hereby incorporated by reference.

BACKGROUND

1. Technical Field

The present disclosure relates to a laser system and an electronic device manufacturing method.

2. Related Art

Improvement in resolution of semiconductor exposure apparatuses (hereinafter simply referred to as "exposure apparatuses") has been desired due to miniaturization and high integration of semiconductor integrated circuits. For this purpose, exposure light sources that output light with shorter wavelengths have been developed. As the exposure light source, a gas laser apparatus is used in place of a conventional mercury lamp. As a gas laser apparatus for exposure, a KrF excimer laser apparatus that outputs ultraviolet light having a wavelength of 248 nm and an ArF excimer laser apparatus that outputs ultraviolet light having a wavelength of 193 nm are currently used.

As current exposure technology, immersion exposure is practically used in which a gap between a projection lens of an exposure apparatus and a wafer is filled with a liquid and a refractive index of the gap is changed to reduce an apparent wavelength of light from an exposure light source. When the immersion exposure is performed using the ArF excimer laser apparatus as the exposure light source, the wafer is irradiated with ultraviolet light having a wavelength of 134 nm in the water. This technology is referred to as ArF immersion exposure (or ArF immersion lithography).

The KrF excimer laser apparatus and the ArF excimer laser apparatus have a large spectral line width of about 350 to 400 pm in spontaneous oscillation. Thus, chromatic aberration of a laser beam (ultraviolet light), which is reduced and projected on a wafer by a projection lens of an exposure apparatus, occurs to reduce resolution. Then, a spectral line width (also referred to as a spectral width) of a laser beam output from the gas laser apparatus needs to be narrowed to the extent that the chromatic aberration can be ignored. For this purpose, a line narrowing module (LNM) having a line narrowing element is provided in a laser resonator of the gas laser apparatus to narrow the spectral width. The line narrowing element may be etalon, grating, or the like. A laser apparatus with such a narrowed spectral width is referred to as a line narrowing laser apparatus.

LIST OF DOCUMENTS

Patent Documents

Patent Document 1: US Published Patent Application No. 2013/0215916
Patent Document 2: US Published Patent Application No. 2004/0012844
Patent Document 3: U.S. Pat. No. 9,929,529
Patent Document 4: Japanese Unexamined Patent Application Publication No. 2011-187521
Patent Document 5: Japanese Unexamined Patent Application Publication No. 2011-249399

SUMMARY

A laser system according to one aspect of the present disclosure includes a first solid-state laser device configured to output a first pulse laser beam; a wavelength conversion system configured to wavelength-convert the first pulse laser beam output from the first solid-state laser device; an excimer amplifier configured to amplify a second pulse laser beam wavelength-converted by the wavelength conversion system; and a control unit configured to control at least a center wavelength or a spectral line width of an excimer laser beam output from the excimer amplifier, the first solid-state laser device including a first multiple semiconductor laser system, a first semiconductor optical amplifier configured to pulse-amplify a laser beam output from the first multiple semiconductor laser system, and a first fiber amplifier including a first optical fiber configured to amplify the pulse laser beam output from the first semiconductor optical amplifier, the first multiple semiconductor laser system including a plurality of first semiconductor lasers configured to perform continuous wave oscillation in a single longitudinal mode with different wavelengths, a first beam combiner configured to combine laser beams output from the first semiconductor lasers and output a laser beam having a first multiline spectrum including a plurality of peak wavelengths, and a first spectrum monitor configured to receive part of the continuous wave laser beams output from the first semiconductor lasers and measure a wavelength and light intensity of each of the laser beams output from the first semiconductor lasers, the control unit controlling an oscillation wavelength and light intensity of each line of the first multiline spectrum generated by the first semiconductor lasers to obtain an excimer laser beam having at least a target center wavelength or a target spectral line width instructed by an external device.

An electronic device manufacturing method according to another aspect of the present disclosure includes generating an excimer laser beam with a laser system, the laser system including a first solid-state laser device configured to output a first pulse laser beam, a wavelength conversion system configured to wavelength-convert the first pulse laser beam output from the first solid-state laser device, an excimer amplifier configured to amplify a second pulse laser beam wavelength-converted by the wavelength conversion system, and a control unit configured to control at least a center wavelength or a spectral line width of an excimer laser beam output from the excimer amplifier, the first solid-state laser device including a first multiple semiconductor laser system, a first semiconductor optical amplifier configured to pulse-amplify a laser beam output from the first multiple semiconductor laser system, and a first fiber amplifier including a first optical fiber configured to amplify the pulse laser beam output from the first semiconductor optical amplifier, the first multiple semiconductor laser system including a plurality of first semiconductor lasers configured to perform continuous wave oscillation in a single longitudinal mode with different wavelengths, a first beam combiner configured to combine laser beams output from the first semiconductor lasers and output a laser beam having a first multiline spectrum including a plurality of peak wavelengths, and a first spectrum monitor configured to receive part of the continuous wave laser beams output from the first semiconductor lasers and measure a wavelength and light intensity of each of the laser beams output from the first semiconductor lasers, the control unit controlling an oscillation wavelength and light intensity of each line of the first multiline spectrum generated by the first semiconductor lasers to obtain an excimer laser beam having at least a target center wavelength or a target spectral line width instructed by an external device; outputting the excimer laser beam to an exposure apparatus; and exposing the excimer laser beam onto a photosensitive substrate within the exposure apparatus to manufacture an electronic device.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
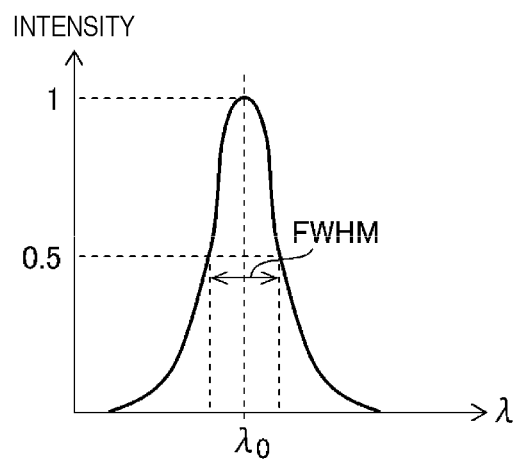
FIG. 1 shows a typical spectral shape of a laser beam.

<Contents>
1. Terms
  1.1 Definition of spectral line width $\Delta\lambda$ of excimer laser beam
  1.2 Definition of spectral line width $\Delta\lambda m$ and center wavelength $\lambda mc$ of multiline
2. Overview of laser system
  2.1 Configuration
  2.2 Operation
  2.3 Example of processing of laser control unit
  2.4 Example of processing of solid-state laser system control unit
  2.5 Example of semiconductor laser system
    2.5.1 Configuration
    2.5.2 Operation
  2.6 Example of processing of first semiconductor laser control unit
  2.7 Example of processing of second semiconductor laser control unit
3. Problem
4. Embodiment 1
  4.1 Configuration
  4.2 Operation
  4.3 Example of processing of laser control unit
  4.4 Control example 1 of first multiple semiconductor laser system
  4.5 Control example 1 of second multiple semiconductor laser system
  4.6 Example of processing of solid-state laser system control unit
  4.7 Example of processing of first multiline control unit
  4.8 Example of processing of second multiline control unit
  4.9 Effect
  4.10 Variant
    4.10.1 Control example 2 of first multiple semiconductor laser system 4.10.2 Control example 2 of second multiple semiconductor laser system
5. Embodiment 2
  5.1 Configuration
  5.2 Operation
    5.2.1 Control example 3 of first multiple semiconductor laser system
    5.2.2 Control example 3 of second multiple semiconductor laser system
  5.3 Effect
  5.4 Variant
    5.4.1 Control example 4 of first multiple semiconductor laser system
    5.4.2 Control example 4 of second multiple semiconductor laser system
6. Variant 1 of multiple semiconductor laser system
  6.1 Configuration
  6.2 Operation
7. Variant 2 of multiple semiconductor laser system
  7.1 Configuration
  7.2 Operation
8. Specific example of spectrum monitor
  8.1 Example of spectrum monitor using spectrometer and reference laser beam source
    8.1.1 Configuration
    8.1.2 Operation
  8.2 Example of spectrum monitor using heterodyne interferometer
    8.2.1 Configuration
    8.2.2 Operation
    8.2.3 Example of beat signal
    8.2.4 Variant
9. Example of excimer amplifier
  9.1 Multipath amplification
  9.2 Amplification with ring resonator
10. Example of spectrum monitor using etalon spectrometer
11. Example of beam combiner
  11.1 Beam combiner including optical fiber
  11.2 Beam combiner including half mirror and high reflective mirror
12. Another example of single longitudinal mode semiconductor laser
  12.1 Configuration
  12.2 Operation
  12.3 Others
13. Example of CW oscillation reference laser beam source
  13.1 CW oscillation reference laser beam source of wavelength region of 1030 nm
  13.2 CW oscillation reference laser beam source of wavelength region of 1554 nm
14. Example of multi-longitudinal mode CW oscillation semiconductor laser
15. SBS suppression by chirping
16. Example of semiconductor optical amplifier
  16.1 Configuration
  16.2 Operation
17. Embodiment 3
  17.1 Configuration
  17.2 Operation
  17.3 Control example of third multiple semiconductor laser system
  17.4 Effect
  17.5 Variant
18. Electronic device manufacturing method
19. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Terms 1.1 Definition of Spectral Line Width $\Delta\lambda$ of Excimer Laser Beam A line width of 95% of total spectral width area of an excimer laser beam is herein defined as a spectral line width $\Delta\lambda$ of the excimer laser beam. Generally, as shown in FIG. 1, a spectral line width refers to a full width of a spectral waveform of a laser beam at a light amount threshold. For example, a half of a peak value is referred to as a line width threshold of 0.5. A full width W1/2 of the spectral waveform at the line width threshold of 0.5 is particularly referred to as a full width at half maximum (FWHM). Only with the full width at half maximum of the spectrum of the excimer laser beam, however, reflection of resolving power of a projection lens is difficult.

Figure 2:
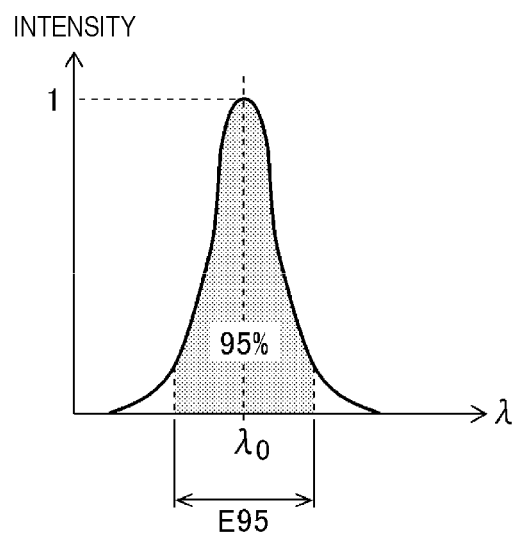
FIG. 2 illustrates a definition of a spectral line width of an excimer laser beam.

Then, for example, as shown in FIG. 2, a spectral line width $\Delta\lambda$ that reflects resolving power of a projection lens is a full width W95% that is 95% of total spectrum energy with a wavelength $\lambda 0$ at a center, and Expression (1) below is satisfied.

[Expression 1]

$$\frac{\int_{-\frac{\Delta\lambda}{2}}^{\frac{\Delta\lambda}{2}} g(\lambda + \lambda_0) d\lambda}{\int_{-\infty}^{\infty} g(\lambda + \lambda_0) d\lambda} = 0.95 \qquad (1)$$

The spectral line width $\Delta\lambda$ of the excimer laser beam may be herein a spectral line width that reflects resolving power of a projection lens, not limited to the line width of 95% of the full spectral width area. For example, a spectral line width may be evaluated with resolving power calculated by inputting a wavelength and light intensity distribution in accordance with data of a projection lens used and a spectral waveform of the excimer laser beam. The excimer laser beam is herein sometimes referred to as "excimer beam".

Figure 3:
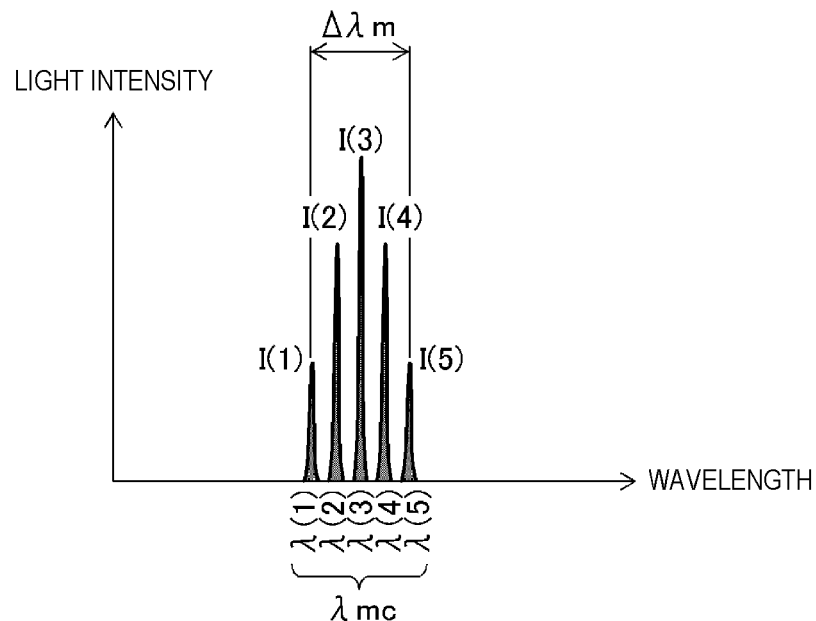
FIG. 3 illustrates a definition of a spectral line width and a center wavelength of multiline.
Figure 4:
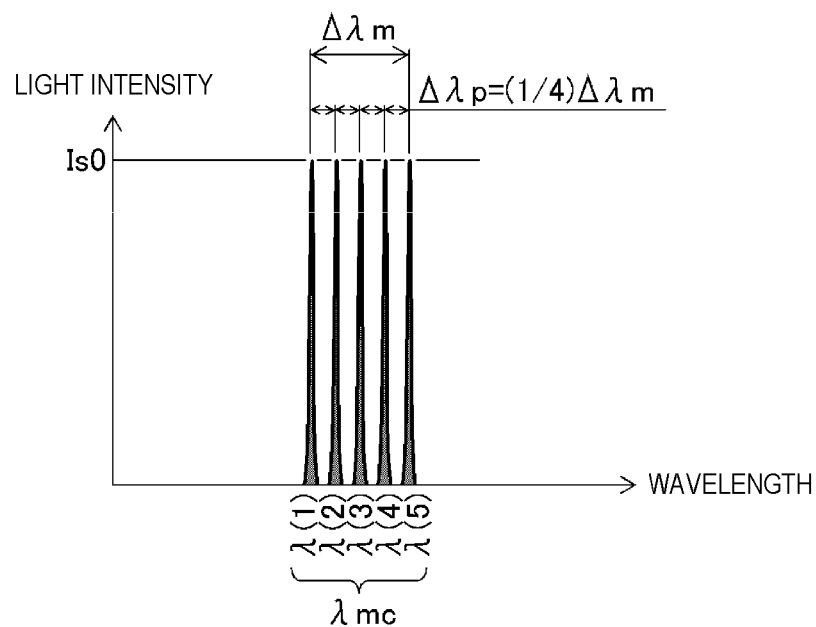
FIG. 4 shows an example of a spectral shape of the multiline having the same light intensity.

1.2 Definition of Spectral Line Width $\Delta\lambda m$ and Center Wavelength $\lambda mc$ of Multiline The term "multiline" herein refers to a spectrum representing distribution of light intensity of each wavelength and including a plurality of peak wavelengths as illustrated in FIGS. 3 and 4, and is synonymous with "multiline spectrum". The term "multiline" sometimes refers to a laser beam having a multiline spectrum. The multiline can be obtained, for example, by combining a plurality of laser beams output from a plurality of single longitudinal mode semiconductor lasers having different wavelengths. In this case, a wavelength (peak wavelength) of each line of the multiline corresponds to an oscillation wavelength of each semiconductor laser.

A spectral line width $\Delta\lambda m$ and a center wavelength $\lambda mc$ of multiline are defined as below. As shown in FIG. 3, a spectral line width $\Delta\lambda m$ of n-line multiline is defined as a difference between a maximum wavelength $\lambda(n)$ and a minimum wavelength λ(1). The number n is an integer equal to or larger than 2, and FIG. 3 shows an example of n being 5.

$$\Delta\lambda m = \lambda max - \lambda min = \lambda(n) - \lambda(1) \quad (2)$$

The center wavelength λmc of the multiline is defined as a wavelength of a spectrum centroid as in Expression (3) below.

[Expression 3]

$$\lambda mc = \Sigma_{k=1}^{n} I(k) \cdot \lambda(k) / \Sigma_{k=1}^{n} I(k) \quad (3)$$

As shown in FIG. 4, when the n-line multiline have the same light intensity and adjacent lines of the n-line multiline have the same wavelength interval Δλp therebetween, the center wavelength λmc is an average value of wavelengths of the n-line multiline from Expression 4.

[Expression 4]

$$\lambda mc = \Sigma_{k=1}^{n} \lambda(k)/n \quad (4)$$

2. Overview of Laser System

2.1 Configuration

Figure 5:
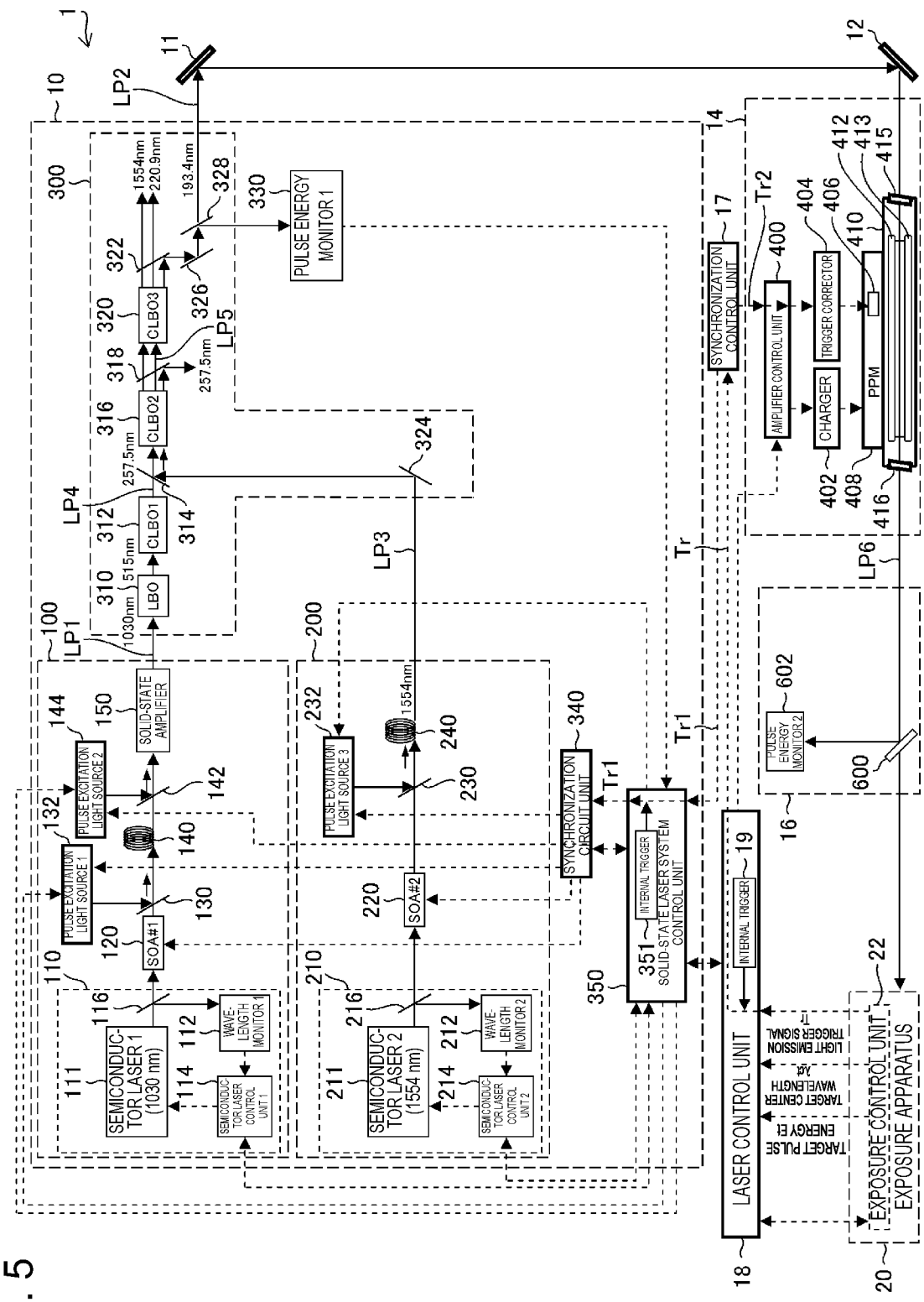
FIG. 5 schematically shows an exemplary configuration of a laser system.

FIG. 5 schematically shows an exemplary configuration of a laser system 1. The laser system 1 includes a solid-state laser system 10, a first high reflective mirror 11, a second high reflective mirror 12, an excimer amplifier 14, a monitor module 16, a synchronization control unit 17, and a laser control unit 18.

The solid-state laser system 10 includes a first solid-state laser device 100, a second solid-state laser device 200, a wavelength conversion system 300, a first pulse energy monitor 330, a synchronization circuit unit 340, and a solid-state laser system control unit 350.

The first solid-state laser device 100 includes a first semiconductor laser system 110 that outputs a laser beam having a wavelength of about 1030 nm, a first semiconductor optical amplifier 120, a first dichroic mirror 130, a first pulse excitation light source 132, a first fiber amplifier 140, a second dichroic mirror 142, a second pulse excitation light source 144, and a solid-state amplifier 150.

The first semiconductor laser system 110 includes a first semiconductor laser 111 that performs continuous wave (CW) oscillation in a single longitudinal mode to output a laser beam having a wavelength of about 1030 nm, a first wavelength monitor 112, a first semiconductor laser control unit 114, and a first beam splitter 116. The term "CW" refers to continuous wave, and the term "CW oscillation" refers to continuous wave oscillation.

The first semiconductor laser 111 may be, for example, a distributed feedback (DFB) semiconductor laser, and can change an oscillation wavelength near the wavelength of 1030 nm by current control and/or temperature control. The distributed feedback semiconductor laser is referred to as "DFB laser".

The first beam splitter 116 is arranged to reflect part of the laser beam output from the first semiconductor laser 111 and cause the laser beam to enter the first wavelength monitor 112. The first wavelength monitor 112 monitors a spectrum of the incident laser beam and detects the oscillation wavelength of the first semiconductor laser 111.

The first semiconductor laser control unit 114 is connected to the first wavelength monitor 112 and the solid-state laser system control unit 350, and controls operation of the first semiconductor laser 111.

The first semiconductor optical amplifier 120 is arranged in an optical path of the laser beam having passed through the first beam splitter 116. The first semiconductor optical amplifier 120 pulse-amplifies the laser beam output from the first semiconductor laser system 110.

The first dichroic mirror 130 is coated with a film that highly transmits the laser beam output from the first semiconductor optical amplifier 120 and highly reflects excitation light output from the first pulse excitation light source 132. The first dichroic mirror 130 is arranged such that the pulse laser beam output from the first semiconductor optical amplifier 120 and the excitation light output from the first pulse excitation light source 132 enter the first fiber amplifier 140.

The first fiber amplifier 140 may be a Yb fiber amplifier that uses an optical fiber doped with ytterbium (Yb). The Yb-doped optical fiber is an example of "first optical fiber" in the present disclosure. The second dichroic mirror 142 is coated with a film that highly transmits the laser beam output from the first fiber amplifier 140 and highly reflects excitation light output from the second pulse excitation light source 144. The second dichroic mirror 142 is arranged such that the pulse laser beam output from the first fiber amplifier 140 and the excitation light output from the second pulse excitation light source 144 enter the solid-state amplifier 150.

The solid-state amplifier 150 may include, for example, a Yb-doped crystal or ceramics. The pulse laser beam amplified by the solid-state amplifier 150 enters the wavelength conversion system 300. The pulse laser beam output from the first solid-state laser device 100 may be the pulse laser beam amplified by the solid-state amplifier 150. The pulse laser beam output from the first solid-state laser device 100 is referred to as a first pulse laser beam LP1. The first pulse laser beam LP1 wavelength-converted by the wavelength conversion system 300 and output from the wavelength conversion system 300 is referred to as a second pulse laser beam LP2.

The second solid-state laser device 200 includes a second semiconductor laser system 210 that outputs a laser beam having a wavelength of about 1554 nm, a second semiconductor optical amplifier 220, a third dichroic mirror 230, a third pulse excitation light source 232, and a second fiber amplifier 240.

The second semiconductor laser system 210 includes a second semiconductor laser 211 that performs CW oscillation in a single longitudinal mode to output a laser beam having a wavelength of about 1554 nm, a second wavelength monitor 212, a second semiconductor laser control unit 214, and a second beam splitter 216.

The second semiconductor laser 211 may be, for example, a DFB laser, and can change an oscillation wavelength near the wavelength of 1554 nm by current control and/or temperature control.

The second beam splitter 216 is arranged to reflect part of the laser beam output from the second semiconductor laser 211 and cause the laser beam to enter the second wavelength monitor 212. The second wavelength monitor 212 monitors a spectrum of the incident laser beam and detects the oscillation wavelength of the second semiconductor laser 211.

The second semiconductor laser control unit 214 is connected to the second wavelength monitor 212 and the solid-state laser system control unit 350, and controls operation of the second semiconductor laser 211.

The second semiconductor optical amplifier 220 is arranged in an optical path of the laser beam having passed through the second beam splitter 216. The second semiconductor optical amplifier 220 pulse-amplifies the laser beam output from the second semiconductor laser system 210.

The third dichroic mirror 230 is coated with a film that highly transmits the pulse laser beam output from the second semiconductor optical amplifier 220 and highly reflects excitation light output from the third pulse excitation light source 232. The third dichroic mirror 230 is arranged such that the pulse laser beam output from the second semiconductor optical amplifier 220 and the excitation light output from the third pulse excitation light source 232 enter the second fiber amplifier 240.

The second fiber amplifier 240 may be an erbium (Er) fiber amplifier that uses an optical fiber doped with Er. The Er-doped optical fiber is an example of "second optical fiber" in the present disclosure. The pulse laser beam amplified by the second fiber amplifier 240 enters the wavelength conversion system 300. The pulse laser beam output from the second solid-state laser device 200 may be the pulse laser beam amplified by the second fiber amplifier 240. The pulse laser beam output from the second solid-state laser device 200 is referred to as a third pulse laser beam LP3.

The wavelength conversion system 300 includes an LBO ($LiB_3O_5$) crystal 310 and a first CLBO ($CsLiB_6O_{10}$) crystal 312 that are nonlinear crystals, a fourth dichroic mirror 314, a second CLBO crystal 316, a fifth dichroic mirror 318, a third CLBO crystal 320, a sixth dichroic mirror 322, a third high reflective mirror 324, a fourth high reflective mirror 326, and a beam splitter 328.

The LBO crystal 310 and the first CLBO crystal 312 are arranged in an optical path of the first pulse laser beam LP1 having the wavelength of about 1030 nm such that the first pulse laser beam LP1 is wavelength-converted into a fourth pulse laser beam LP4 (wavelength of about 257.5 nm) that is fourth harmonic light.

The third high reflective mirror 324 is arranged to highly reflect a third pulse laser beam LP3 (wavelength of about 1554 nm) output from the second solid-state laser device 200 and cause the third pulse laser beam LP3 to enter the fourth dichroic mirror 314.

The fourth dichroic mirror 314 is coated with a film that highly transmits the fourth pulse laser beam LP4 and highly reflects the third pulse laser beam LP3. The fourth dichroic mirror 314 is arranged in an optical path between the first CLBO crystal 312 and the second CLBO crystal 316 such that the third pulse laser beam LP3 and the fourth pulse laser beam LP4 enter the second CLBO crystal 316 with their optical path axes being aligned.

The second CLBO crystal 316, the fifth dichroic mirror 318, the third CLBO crystal 320, and the sixth dichroic mirror 322 are arranged in this order in the optical path of the pulse laser beam including the fourth pulse laser beam LP4.

The second CLBO crystal 316 generates a fifth pulse laser beam LP5 (wavelength of about 220.9 nm) that is a sum frequency of the third pulse laser beam LP3 and the fourth pulse laser beam LP4. The fifth dichroic mirror 318 is coated with a film that highly reflects the fourth pulse laser beam LP4 (wavelength of about 257.5 nm) having passed through the second CLBO crystal 316 and highly transmits the third pulse laser beam LP3 (wavelength of about 1554 nm) and the fifth pulse laser beam LP5 (wavelength of about 220.9 nm).

The third CLBO crystal 320 generates a pulse laser beam (wavelength of about 193.4 nm) that is a sum frequency of the third pulse laser beam LP3 and the fifth pulse laser beam LP5. The pulse laser beam having the wavelength of about 193.4 nm output from the third CLBO crystal 320 is the second pulse laser beam LP2.

The sixth dichroic mirror 322 is coated with a film that highly transmits the third pulse laser beam LP3 (wavelength of about 1554 nm) and the fifth pulse laser beam LP5 (wavelength of about 220.9 nm) having passed through the third CLBO crystal 320 and highly reflects the pulse laser beam having the wavelength of about 193.4 nm (second pulse laser beam LP2).

The fourth high reflective mirror 326 is arranged such that the pulse laser beam having the wavelength of about 193.4 nm is output from the wavelength conversion system 300.

The beam splitter 328 is arranged in an optical path of a reflected beam from the fourth high reflective mirror 326 such that the partially reflected laser beam enters the first pulse energy monitor 330.

The solid-state laser system control unit 350 is connected to the first semiconductor laser control unit 114, the second semiconductor laser control unit 214, the synchronization circuit unit 340, the first pulse excitation light source 132, the second pulse excitation light source 144, and the third pulse excitation light source 232. The solid-state laser system control unit 350 includes an internal trigger generator 351.

The synchronization circuit unit 340 has signal lines to receive delay data and a trigger signal Tr1 from the solid-state laser system control unit 350 and input a trigger signal delayed by a predetermined time to each of the first semiconductor optical amplifier 120, the second semiconductor optical amplifier 220, the first pulse excitation light source 132, the second pulse excitation light source 144, and the third pulse excitation light source 232.

The first pulse energy monitor 330 is a detector that detects pulse energy of ultraviolet light, and is, for example, a pulse energy sensor including a photodiode or a pyroelectric element.

The excimer amplifier 14 includes an amplifier control unit 400, a charger 402, a trigger corrector 404, a pulse power module (PPM) 408 including a switch 406, and a chamber 410.

The chamber 410 contains, for example, ArF laser gas containing Ar gas, F2 gas, and Ne gas. A pair of discharge electrodes 412, 413 are arranged in the chamber 410. The discharge electrodes 412, 413 are connected to an output terminal of the PPM 408.

Two windows 415, 416 that transmit a laser beam having a wavelength of around 193.4 nm is arranged in the chamber 410.

The monitor module 16 includes a beam splitter 600 and a second pulse energy monitor 602. The beam splitter 600 is arranged in an optical path of the pulse laser beam (excimer laser beam) output from the excimer amplifier 14 such that the pulse laser beam reflected by the beam splitter 600 enters the second pulse energy monitor 602.

The second pulse energy monitor 602 is a detector that detects pulse energy of ultraviolet light, and is, for example, a pulse energy sensor including a photodiode or a pyroelectric element. Information detected by the second pulse energy monitor 602 is transmitted to the laser control unit 18.

The laser control unit 18 is connected to the solid-state laser system control unit 350, the synchronization control unit 17, the amplifier control unit 400, and an exposure control unit 22 of an exposure apparatus 20. The laser control unit 18 includes an internal trigger generator 19.

In the present disclosure, a control device that functions as the first semiconductor laser control unit 114, the second semiconductor laser control unit 214, the solid-state laser system control unit 350, the amplifier control unit 400, the synchronization control unit 17, the laser control unit 18, the exposure control unit 22, and other control units may be realized by a combination of hardware and software of one or more computers. Software is synonymous with program. Programable controllers are included in the concept of computers. The computer may include a central processing unit (CPU) and a memory. The CPU included in the computer is an example of a processor.

Some or all of processing functions of the control device may be realized using an integrated circuit represented by a field programmable gate array (FPGA) or an application specific integrated circuit (ASIC).

Functions of a plurality of control devices may be realized by one control device. Further, in the present disclosure, the control devices may be connected to each other via a communication network such as a local area network or the Internet. In a distributed computing environment, program units may be stored in both local and remote memory storage devices. In FIG. 5 and thereafter, for example, "pulse energy monitor 1" and "SOA #2" with numerical values represent a first pulse energy monitor and a second semiconductor optical amplifier (SOA), respectively. "SOA" is an abbreviation for "semiconductor optical amplifier".

2.2 Operation

The laser control unit 18 of the laser system 1 in FIG. 5 receives a light emission trigger signal Tr and data of target pulse energy Et and a target center wavelength $\lambda ct$ from the exposure control unit 22 of the exposure apparatus 20. The laser control unit 18 transmits and receives data to and from the exposure control unit 22 as required, and notifies the exposure control unit 22 of an exposure NG signal or an exposure OK signal.

The light emission trigger signal Tr is input to the synchronization control unit 17 via the laser control unit 18. The synchronization control unit 17 outputs a first trigger signal Tr1 and a second trigger signal Tr2 at timing with delay times set such that the pulse laser beam output from the solid-state laser system 10 is synchronously discharged and amplified when passing through the excimer amplifier 14.

The first trigger signal Tr1 is input to the synchronization circuit unit 340 via the solid-state laser system control unit 350. The second trigger signal Tr2 is input to the trigger corrector 404 via the amplifier control unit 400, and output from the trigger corrector 404 is input to the switch 406 of the PPM 408.

The solid-state laser system control unit 350 receives data of the target center wavelength $\lambda ct$ from the laser control unit 18. The solid-state laser system control unit 350 transmits, to the first semiconductor laser control unit 114 and the second semiconductor laser control unit 214, an instruction to cause CW oscillation of the first semiconductor laser 111 and the second semiconductor laser 211. The solid-state laser system control unit 350 also transmits data of target center wavelengths $\lambda 1t$, $\lambda 2t$ to the first semiconductor laser control unit 114 and the second semiconductor laser control unit 214.

The first semiconductor laser control unit 114 controls a current value A1 and/or a temperature T1 of the first semiconductor laser 111 such that a difference $\delta\lambda 1$ between a center wavelength $\lambda 1c$ measured by the first wavelength monitor 112 and a target center wavelength $\lambda 1ct$ is brought close to 0.

Similarly, the second semiconductor laser control unit 214 controls a current value A2 and/or a temperature T2 of the second semiconductor laser 211 such that a difference $\delta\lambda 2$ between a center wavelength $\lambda 2c$ measured by the second wavelength monitor 212 and a target center wavelength $\lambda 2ct$ is brought close to 0.

The first semiconductor laser control unit 114 and the second semiconductor laser control unit 214 determine whether or not the differences $\delta\lambda 1$, $\delta\lambda 2$ from the target center wavelengths are within their allowable ranges. When the differences are within the allowable ranges, the first semiconductor laser control unit 114 and the second semiconductor laser control unit 214 notify the solid-state laser system control unit 350 of wavelength OK signals.

When receiving the wavelength OK signals from both the first semiconductor laser control unit 114 and the second semiconductor laser control unit 214, the solid-state laser system control unit 350 causes the internal trigger generator 351 to generate a first trigger signal Tr1 having a predetermined repetition frequency. The internal trigger generator 351 can generate the first trigger signal Tr1 irrespective of the first trigger signal Tr1 from the synchronization control unit 17. The first trigger signal Tr1 generated by the internal trigger generator 351 among the first trigger signals Tr1 is hereinafter particularly referred to as "internal trigger signal Tr1". The first trigger signal Tr1 is input to the synchronization circuit unit 340.

The synchronization circuit unit 340 outputs a pulse excitation trigger signal to each of the first pulse excitation light source 132, the second pulse excitation light source 144, and the third pulse excitation light source 232 with a predetermined delay time synchronously with the first trigger signal Tr1. Then, the synchronization circuit unit 340 outputs a signal indicating amplification timing with predetermined delay times to each of the first semiconductor optical amplifier 120 and the second semiconductor optical amplifier 220.

Pulse excitation timing of each of the first pulse excitation light source 132, the second pulse excitation light source 144, and the third pulse excitation light source 232 is set such that pulse seed light passing therethrough can be sufficiently amplified.

Trigger timing of each of the first semiconductor optical amplifier 120 and the second semiconductor optical amplifier 220 is set such that the first pulse laser beam LP1 output from the first solid-state laser device 100 and the third pulse laser beam LP3 output from the second solid-state laser device 200 enter the second CLBO crystal 316 at the same timing.

Here, a specific example will be described in which the target center wavelength $\lambda ct$ of the laser system 1 is 193.4 nm, the target center wavelength $\lambda 1ct$ of the first solid-state laser device 100 is 1030 nm, and the target center wavelength $\lambda 2ct$ of the second solid-state laser device 200 is 1554 nm.

The first semiconductor laser system 110 in the first solid-state laser device 100 outputs a CW oscillation laser beam (hereinafter referred to as "first CW laser beam") having a center wavelength of 1030 nm.

The first semiconductor optical amplifier 120 pulse-amplifies the first CW laser beam and outputs a pulse laser beam. The pulse laser beam output from the first semiconductor optical amplifier 120 is amplified by the first fiber amplifier 140 and the solid-state amplifier 150. The first pulse laser beam LP1 amplified by the first fiber amplifier 140 and the solid-state amplifier 150 enter the LBO crystal 310 in the wavelength conversion system 300.

In the second solid-state laser device 200, the second semiconductor laser system 210 outputs a CW oscillation laser beam (hereinafter referred to as "second CW laser beam") having a center wavelength of 1554 nm.

The second semiconductor optical amplifier 220 pulse-amplifies the second CW laser beam and outputs a pulse laser beam. The pulse laser beam output from the second semiconductor optical amplifier 220 is amplified by the second fiber amplifier 240. The third pulse laser beam LP3 amplified by the second fiber amplifier 240 enters the third high reflective mirror 324 in the wavelength conversion system 300.

The first pulse laser beam LP1 (wavelength of 1030 nm) having entered the wavelength conversion system 300 is converted into fourth harmonic light by the LBO crystal 310 and the first CLBO crystal 312 to generate a fourth pulse laser beam LP4 (wavelength of 257.5 nm).

The fourth pulse laser beam LP4 enters the second CLBO crystal 316 via the fourth dichroic mirror 314.

The third pulse laser beam LP3 (wavelength of 1554 nm) output from the second solid-state laser device 200 enters the second CLBO crystal 316 via the third high reflective mirror 324 and the fourth dichroic mirror 314.

With the fourth dichroic mirror 314, the third pulse laser beam LP3 and the fourth pulse laser beam LP4 substantially simultaneously enter the second CLBO crystal 316, and overlap each other on the second CLBO crystal 316. As a result, the second CLBO crystal 316 generates a fifth pulse laser beam LP5 having a center wavelength of 220.9 nm, which is a sum frequency of the third pulse laser beam LP3 (wavelength of 1554 nm) and the fourth pulse laser beam LP4 (wavelength of 257.5 nm).

The fifth dichroic mirror 318 highly reflects the fourth pulse laser beam LP4 having the center wavelength of 257.5 nm, and highly transmits both the third pulse laser beam LP3 having the wavelength of about 1554 nm and the fifth pulse laser beam LP5 having the wavelength of about 220.9 nm.

The pulse laser beams having passed through the fifth dichroic mirror 318 enter the third CLBO crystal 320. The third CLBO crystal 320 generates a second pulse laser beam LP2 having a center wavelength of about 193.4 nm, which is a sum frequency of the fifth pulse laser beam LP5 (wavelength of 220.9 nm) and the third pulse laser beam LP3 (wavelength of 1554 nm).

The sixth dichroic mirror 322 highly transmits the fifth pulse laser beam LP5 and the third pulse laser beam LP3 output from the third CLBO crystal 320. The sixth dichroic mirror 322 highly reflects the second pulse laser beam LP2 (wavelength of 193.4 nm) output from the third CLBO crystal 320, and the second pulse laser beam LP2 is output from the wavelength conversion system 300 via the fourth high reflective mirror 326 and the beam splitter 328.

The pulse laser beam reflected by the beam splitter 328 enters the first pulse energy monitor 330. The first pulse energy monitor 330 measures pulse energy Es of the pulse laser beam reflected by the beam splitter 328. Information obtained by the first pulse energy monitor 330 is transmitted to the solid-state laser system control unit 350.

The solid-state laser system control unit 350 calculates a difference $\Delta Es$ between pulse energy Es after wavelength conversion by the wavelength conversion system 300 and target pulse energy Est.

The solid-state laser system control unit 350 controls output of the first pulse excitation light source 132, the second pulse excitation light source 144, and the third pulse excitation light source 232 such that $\Delta Es$ is brought close to 0.

The solid-state laser system control unit 350 determines whether $\Delta Es$ is within an allowable range. When it is OK, the solid-state laser system control unit 350 stops output of an internal trigger signal Tr1 and notifies the laser control unit 18 of a solid-state laser system control OK signal.

Then, the laser control unit 18 generates an internal trigger signal Tr having a predetermined repetition frequency. As a result, the second pulse laser beam LP2 having the center wavelength of 193.4 nm output from the solid-state laser system 10 enters the excimer amplifier 14 via the first high reflective mirror 11 and the second high reflective mirror 12.

The excimer amplifier 14 forms inverted distribution by discharge synchronously with entering of the second pulse laser beam LP2 having the wavelength of 193.4 nm. The trigger corrector 404 adjusts timing of the switch 406 of the PPM 408 such that the second pulse laser beam LP2 is efficiently amplified by the excimer amplifier 14. Thus, the excimer amplifier 14 outputs an amplified pulse laser beam LP6.

The pulse laser beam LP6 amplified by the excimer amplifier 14 enters the monitor module 16. The beam splitter 600 causes part of the pulse laser beam to enter the second pulse energy monitor 602, which measures pulse energy E of the pulse laser beam.

The laser control unit 18 obtains information on the pulse energy E from the second pulse energy monitor 602. The laser control unit 18 calculates a difference $\Delta E$ between the pulse energy E measured by the second pulse energy monitor 602 and target pulse energy Et.

The laser control unit 18 controls charging voltage Vhv of the charger 402 via the amplifier control unit 400 such that $\Delta E$ is brought close to 0.

The laser control unit 18 determines whether $\Delta E$ is within an allowable range. When it is OK, the laser control unit 18 stops output of an internal trigger signal Tr and notifies the exposure control unit 22 of a laser system OK signal (exposure OK signal). When receiving the laser system OK signal, the exposure control unit 22 transmits a light emission trigger signal Tr to the laser control unit 18.

As a result, the laser system 1 outputs a pulse laser beam within the allowable ranges of the target center wavelength $\lambda t$ of 193.4 nm and the target pulse energy Et. The pulse laser beam (excimer beam) output from the laser system 1 enters the exposure apparatus 20, which performs an exposure process.

When receiving data of a new target center wavelength $\lambda t$ from the exposure control unit 22, the laser control unit 18 transmits the data to the solid-state laser system control unit 350.

The solid-state laser system control unit 350 controls the first semiconductor laser system 110 and the second semiconductor laser system 210 such that the internal trigger generator 351 generates the internal trigger signal Tr1 and the new target center wavelength $\lambda t$ is reached even if the solid-state laser system control unit 350 does not receive a trigger signal Tr1 from the synchronization control unit 17.

2.3 Example of Processing of Laser Control Unit

Figure 6:
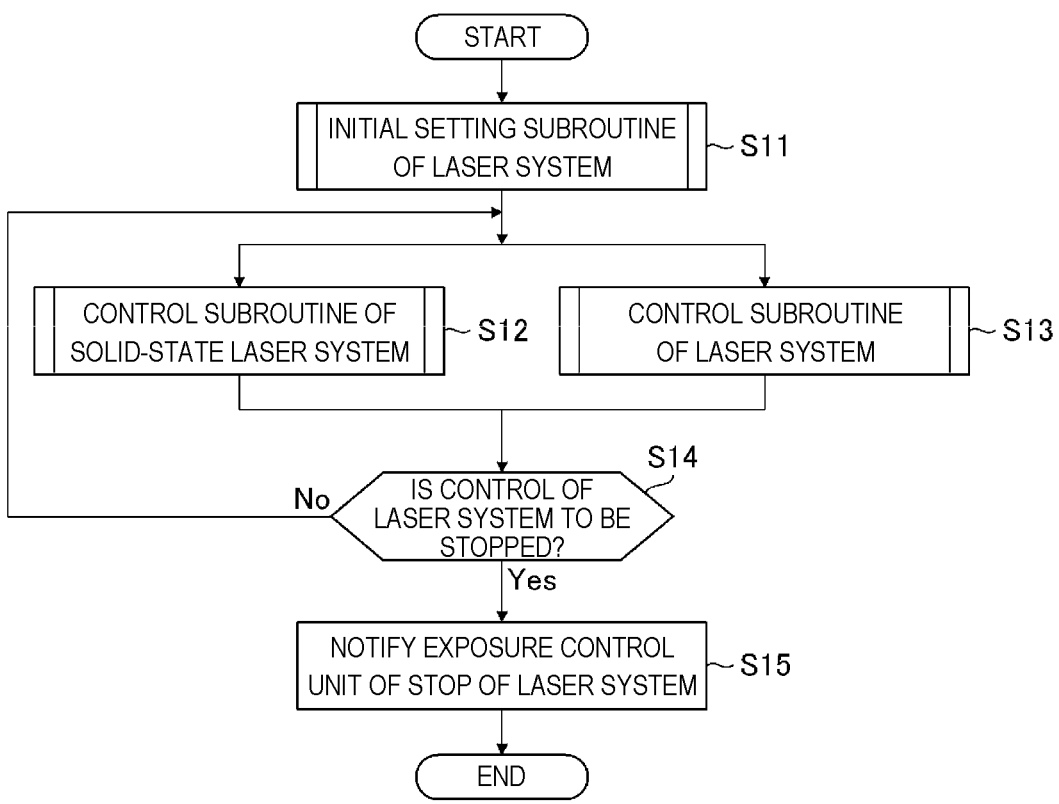
FIG. 6 is a flowchart of an example of processing of a laser control unit.

FIG. 6 is a flowchart of an example of processing of the laser control unit 18. The processing and the operation in the flowchart in FIG. 6 are realized by, for example, a processor that functions as the laser control unit 18 executing a program.

In step S11, the laser control unit 18 performs an initial setting subroutine of the laser system. After step S11, the laser control unit 18 performs a control subroutine of the solid-state laser system 10 (step S12) and a control subroutine of the laser system 1 (step S13). The processes in steps S12 and S13 may be performed in parallel or concurrently.

The control of the solid-state laser system 10 in step S12 is constantly performed. In particular, wavelength control of the first semiconductor laser system 110 and the second semiconductor laser system 210 is performed irrespective of whether or not the trigger signal Tr1 is input. The control of the laser system 1 in step S13 is mainly feedback control of pulse energy of an excimer laser beam amplified by the excimer amplifier 14.

In step S14, the laser control unit 18 determines whether or not to stop control of the laser system 1. When the determination result in step S14 is No, the laser control unit 18 returns to step S12 and step S13. When the determination result in step S14 is Yes, the laser control unit 18 goes to step S15.

In step S15, the laser control unit 18 notifies the exposure control unit 22 of stop of the laser system 1, and finishes the flowchart in FIG. 6.

Figure 7:
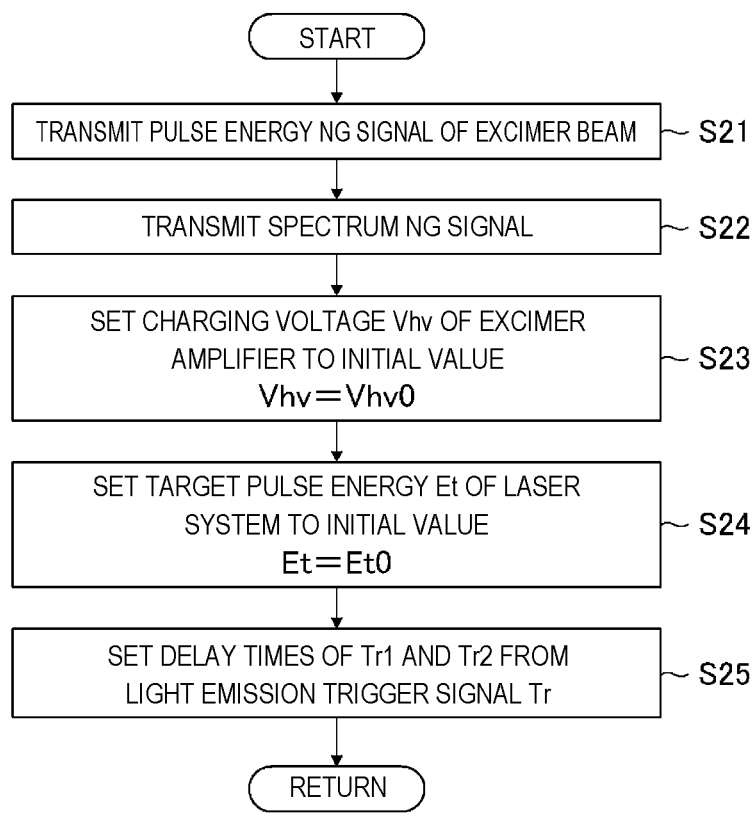
FIG. 7 is a flowchart of an example of an initial setting subroutine of the laser system.

FIG. 7 is a flowchart of an example of the initial setting subroutine of the laser system 1. The flowchart in FIG. 7 is applied to step S11 in FIG. 6.

In step S21 in FIG. 7, the laser control unit 18 transmits a pulse energy NG signal of an excimer beam to the exposure control unit 22. Pulse energy of the excimer beam is previously set to NG in initial setting, and in the process in step S21, the laser control unit 18 transmits the pulse energy NG signal to the exposure control unit 22 according to the initial setting.

In step S22, the laser control unit 18 transmits a spectrum NG signal to the exposure control unit 22. A center wavelength of the excimer beam is previously set to NG in initial setting, and in the process in step S22, the laser control unit 18 transmits the spectrum NG signal to the exposure control unit 22 according to the initial setting.

In step S23, the laser control unit 18 sets charging voltage Vhv of the excimer amplifier 14 to an initial value Vhv0.

In step S24, the laser control unit 18 sets target pulse energy Et of the laser system 1 to an initial value Et0. The laser control unit 18 sets a predetermined standard initial value Et0 before receiving data of the target pulse energy Et from the exposure apparatus 20.

In step S25, the laser control unit 18 sets delay times of the first trigger signal Tr1 and the second trigger signal Tr2 from the light emission trigger signal Tr. The laser control unit 18 sets the delay times such that the pulse laser beam output from the solid-state laser system 10 discharges at timing when entering the excimer amplifier 14. The delay times may be fixed values. The laser control unit 18 transmits data of the delay times to the synchronization control unit 17.

Figure 8:
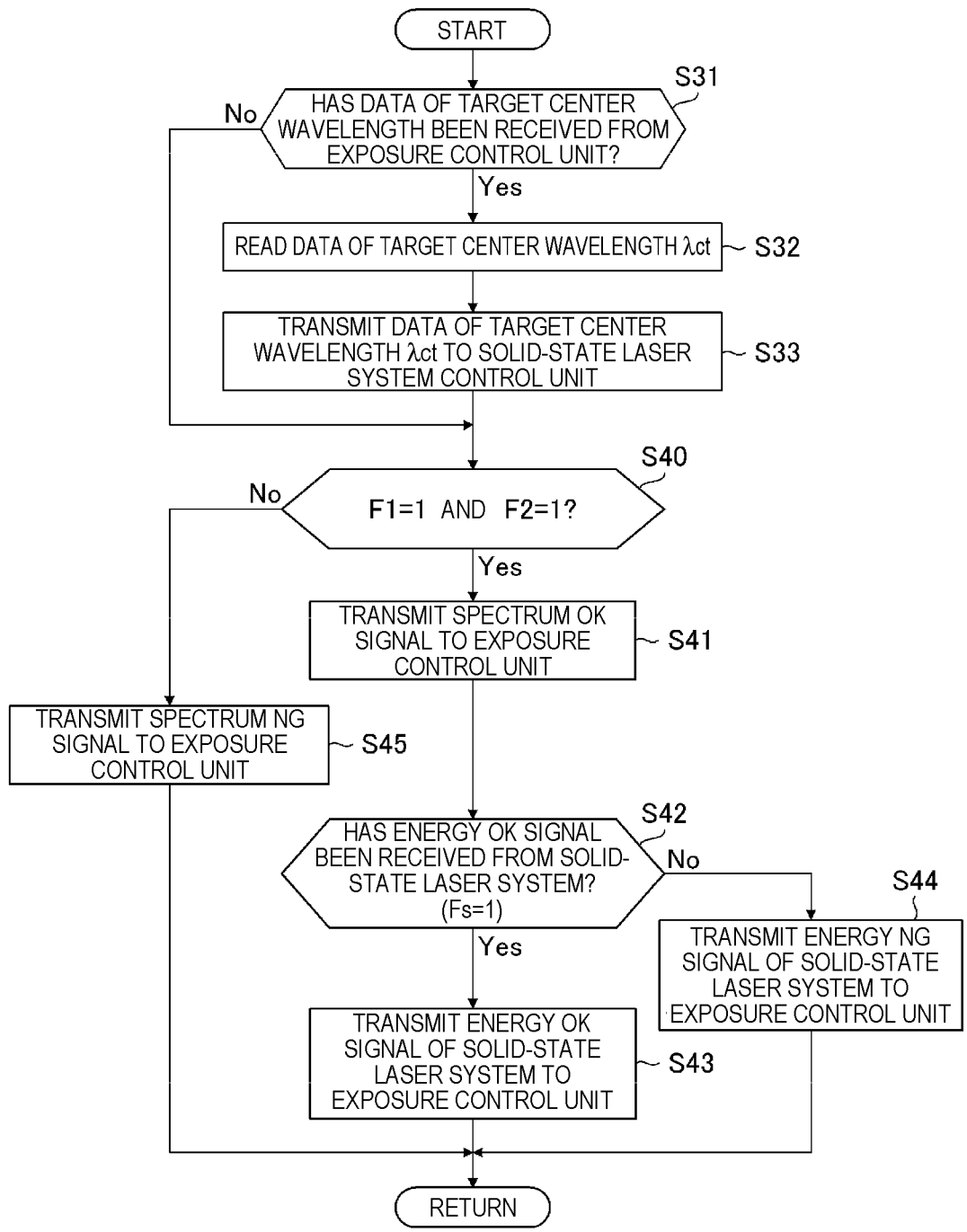
FIG. 8 is a flowchart of an example of a control subroutine of a solid-state laser system.

FIG. 8 is a flowchart of an example of the control subroutine of the solid-state laser system 10. The flowchart in FIG. 8 is applied to step S12 in FIG. 6.

In step S31 in FIG. 8, the laser control unit 18 determines whether or not data of a new target center wavelength has been received from the exposure control unit 22. When the determination result in step S31 is Yes, the laser control unit 18 goes to step S32.

In step S32, the laser control unit 18 reads the data of the target center wavelength λct. Then, in step S33, the laser control unit 18 transmits the data of the target center wavelength λct to the solid-state laser system control unit 350.

After step S33, the laser control unit 18 goes to step S40. When the determination result in step S31 is No, the laser control unit 18 skips step S32 and step S33 and goes to step S40.

In step S40, the laser control unit 18 checks values of a flag F1 and a flag F2, and determines whether or not the flag F1 being 1 and the flag F2 being 1 is satisfied. The flag F1 indicates whether the first semiconductor laser system 110 is in an OK state or an NG state. The flag F2 indicates whether the second semiconductor laser system 210 is in an OK state or an NG state. The value "1" of the flags indicates OK and the value "0" indicates NG. In other words, the laser control unit 18 determines whether or not both the first semiconductor laser system 110 and the second semiconductor laser system 210 are in the OK state.

When the determination result in step S40 is Yes, the laser control unit 18 goes to step S41. In step S41, the laser control unit 18 transmits a spectrum OK signal to the exposure control unit 22.

In step S42, the laser control unit 18 determines whether or not an energy OK signal has been received from the solid-state laser system 10. For example, the laser control unit 18 checks a value of a flag Fs, and determines whether or not the flag Fs is 1. The flag Fs indicates whether the pulse energy output from the solid-state laser system 10 is in an OK state or an NG state. The value "1" of the flag Fs indicates OK and the value "0" indicates NG. The laser control unit 18 determines whether or not the pulse energy from the solid-state laser system 10 is in the OK state in accordance with the value of the flag Fs. When the determination result in step S42 is Yes, the laser control unit 18 goes to step S43.

In step S43, the laser control unit 18 transmits an energy OK signal of the solid-state laser system 10 to the exposure control unit 22. When the determination result in step S42 is No, the laser control unit 18 goes to step S44.

In step S44, the laser control unit 18 transmits an energy NG signal of the solid-state laser system 10 to the exposure control unit 22.

When the determination result in step S40 is No, the laser control unit 18 goes to step S45 and transmits a spectrum NG signal to the exposure control unit 22.

After step S43, step S44, or step S45, the laser control unit 18 finishes the flowchart in FIG. 8 and returns to the flowchart in FIG. 6.

Figure 9:
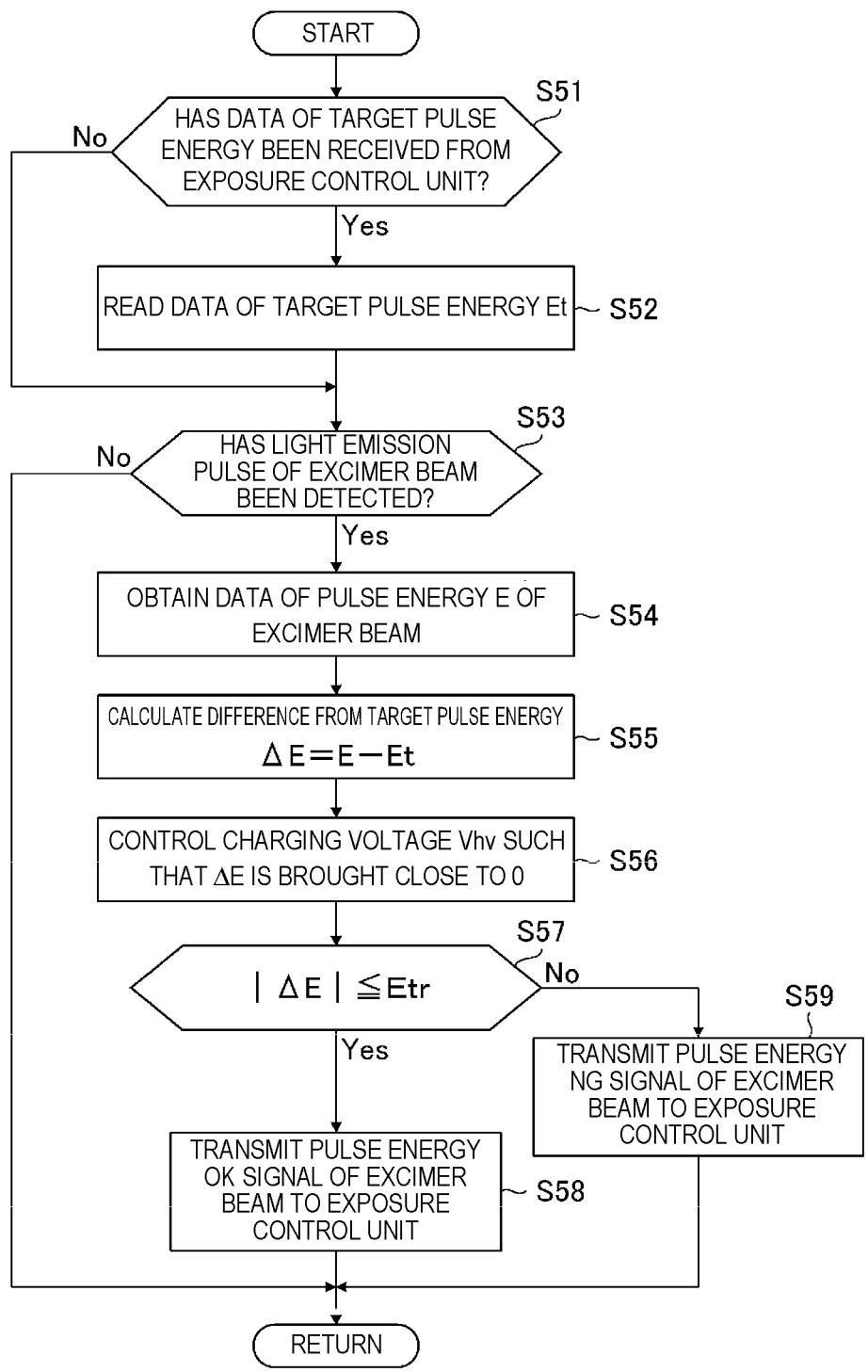
FIG. 9 is a flowchart of an example of a control subroutine of the laser system.

FIG. 9 is a flowchart of an example of the control subroutine of the laser system 1. The flowchart in FIG. 9 is applied to step S13 in FIG. 6.

In step S51 in FIG. 9, the laser control unit 18 determines whether or not data of new target pulse energy has been received from the exposure control unit 22. When the determination result in step S51 is Yes, the laser control unit 18 goes to step S52.

In step S52, the laser control unit 18 reads the data of the target pulse energy Et. After step S52, the laser control unit 18 goes to step S53. When the determination result in step S51 is No, the laser control unit 18 skips step S52 and goes to step S53.

In step S53, the laser control unit 18 determines whether or not a light emission pulse of an excimer beam has been detected. The laser control unit 18 determines whether or not pulse energy of the pulse laser beam (excimer beam) output to the exposure apparatus 20 has been detected in accordance with a signal obtained from the monitor module 16. When the determination result in step S53 is Yes, the laser control unit 18 goes to step S54.

In step S54, the laser control unit 18 obtains data of the pulse energy E of the excimer beam detected by the monitor module 16.

In step S55, the laser control unit 18 calculates a difference ΔE between the pulse energy E and the target pulse energy Et.

In step S56, the laser control unit 18 controls the charging voltage Vhv of the excimer amplifier 14 such that ΔE is brought close to 0.

Then, in step S57, the laser control unit 18 determines whether or not an absolute value of ΔE is equal to or smaller than an allowable upper limit value Etr which indicates an allowable range. When the determination result in step S57 is Yes, the laser control unit 18 goes to step S58, and transmits a pulse energy OK signal of the excimer beam to the exposure control unit 22.

When the determination result in step S57 is No, the laser control unit 18 goes to step S59, and transmits a pulse energy NG signal of the excimer beam to the exposure control unit 22.

After step S58 or S59, the laser control unit 18 finishes the flowchart in FIG. 9 and returns to the flowchart in FIG. 6.

When the determination result in step S53 in FIG. 9 is No, the laser control unit 18 skips steps S54 to S59, finishes the flowchart in FIG. 9, and returns to the flowchart in FIG. 6.

2.4 Example of Processing of Solid-State Laser System Control Unit

Figure 10:
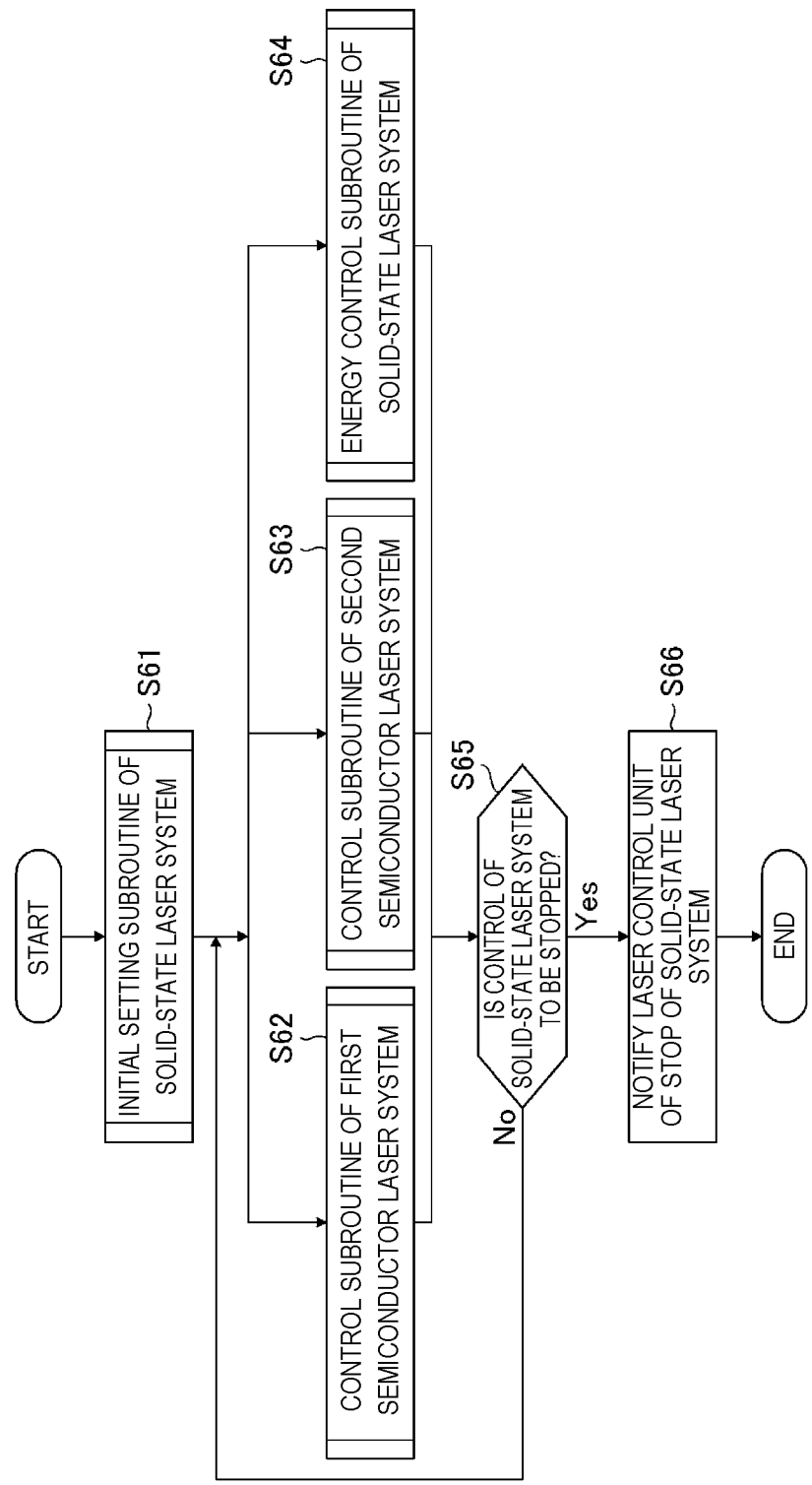
FIG. 10 is a flowchart of an example of processing of a solid-state laser system control unit.

FIG. 10 is a flowchart of an example of processing of the solid-state laser system control unit 350. The processing and the operation in the flowchart in FIG. 10 are realized by, for example, a processor that functions as the solid-state laser system control unit 350 executing a program.

In step S61, the solid-state laser system control unit 350 performs an initial setting subroutine of the solid-state laser system 10.

After step S61, the solid-state laser system control unit 350 performs a control subroutine of the first semiconductor laser system 110 (step S62), a control subroutine of the second semiconductor laser system 210 (step S63), and an energy control subroutine of the solid-state laser system 10 (step S64). The processes of the subroutines in steps S62, S63, and S64 may be performed in parallel or concurrently.

In step S65, the solid-state laser system control unit 350 determines whether or not to stop control of the solid-state laser system 10.

When the determination result in step S65 is No, the solid-state laser system control unit 350 returns to steps S62, S63, and S64. When the determination result in step S65 is Yes, the solid-state laser system control unit 350 goes to step S66.

In step S66, the solid-state laser system control unit 350 notifies the laser control unit 18 of stop of the solid-state laser system 10, and finishes the flowchart in FIG. 10.

Figure 11:
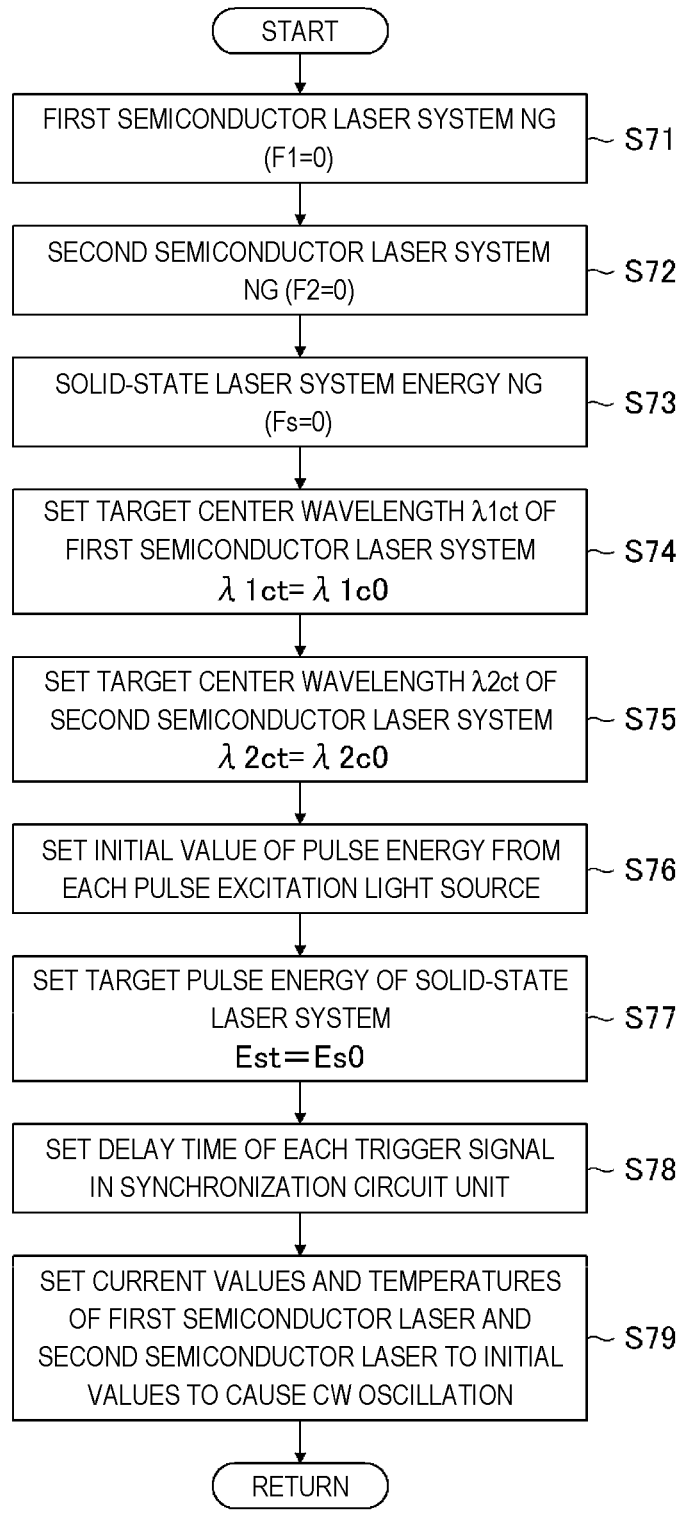
FIG. 11 is a flowchart of an example of an initial setting subroutine of the solid-state laser system.

FIG. 11 is a flowchart of an example of the initial setting subroutine of the solid-state laser system 10. The flowchart in FIG. 11 is applied to step S61 in FIG. 10.

In step S71 in FIG. 11, the solid-state laser system control unit 350 sets the state of the first semiconductor laser system 110 to NG. In other words, the solid-state laser system control unit 350 sets the value of the flag F1 to "0".

In step S72, the solid-state laser system control unit 350 sets the state of the second semiconductor laser system 210 to NG. In other words, the solid-state laser system control unit 350 sets the value of the flag F2 to "0".

In step S73, the solid-state laser system control unit 350 sets the energy state of the solid-state laser system 10 to NG. In other words, the solid-state laser system control unit 350 sets the value of the flag Fs to "0".

In step S74, the solid-state laser system control unit 350 sets a target center wavelength $\lambda 1ct$ of the first semiconductor laser system 110 to an initial value $\lambda 1c0$. The initial value $\lambda 1c0$ may be, for example, 1030 nm.

In step S75, the solid-state laser system control unit 350 sets a target center wavelength $\lambda 2ct$ of the second semiconductor laser system 210 to an initial value $\lambda 2c0$. The initial value $\lambda 2c0$ may be, for example, 1554 nm.

In step S76, the solid-state laser system control unit 350 sets an initial value of pulse energy from each of the first pulse excitation light source 132, the second pulse excitation light source 144, and the third pulse excitation light source 232. The initial values of the pulse energy from the pulse excitation light sources may be different.

In step S77, the solid-state laser system control unit 350 sets target pulse energy Est of the solid-state laser system 10 to an initial value Es0. The initial value Es0 is a predetermined fixed value at which amplified spontaneous emission (ASE) can be suppressed in the excimer amplifier 14.

In step S78, the solid-state laser system control unit 350 sets a delay time of each trigger signal in the synchronization circuit unit 340. The delay time of the first trigger signal Tr1 is set in the synchronization circuit unit 340 as described below.

Pulse excitation timing of each of the first pulse excitation light source 132, the second pulse excitation light source 144, and the third pulse excitation light source 232 is set such that pulse seed light passing therethrough can be sufficiently amplified. Trigger timing of each of the first semiconductor optical amplifier 120 and the second semiconductor optical amplifier 220 is set such that the first pulse laser beam output from the first solid-state laser device 100 and the second pulse laser beam output from the second solid-state laser device 200 enter the second CLBO crystal 316 at the same timing.

In step S79, the solid-state laser system control unit 350 sets current values and temperatures of the first semiconductor laser 111 and the second semiconductor laser 211 to initial values to cause CW oscillation. In other words, the solid-state laser system control unit 350 controls the first semiconductor laser 111 such that current values and temperatures at which an oscillation wavelength of the first semiconductor laser 111 is brought close to $\lambda 1c0$ are initial values, and causes CW oscillation of the first semiconductor laser 111. Similarly, the solid-state laser system control unit 350 controls the second semiconductor laser 211 such that current values and temperatures at which an oscillation wavelength of the second semiconductor laser 211 is brought close to $\lambda 2c0$ are initial values, and causes CW oscillation of the second semiconductor laser 211.

After step S79, the solid-state laser system control unit 350 finishes the flowchart in FIG. 11 and returns to the flowchart in FIG. 10.

Figure 12:
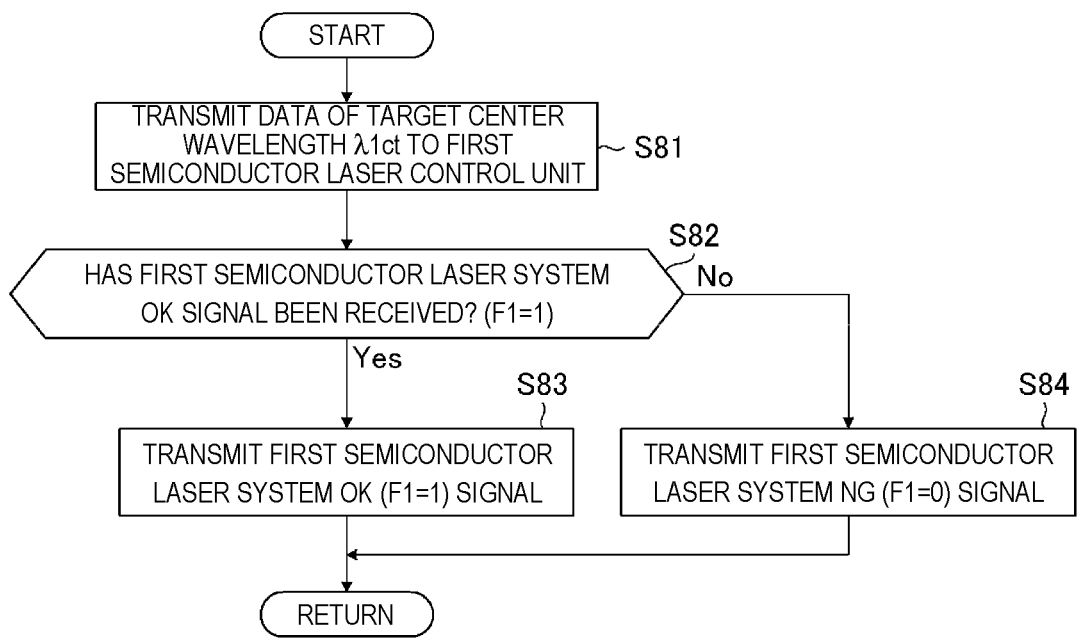
FIG. 12 is a flowchart of an example of a control subroutine of a first semiconductor laser system.

FIG. 12 is a flowchart of an example of the control subroutine of the first semiconductor laser system 110. The flowchart in FIG. 12 is applied to step S62 in FIG. 10.

In step S81 in FIG. 12, the solid-state laser system control unit 350 transmits data of the target center wavelength $\lambda 1ct$ to the first semiconductor laser control unit 114.

In step S82, the solid-state laser system control unit 350 determines whether or not an OK signal of the first semiconductor laser system 110 has been received from the first semiconductor laser control unit 114. When the determination result in step S82 is Yes, that is, when the flag F1 is 1, the solid-state laser system control unit 350 goes to step S83.

In step S83, the solid-state laser system control unit 350 transmits the OK signal of the first semiconductor laser system to the laser control unit 18. Specifically, the solid-state laser system control unit 350 transmits a flag signal of F1 being 1 to the laser control unit 18.

When the determination result in step S82 is No, that is, when the flag F1 is 0, the solid-state laser system control unit 350 goes to step S84.

In step S84, the solid-state laser system control unit 350 transmits an NG signal of the first semiconductor laser system to the laser control unit 18. Specifically, the solid-state laser system control unit 350 transmits a flag signal of F1 being 0 to the laser control unit 18.

After step S83 or S84, the solid-state laser system control unit 350 finishes the flowchart in FIG. 12 and returns to the flowchart in FIG. 10.

Figure 13:
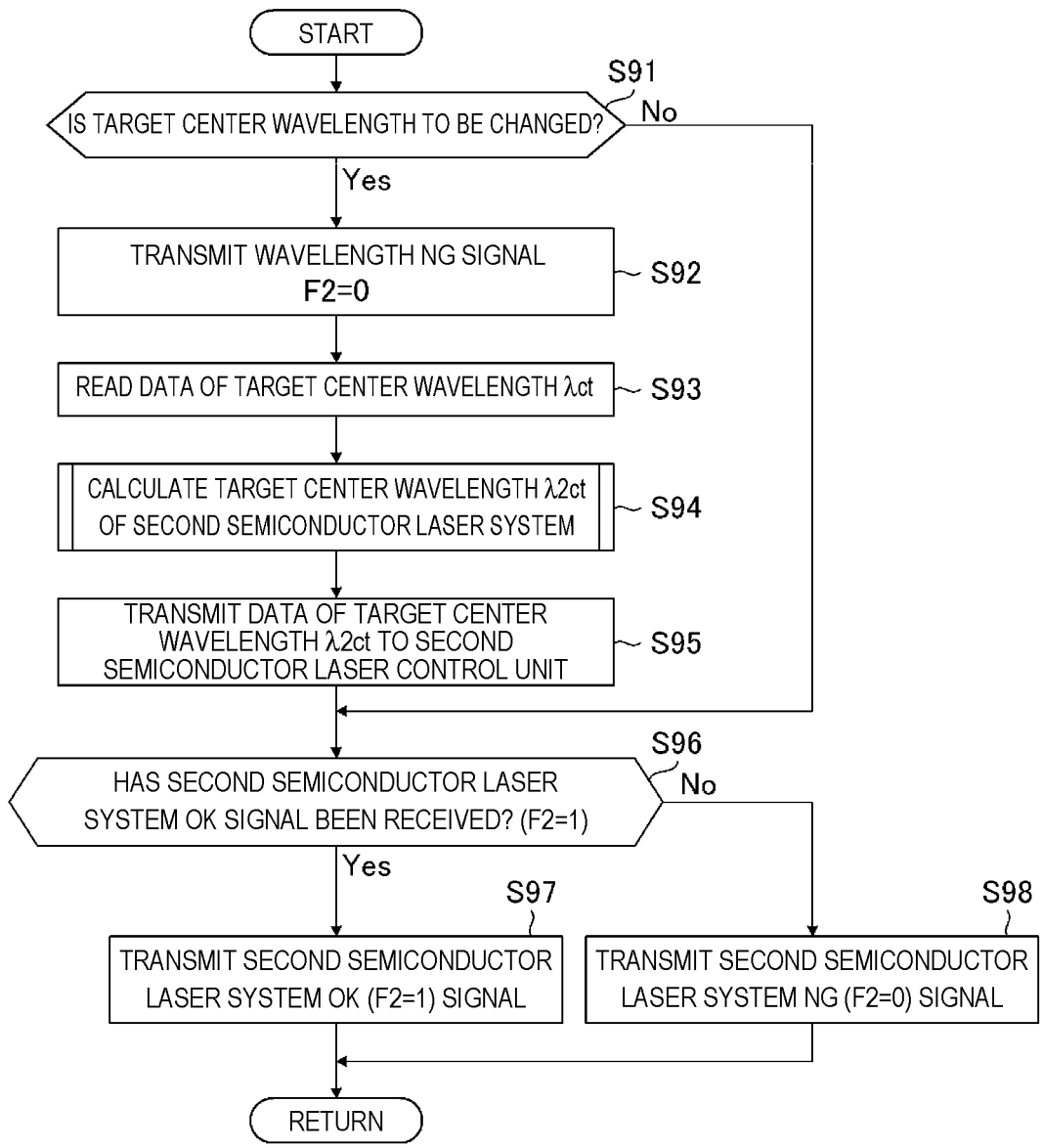
FIG. 13 is a flowchart of an example of a control subroutine of a second semiconductor laser system.

FIG. 13 is a flowchart of an example of the control subroutine of the second semiconductor laser system 210. The flowchart in FIG. 13 is applied to step S63 in FIG. 10.

In step S91 in FIG. 13, the solid-state laser system control unit 350 determines whether or not an instruction to change a target center wavelength has been received from the exposure control unit 22 via the laser control unit 18. When the determination result in step S91 is Yes, the solid-state laser system control unit 350 goes to step S92.

In step S92, the solid-state laser system control unit 350 transmits a wavelength NG signal to the laser control unit 18. When the target center wavelength is changed, a wavelength NG state (F2=0) is reached because the wavelength needs to be adjusted.

In step S93, the solid-state laser system control unit 350 reads data of a new target center wavelength λct.

In step S94, the solid-state laser system control unit 350 calculates a target center wavelength λ2ct of the second semiconductor laser system 210. The processing in step S94 will be described later with reference to FIG. 14. The solid-state laser system control unit 350 calculates the target center wavelength λ2ct according to a wavelength conversion formula described later.

In step S95 in FIG. 13, the solid-state laser system control unit 350 transmits data of the target center wavelength λ2ct to the second semiconductor laser control unit 214. After step S95, the solid-state laser system control unit 350 goes to step S96.

When the determination result in step S91 is No, that is, when the instruction to change the target center wavelength has not been received from the exposure control unit 22, the solid-state laser system control unit 350 skips steps S92 to S95 and goes to step S96.

In step S96, the solid-state laser system control unit 350 determines whether or not an OK signal of the second semiconductor laser system 210 has been received from the second semiconductor laser control unit 214. When the determination result in step S96 is Yes, the solid-state laser system control unit 350 goes to step S97.

In step S97, the solid-state laser system control unit 350 transmits the OK signal of the second semiconductor laser system 210 to the laser control unit 18. Specifically, the solid-state laser system control unit 350 transmits a flag signal of F2 being 1 to the laser control unit 18.

When the determination result in step S96 is No, that is, when the flag F2 is 0, the solid-state laser system control unit 350 goes to step S98.

In step S98, the solid-state laser system control unit 350 transmits an NG signal of the second semiconductor laser system 210 to the laser control unit 18. Specifically, the solid-state laser system control unit 350 transmits a flag signal of F2 being 0 to the laser control unit 18.

After step S97 or S98, the solid-state laser system control unit 350 finishes the flowchart in FIG. 13 and returns to the flowchart in FIG. 10.

Figure 14:
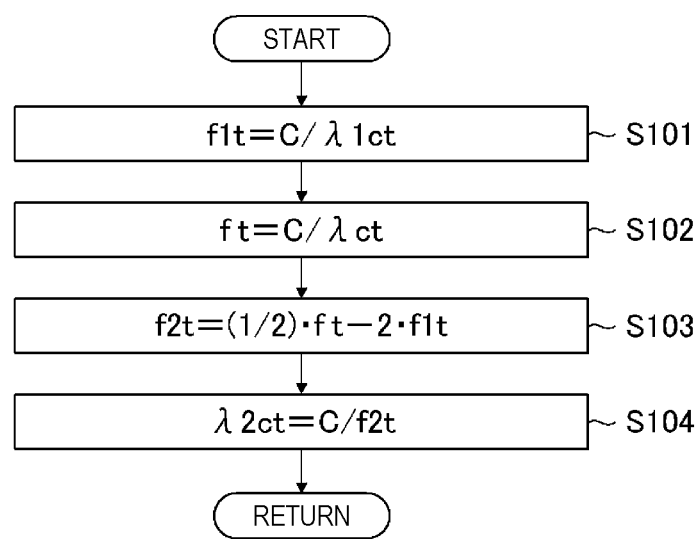
FIG. 14 is a flowchart of an example of a subroutine for calculating a target center wavelength $\lambda 2ct$ of the second semiconductor laser system.

FIG. 14 is a flowchart of an example of a subroutine for calculating the target center wavelength λ2ct of the second semiconductor laser system 210. The flowchart in FIG. 14 is applied to step S94 in FIG. 13.

In step S101 in FIG. 14, the solid-state laser system control unit 350 converts the target center wavelength λ1ct of the first semiconductor laser system 110 into a frequency f1t.

The conversion formula is expressed by $$f1t = C/\lambda1ct$$

where C is light speed.

In step S102, the solid-state laser system control unit 350 converts the target center wavelength λct after wavelength conversion by the wavelength conversion system 300 into a frequency ft.

The conversion formula is expressed by $$ft = C/\lambda ct.$$

In step S103, the solid-state laser system control unit 350 calculates a target frequency f2t of the second semiconductor laser system 210 from Expression (5) of wavelength conversion mentioned below.

The symbol "·" in the expression represents a multiplication operator.

$$f = 4 \cdot f1 + 2 \cdot f2 \tag{5}$$

f: frequency of laser beam wavelength-converted by sum frequency
f1: frequency of laser beam of first solid-state laser device
f2: frequency of laser beam of second solid-state laser device In the example in FIG. 5, the frequency f is the frequency of the laser beam having the wavelength of about 193.4 nm. The frequency f1 is the frequency of the laser beam having the wavelength of about 1030 nm. The frequency f2 is the frequency of the laser beam having the wavelength of about 1554 nm. Thus, Expression (5) is converted with f being ft, f1 being f1t, and f2 being f2t to obtain Expression (6) below that is a conversion formula applied to step S103.

$$f2t = (1/2) \cdot ft - 2 \cdot f1t \tag{6}$$

In step S104, the solid-state laser system control unit 350 converts the target frequency f2t into the target center wavelength λ2ct. The conversion formula is expressed by $$\lambda2ct = C/f2t.$$

The calculation is not limited to the procedure described in steps S101 to S104 in FIG. 14, but may be performed using table data or the like that provides similar conversion results.

After step S104, the solid-state laser system control unit 350 finishes the flowchart in FIG. 14 and returns to the flowchart in FIG. 13.

Figure 15:
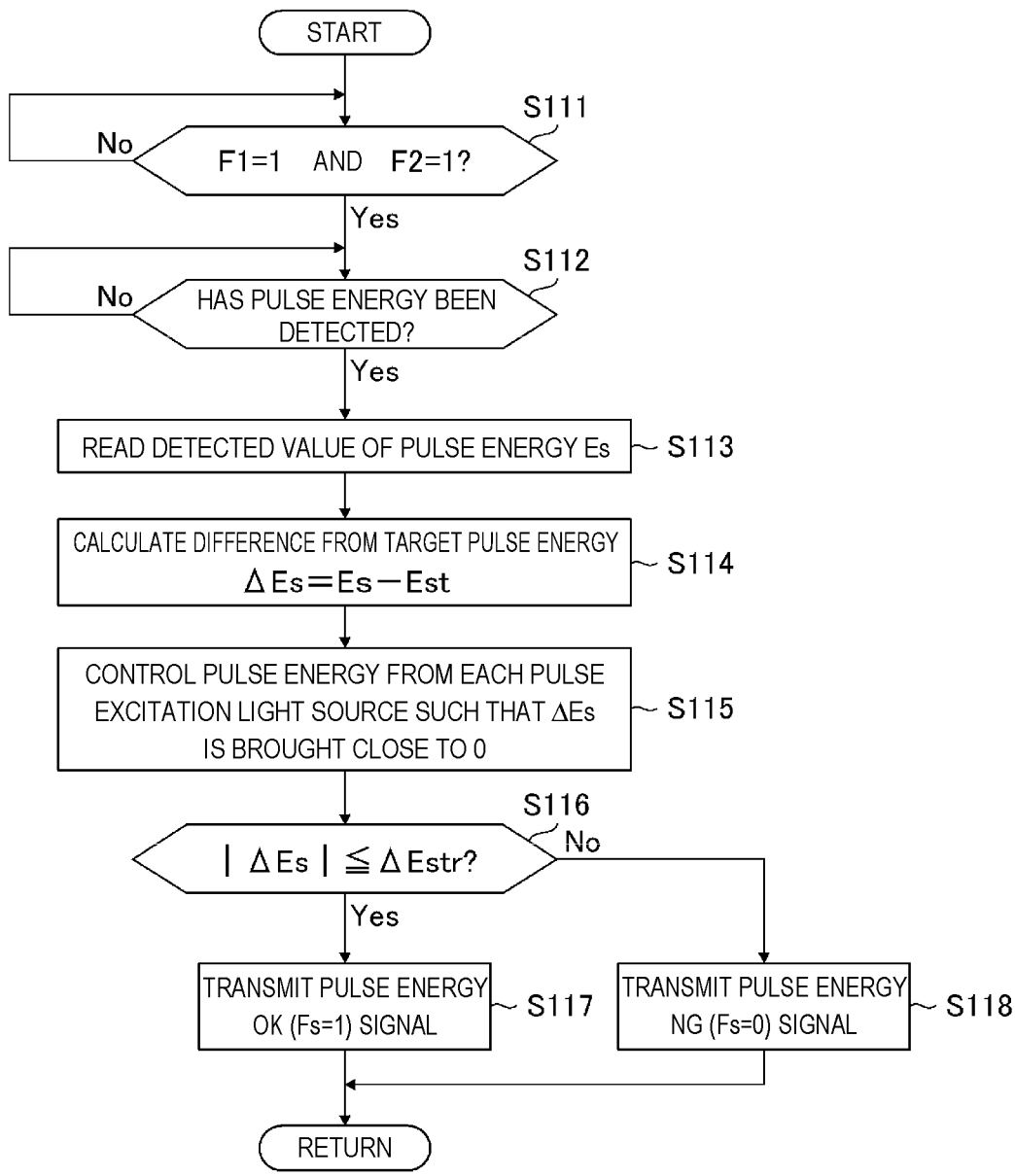
FIG. 15 is a flowchart of an example of an energy control subroutine of the solid-state laser system.

FIG. 15 is a flowchart of an example of the energy control subroutine of the solid-state laser system 10. The flowchart in FIG. 15 is applied to step S64 in FIG. 10.

In step S111 in FIG. 15, the solid-state laser system control unit 350 checks the values of the flag F1 and the flag F2, and determines whether or not the flag F1 being 1 and the flag F2 being 1 is satisfied. In other words, the solid-state laser system control unit 350 determines whether or not OK signals have been received from both the first semiconductor laser system 110 and the second semiconductor laser system 210.

When the determination result in step S111 is No, the solid-state laser system control unit 350 repeats the process in step S111. When the determination result in step S111 is Yes, the solid-state laser system control unit 350 goes to step S112.

In step S112, the solid-state laser system control unit 350 determines whether or not the first pulse energy monitor 330 has detected pulse energy of the pulse laser beam. The solid-state laser system control unit 350 makes a determination in accordance with a signal obtained from the first pulse energy monitor 330.

When the determination result in step S112 is No, the solid-state laser system control unit 350 repeats the process in step S112. When the determination result in step S112 is Yes, the solid-state laser system control unit 350 goes to step S113.

In step S113, the solid-state laser system control unit 350 reads a value of the pulse energy Es detected by the first pulse energy monitor 330.

In step S114, the solid-state laser system control unit 350 calculates a difference ΔEs between the pulse energy Es and the target pulse energy Est.

In step S115, the solid-state laser system control unit 350 controls pulse energy from each of the first pulse excitation light source 132, the second pulse excitation light source 144, and the third pulse excitation light source 232 such that ΔEs is brought close to 0.

Then, in step S116, the solid-state laser system control unit 350 determines whether or not an absolute value of ΔEs is equal to or smaller than an allowable upper limit value ΔEstr which indicates an allowable range. When the determination result in step S116 is Yes, the solid-state laser system control unit 350 goes to step S117.

In step S117, the solid-state laser system control unit 350 transmits, to the laser control unit 18, a pulse energy OK signal of the solid-state laser system 10, that is, a flag signal of Fs being 1.

When the determination result in step S116 is No, the solid-state laser system control unit 350 goes to step S118, and transmits, to the laser control unit 18, a pulse energy NG signal of the solid-state laser system 10, that is, a flag signal of Fs being 0.

After step S117 or S118, the solid-state laser system control unit 350 finishes the flowchart in FIG. 15 and returns to the flowchart in FIG. 10.

2.5 Example of Semiconductor Laser System 2.5.1 Configuration

Figure 16:
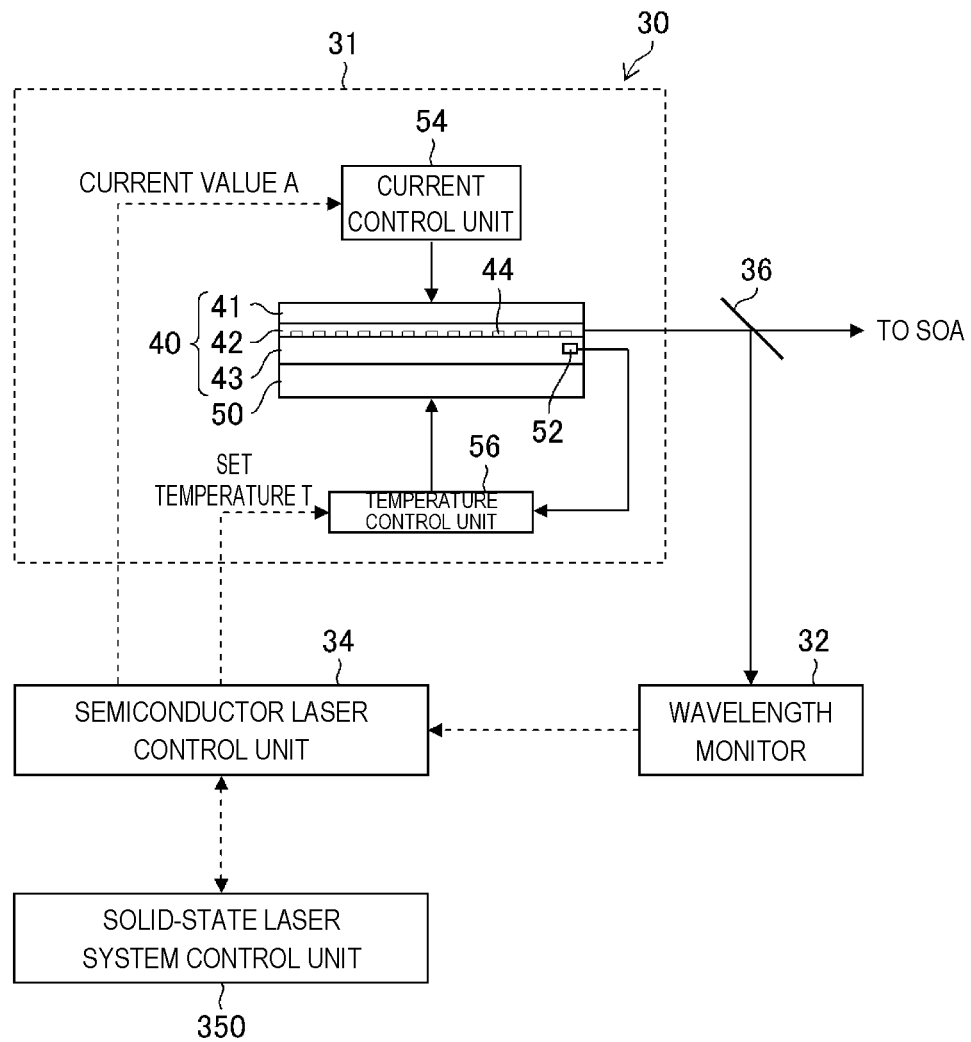
FIG. 16 schematically shows an exemplary configuration of a semiconductor laser system.

FIG. 16 schematically shows an exemplary configuration of a semiconductor laser system 30. The semiconductor laser system 30 in FIG. 16 can be applied to the first semiconductor laser system 110 and the second semiconductor laser system 210 in FIG. 5.

The semiconductor laser system 30 includes a single longitudinal mode DFB laser 31, a wavelength monitor 32, a semiconductor laser control unit 34, and a beam splitter 36. The DFB laser 31 includes a semiconductor element 40, a Peltier element 50, a temperature sensor 52, a current control unit 54, and a temperature control unit 56. The semiconductor element 40 includes a first cladding layer 41, an active layer 42, a second cladding layer 43, and a grating 44 at a boundary between the active layer 42 and the second cladding layer 43.

2.5.2 Operation

An oscillation wavelength of the DFB laser 31 can be changed by changing a current value A and/or a set temperature T of the semiconductor element 40. The current value A may be, for example, a direct current (DC) value. The current value A is changed to change the oscillation wavelength within a narrow range at high speed. The set temperature T is changed to significantly change the oscillation wavelength.

Figure 17:
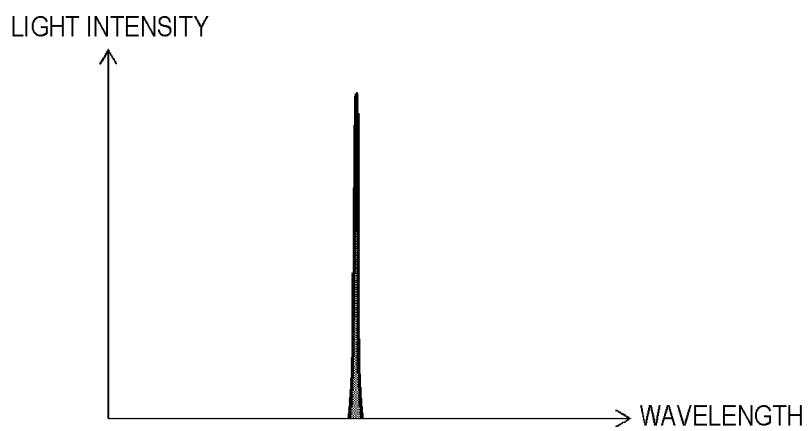
FIG. 17 shows a laser spectrum output from a distributed feedback semiconductor laser.

FIG. 17 shows an example of a spectral waveform of a laser beam output from the DFB laser 31. As shown in FIG. 17, the laser beam output from the DFB laser 31 has a single-line spectral shape with a narrow spectral line width due to single longitudinal mode oscillation.

2.6 Example of Processing of First Semiconductor Laser Control Unit

Figure 18:
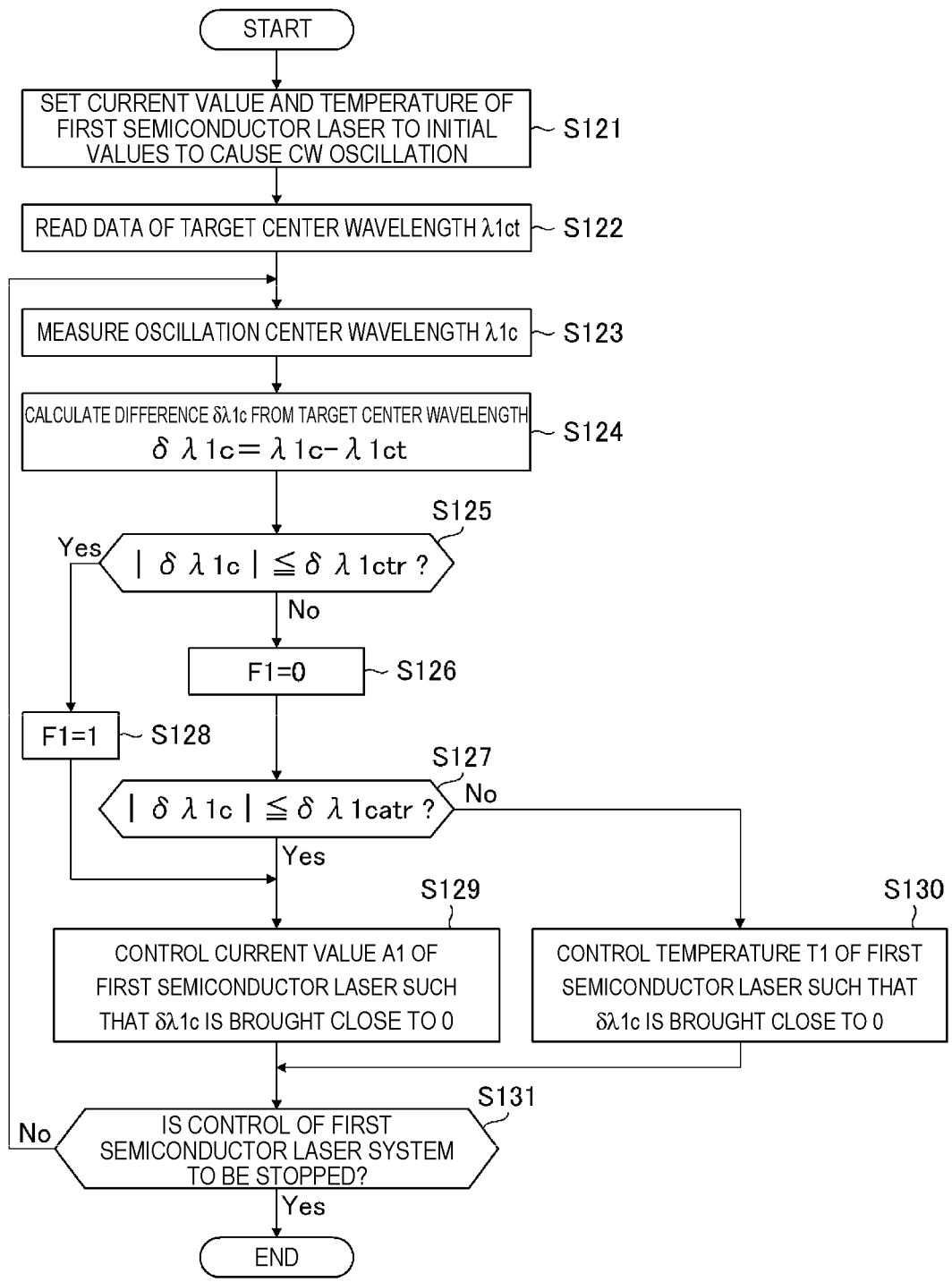
FIG. 18 is a flowchart of an example of processing of a first semiconductor laser control unit.

FIG. 18 is a flowchart of an example of processing of the first semiconductor laser control unit 114. The processing and the operation in the flowchart in FIG. 18 are realized by, for example, a processor that functions as the first semiconductor laser control unit 114 executing a program.

In step S121, the first semiconductor laser control unit 114 sets a current value and a temperature of the first semiconductor laser 111 to initial values to cause CW oscillation. For example, the first semiconductor laser control unit 114 reads the current value and the temperature of the first semiconductor laser set to the initial values in step S79 in FIG. 11 to cause CW oscillation of the first semiconductor laser 111.

In step S122, the first semiconductor laser control unit 114 reads data of a target center wavelength $\lambda 1ct$.

In step S123, the first semiconductor laser control unit 114 uses the wavelength monitor 32 to measure an oscillation center wavelength $\lambda 1c$.

In step S124, the first semiconductor laser control unit 114 calculates a difference $\delta\lambda 1c$ between the oscillation center wavelength $\lambda 1c$ and the target center wavelength $\lambda 1ct$.

In step S125, the first semiconductor laser control unit 114 determines whether or not an absolute value of $\delta\lambda 1c$ is equal to or smaller than an allowable upper limit value $\delta\lambda 1ctr$ which indicates an allowable range. When the determination result in step S125 is No, the first semiconductor laser control unit 114 goes to step S126, and transmits a flag signal of F1 being 0 to the solid-state laser system control unit 350.

Then, in step S127, the first semiconductor laser control unit 114 determines whether or not the absolute value of $\delta\lambda 1c$ is an allowable upper limit value $\delta 1catr$ or lower, which is a range in which a wavelength can be controlled by current control. When the determination result in step S127 is Yes, the first semiconductor laser control unit 114 goes to step S129, and controls the current value A1 of the first semiconductor laser 111 such that $\delta\lambda 1c$ is brought close to 0.

When the determination result in step S127 is No, the first semiconductor laser control unit 114 goes to step S130, and controls the temperature T1 of the first semiconductor laser 111 such that $\delta\lambda 1c$ is brought close to 0.

When the determination result in step S125 is Yes, the first semiconductor laser control unit 114 goes to step S128, and transmits a flag signal of F1 being 1 to the solid-state laser system control unit 350. After step S128, the first semiconductor laser control unit 114 goes to step S129.

After step S129 or S130, the first semiconductor laser control unit 114 goes to step S131. In step S131, the first semiconductor laser control unit 114 determines whether or not to stop control of the first semiconductor laser system 110. When the determination result in step S131 is No, the first semiconductor laser control unit 114 returns to step S123, and repeats the processes in steps S123 to S131.

When the determination result in step S131 is Yes, the first semiconductor laser control unit 114 finishes the flowchart in FIG. 18.

2.7 Example of Processing of Second Semiconductor Laser Control Unit

Figure 19:
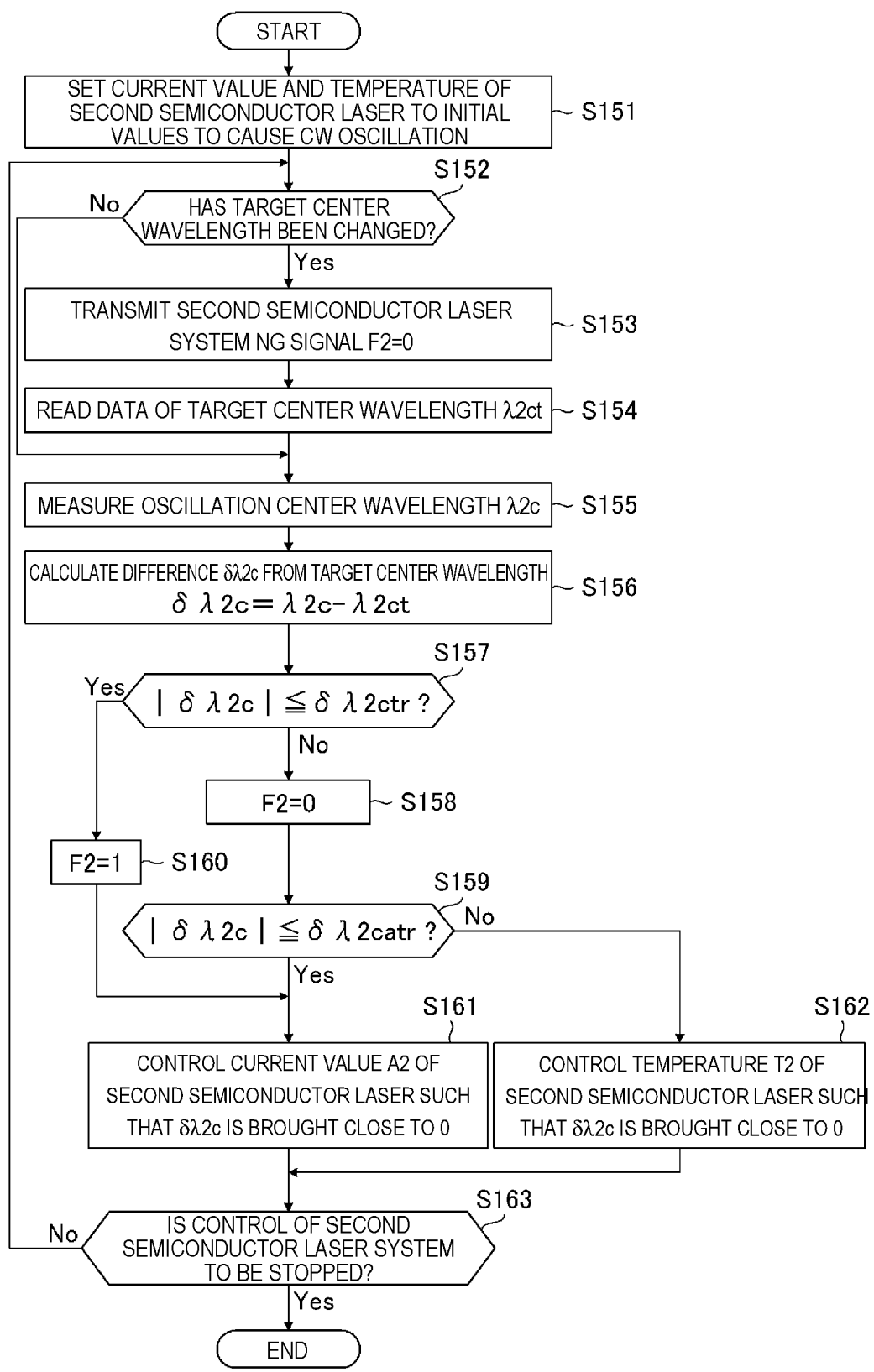
FIG. 19 is a flowchart of an example of processing of a second semiconductor laser control unit.

FIG. 19 is a flowchart of an example of processing of the second semiconductor laser control unit 214. The processing and the operation in the flowchart in FIG. 19 are realized by, for example, a processor that functions as the second semiconductor laser control unit 214 executing a program.

In step S151, the second semiconductor laser control unit 214 sets a current value and a temperature of the second semiconductor laser 211 to initial values to cause CW oscillation. For example, the second semiconductor laser control unit 214 reads the current value and the temperature of the second semiconductor laser 211 set to the initial values in step S79 in FIG. 11 to cause CW oscillation of the second semiconductor laser 211.

In step S152, the second semiconductor laser control unit 214 determines whether or not a target center wavelength of the second semiconductor laser system 210 has been changed by the solid-state laser system control unit 350. When the determination result in step S152 is Yes, the second semiconductor laser control unit 214 goes to step S153, and transmits, to the solid-state laser system control unit 350, an NG signal indicating that the second semiconductor laser system 210 is in an NG state. Specifically, the second semiconductor laser control unit 214 transmits a flag signal of F2 being 0 to the solid-state laser system control unit 350.

In step S154, the second semiconductor laser control unit 214 reads data of a target center wavelength $\lambda 2ct$. After step S154, the second semiconductor laser control unit 214 goes to step S155.

When the determination result in step S152 is No, the second semiconductor laser control unit 214 skips steps S153 and S154 and goes to step S155.

In step S155, the second semiconductor laser control unit 214 uses the second wavelength monitor 212 to measure an oscillation center wavelength $\lambda 2c$.

In step S156, the second semiconductor laser control unit 214 calculates a difference $\delta\lambda 2c$ between the oscillation center wavelength $\lambda 2c$ and the target center wavelength $\lambda 2ct$.

In step S157, the second semiconductor laser control unit 214 determines whether or not an absolute value of $\delta\lambda 2c$ is equal to or smaller than an allowable upper limit value $\delta\lambda 2ctr$ which indicates an allowable range. When the determination result in step S157 is No, the second semiconductor laser control unit 214 goes to step S158, and transmits a flag signal of F2 being 0 to the solid-state laser system control unit 350.

Then, in step S159, the second semiconductor laser control unit 214 determines whether or not the absolute value of $\delta\lambda 2c$ is an allowable upper limit value $\delta 2catr$ or lower, which is a range in which a wavelength can be controlled by current control. When the determination result in step S159 is Yes, the second semiconductor laser control unit 214 goes to step S161, and controls the current value A2 of the second semiconductor laser 211 such that $\delta\lambda 2c$ is brought close to 0.

When the determination result in step S159 is No, the second semiconductor laser control unit 214 goes to step S162, and controls the temperature T2 of the second semiconductor laser 211 such that $\delta\lambda 2c$ is brought close to 0.

When the determination result in step S157 is Yes, the second semiconductor laser control unit 214 goes to step S160, and transmits a flag signal of F2 being 1 to the solid-state laser system control unit 350. After step S160, the second semiconductor laser control unit 214 goes to step S161.

After step S161 or S162, the second semiconductor laser control unit 214 goes to step S163. In step S163, the second semiconductor laser control unit 214 determines whether or not to stop control of the second semiconductor laser system 210. When the determination result in step S163 is No, the second semiconductor laser control unit 214 returns to step S152, and repeats the processes in steps S152 to S163.

When the determination result in step S163 is Yes, the second semiconductor laser control unit 214 finishes the flowchart in FIG. 19.

3. Problem

Using the semiconductor lasers that oscillate in a single longitudinal mode as the first semiconductor laser 111 and the second semiconductor laser 211 in FIG. 5 have the following problems.

[Problem 1]

If a seed laser beam is pulse-amplified using a fiber amplifier so as to have high pulse energy, stimulated Brillouin scattering (SBS) that is a nonlinear phenomenon in an optical fiber occurs due to a narrow spectral line width, which may damage the solid-state laser device. Thus, it is difficult to increase the pulse energy of the pulse laser beam by pulse amplification using the fiber amplifier.

[Problem 2]

In order to realize a desired exposure process by the exposure apparatus 20, the spectral line width of the pulse laser beam (excimer beam) entering the exposure apparatus 20 needs to be controlled. However, it is difficult to change the spectral line width of the laser beam in the semiconductor laser that oscillates in the single longitudinal mode, and thus it is difficult to control the spectral line width of the excimer beam wavelength-converted by the wavelength conversion system 300 and amplified.

[Problem 3]

If a semiconductor laser that oscillates in a multi-longitudinal mode (not shown) is used in the solid-state laser system 10, SBS can be suppressed, but it is difficult to control the spectral line width to a target spectral line width with high accuracy.

[Problem 4]

For a configuration in which output of the laser system 1 is controlled using a measurement result from the monitor module 16, the wavelength and the spectral line width cannot be measured without the pulse laser beam output from the excimer amplifier 14, which may reduce control speed. In order to increase the control speed, it is desirable to control the output of the solid-state laser system 10 such that a desired target center wavelength and a desired target spectral line width can be realized even without the pulse laser beam output from the excimer amplifier 14.

4. Embodiment 1

4.1 Configuration

Figure 20:
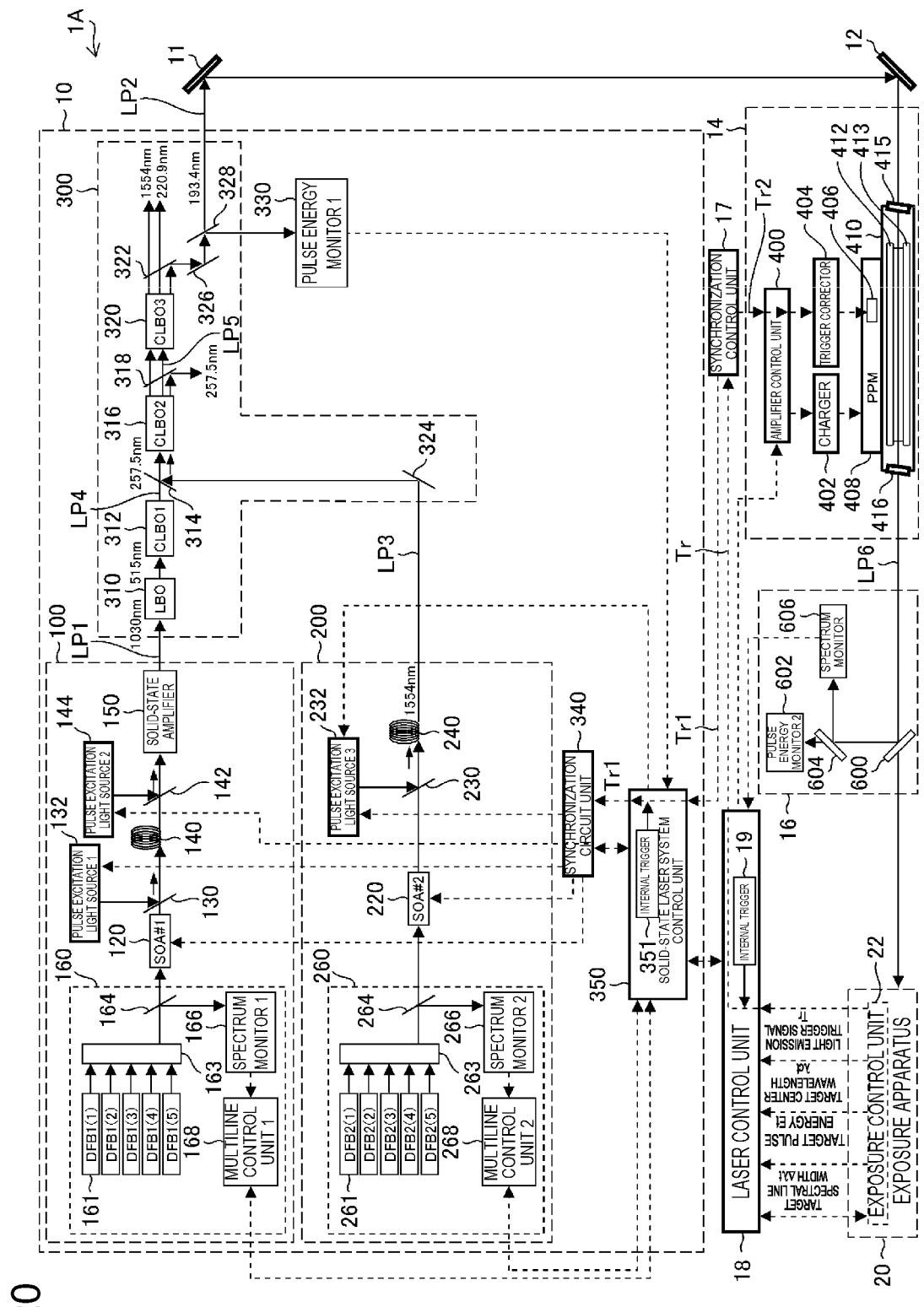
FIG. 20 schematically shows a configuration of a laser system according to Embodiment 1.

FIG. 20 schematically shows a configuration of a laser system 1A according to Embodiment 1. Differences from FIG. 5 will be described. The laser system 1A according to Embodiment 1 in FIG. 20 includes a first multiple semiconductor laser system 160 and a second multiple semiconductor laser system 260 in place of the first semiconductor laser system 110 and the second semiconductor laser system 210 in FIG. 5.

In the laser system 1A, the first multiple semiconductor laser system 160 can perform variable control of a spectral line width, and the second multiple semiconductor laser system 260 can perform variable control of a wavelength.

The first multiple semiconductor laser system 160 includes a plurality of semiconductor lasers 161 that perform CW oscillation in a single longitudinal mode with different oscillation wavelengths, a first beam combiner 163, a first beam splitter 164, a first spectrum monitor 166, and a first multiline control unit 168.

The semiconductor lasers 161 may be, for example, distributed feedback semiconductor lasers. An example using five semiconductor lasers 161 is shown herein, but not limited to this example, the number of the semiconductor lasers 161 may be two or more. In FIG. 20, the semiconductor lasers 161 included in the first multiple semiconductor laser system 160 are denoted as DFB1(1) to DFB1(5). The semiconductor lasers DFB1(1) to DFB1(5) are set to perform CW oscillation with different wavelengths near a wavelength of about 1030 nm. The semiconductor lasers DFB1(1) to DFB1(5) are examples of "a plurality of first semiconductor lasers" in the present disclosure. The semiconductor laser 161 is sometimes referred to as the first semiconductor laser 161.

The second multiple semiconductor laser system 260 includes a plurality of semiconductor lasers 261 that perform CW oscillation in a single longitudinal mode with different oscillation wavelengths, a second beam combiner 263, a second beam splitter 264, a second spectrum monitor 266, and a second multiline control unit 268.

The semiconductor lasers 261 may be, for example, distributed feedback semiconductor lasers. An example using five semiconductor lasers 261 is shown herein, but not limited to this example, the number of the semiconductor lasers 261 may be appropriately two or more. In FIG. 20, the semiconductor lasers 261 included in the second multiple semiconductor laser system 260 are denoted as DFB2(1) to DFB2(5). The semiconductor lasers DFB2(1) to DFB2(5) are set to perform CW oscillation with different wavelengths near a wavelength of about 1554 nm. The semiconductor lasers DFB2(1) to DFB2(5) are examples of "a plurality of second semiconductor lasers" in the present disclosure. The semiconductor laser 261 is sometimes referred to as the second semiconductor laser 261.

Figure 71:
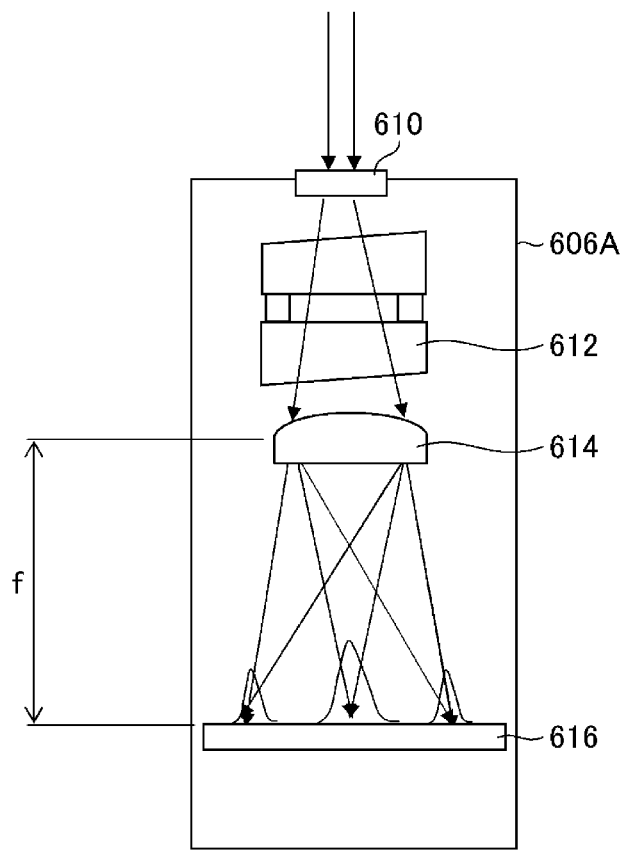
FIG. 71 schematically shows an exemplary configuration of a spectrum monitor using an etalon spectrometer.

The monitor module 16 in FIG. 20 further includes a beam splitter 604 and a spectrum monitor 606. The spectrum monitor 606 may include, for example, an etalon spectrometer that measures a spectral line width of an ArF laser beam (excimer beam) as shown in FIG. 71 described later.

The exposure control unit 22 has a signal line for transmitting data of a target spectral line width $\Delta Xt$ of an excimer beam to the laser control unit 18.

4.2 Operation

When receiving the data of the target spectral line width $\Delta\lambda t$ of the excimer beam from the exposure control unit 22, the laser control unit 18 of the laser system 1A in FIG. 20 calculates a target spectral line width $\Delta\lambda 1mt$ of multiline of the first multiple semiconductor laser system 160 such that the target spectral line width $\Delta\lambda t$ is reached. The multiline output from the first multiple semiconductor laser system 160 is referred to as "first multiline". The target spectral line width $\Delta\lambda 1mt$ of the first multiline is also referred to as "target spectral line width $\Delta\lambda 1mt$ of the first multiple semiconductor laser system 160". The target spectral line width $\Delta\lambda 1mt$ may be a difference between a shortest wavelength (minimum wavelength) and a longest wavelength (maximum wavelength) of oscillation wavelengths of the semiconductor lasers DFB1(1) to DFB1(5).

For the laser control unit 18 to calculate the target spectral line width $\Delta\lambda 1mt$ from the target spectral line width $\Delta\lambda$ of the excimer beam, a correlation between $\Delta\lambda t$ and $\Delta\lambda m$ may be previously stored as table data or a function in a memory unit such as a memory. The data indicating the correlation between $\Delta\lambda t$ and $\Delta\lambda m$ is an example of "relationship data specifying a relationship between the spectral line width of the excimer laser beam and the first multiline spectrum" in the present disclosure. Such relationship data may be updated as the laser system 1A operates.

The laser control unit 18 transmits, to a solid-state laser system control unit 350, data of the target spectral line width $\Delta\lambda 1mt$ of the first multiple semiconductor laser system 160.

When receiving the target spectral line width $\Delta\lambda 1mt$ of the first multiple semiconductor laser system 160, the solid-state laser system control unit 350 calculates target oscillation wavelengths of the semiconductor lasers DFB1(1) to DFB1(5), and transmits, to the first multiline control unit 168, data of the target oscillation wavelengths of the semiconductor lasers DFB1(1) to DFB1(5).

The first multiline control unit 168 calculates the target oscillation wavelengths of the semiconductor lasers DFB1(1) to DFB1(5), and control current values A1 and temperatures T1 of the semiconductor lasers DFB1(1) to DFB1(5) such that the oscillation wavelengths have the same predetermined light intensity. Here, a center wavelength $\lambda 1mc0$ of the first multiline calculated from the oscillation wavelengths and the light intensity of the semiconductor lasers DFB1(1) to DFB1(5) is controlled to be, for example, 1030 nm.

The multiline obtained by combining laser beams output from the semiconductor lasers DFB1(1) to DFB1(5) in the first multiple semiconductor laser system 160 is an example of "first multiple spectrum" in the present disclosure.

When receiving data of a target center wavelength $\lambda ct$ from the exposure control unit 22, the laser control unit 18 calculates a target center wavelength $\lambda 2mct$ of multiline of the second multiple semiconductor laser system 260 such that the target center wavelength $\lambda ct$ is reached, and transmits the target center wavelength $\lambda 2mct$ to the solid-state laser system control unit 350. The multiline output from the second multiple semiconductor laser system 260 is referred to as "second multiline". The target center wavelength $\lambda 2mct$ of the second multiline is also referred to as "target center wavelength $\lambda 2mct$ of the second multiple semiconductor laser system 260".

The solid-state laser system control unit 350 transmits data of the target center wavelength $\lambda 2mt$ of the second multiple semiconductor laser system 260 to the second multiline control unit 268.

The second multiline control unit 268 controls, in accordance with the target center wavelength $\lambda 2mct$, current values A2 and temperatures T2 of the semiconductor lasers DFB2(1) to DFB2(5) such that the semiconductor lasers DFB2(1) to DFB2(5) have oscillation wavelengths to suppress SBS and that the semiconductor lasers DFB2(1) to DFB2(5) have the same predetermined light intensity. Here, a center wavelength of the second multiline calculated from the oscillation wavelengths and the light intensity of the semiconductor lasers DFB2(1) to DFB2(5) is controlled to reach the target center wavelength $\lambda 2mct$. The multiline obtained by combining laser beams output from the semiconductor lasers DFB2(1) to DFB2(5) in the second multiple semiconductor laser system 260 is an example of "second multiline spectrum" in the present disclosure.

4.3 Example of Processing of Laser Control Unit

Figure 21:
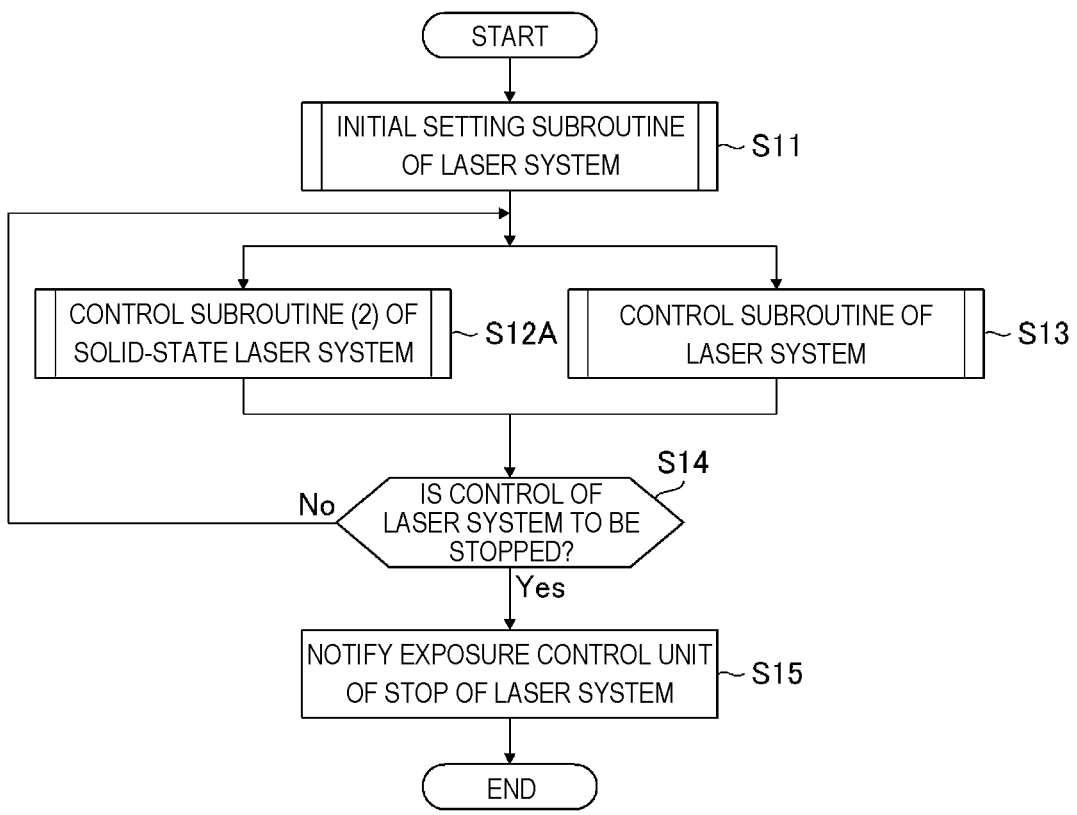
FIG. 21 is a flowchart of an example of processing of a laser control unit.

FIG. 21 is a flowchart of an example of processing of the laser control unit 18. The flowchart in FIG. 21 can be applied in place of the flowchart in FIG. 6. Differences from FIG. 6 will be described.

The flowchart in FIG. 21 includes step S12A in place of step S12 in FIG. 6. In step S12A, the laser control unit 18 performs a control subroutine (2) of the solid-state laser system 10.

Figure 22:
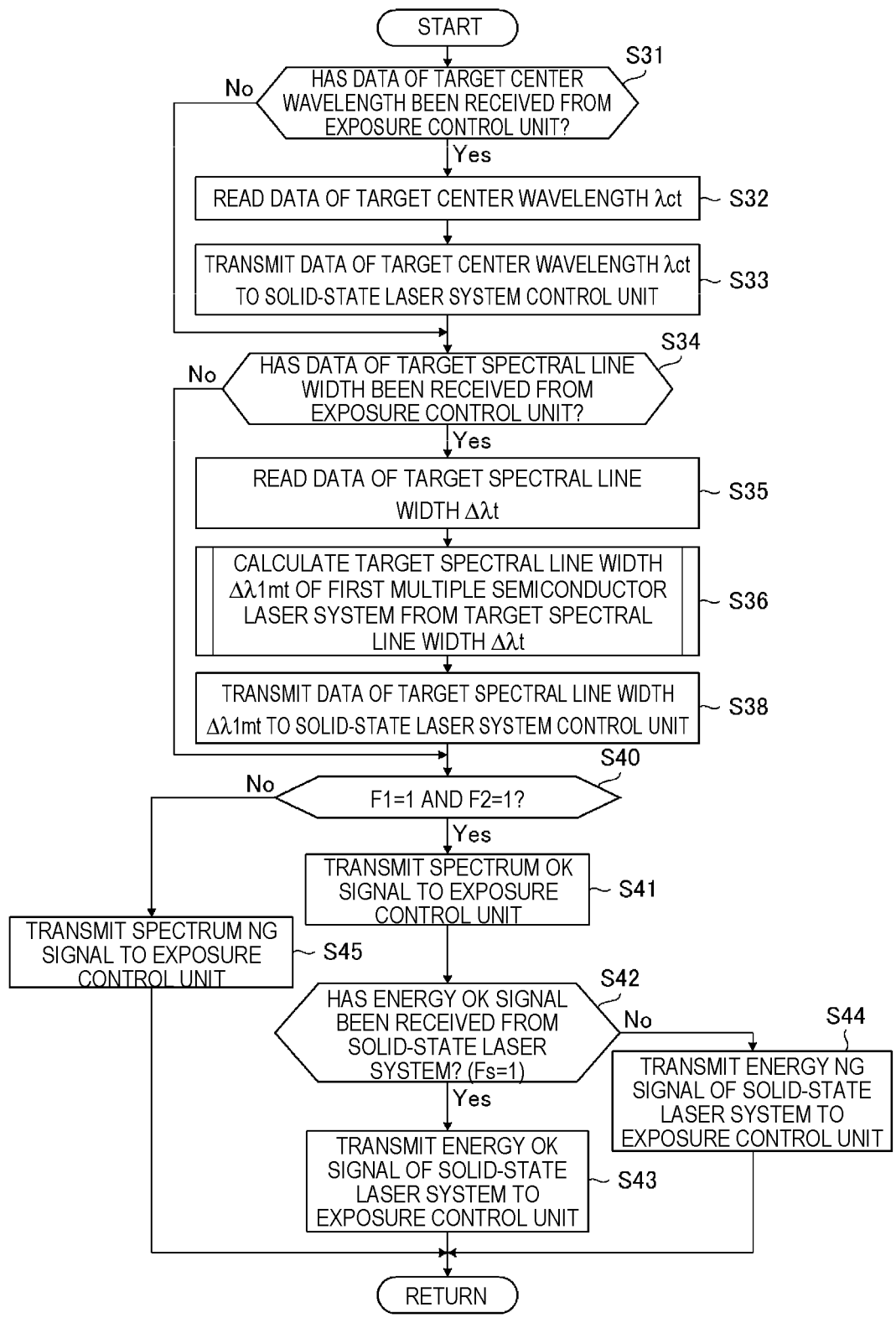
FIG. 22 is a flowchart of an example of a control subroutine (2) of a solid-state laser system.

FIG. 22 is a flowchart of an example of the control subroutine (2) of the solid-state laser system. The flowchart in FIG. 22 is applied to step S12A in FIG. 21. Differences between the flowcharts in FIG. 22 and FIG. 8 will be described.

The flowchart in FIG. 22 includes steps S35 to S38 between step S33 and step S40.

When a determination result in step S31 is No or after step S33, the laser control unit 18 goes to step S34.

In step S34, the laser control unit 18 determines whether or not data of a target spectral line width has been received from the exposure control unit 22. When the determination result in step S34 is No, the laser control unit 18 goes to step S40.

When the determination result in step S34 is Yes, that is, when data of a new target spectral line width has been received from the exposure control unit 22, the laser control unit 18 goes to step S35, and reads data of a target spectral line width $\Delta\lambda t$.

Then, in step S36, the laser control unit 18 calculates a target spectral line width $\Delta\lambda 1mt$ of the first multiple semiconductor laser system 160 from the target spectral line width $\Delta\lambda t$.

Then, in step S38, the laser control unit 18 transmits data of the target spectral line width $\Delta\lambda 1mt$ to the solid-state laser system control unit 350.

After step S38, the laser control unit 18 goes to step S40. When the determination result in step S34 is No, the laser control unit 18 skips steps S35 to S38 and goes to step S40. The processes in step S40 and thereafter are as described for the flowchart in FIG. 8.

Figure 23:
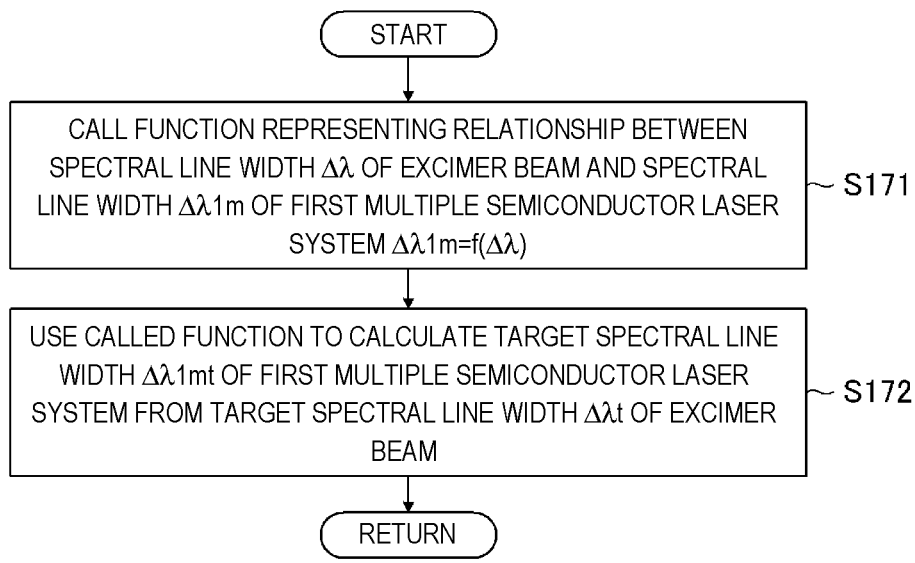
FIG. 23 is a flowchart of an example of processing for calculating a target spectral line width $\Delta\lambda 1mt$ of a first multiple semiconductor system.

FIG. 23 is a flowchart of an example of processing for calculating the target spectral line width $\Delta\lambda 1mt$ of the first multiple semiconductor system. The flowchart in FIG. 23 is applied to step S36 in FIG. 22.

In step S171 in FIG. 23, the laser control unit 18 calls a function of $\Delta\lambda 1m$ being $f(\Delta\lambda)$ representing a relationship between a spectral line width $\Delta\lambda$ of the excimer beam and the spectral line width $\Delta\lambda 1m$ of the first multiple semiconductor laser system.

Figure 24:
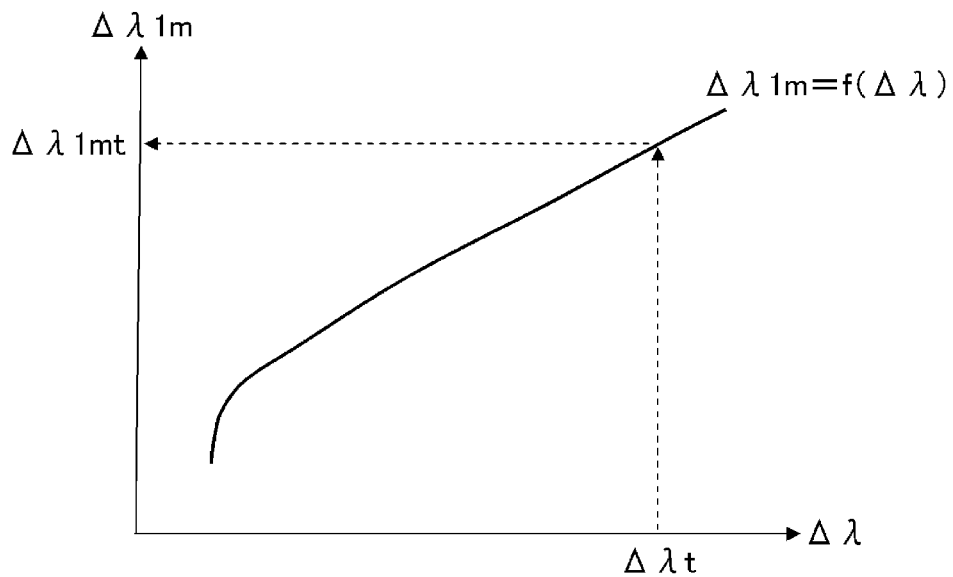
FIG. 24 is a graph showing an example of a function representing a relationship between a spectral line width $\Delta\lambda$ of an excimer beam and a spectral line width $\Delta\lambda 1m$ of the first multiple semiconductor laser system.

FIG. 24 shows an example of the function of $\Delta\lambda 1m$ being $f(\Delta\lambda)$. FIG. 24 is a graph showing an example of the function representing the relationship between the spectral line width $\Delta\lambda$ of the excimer beam and the spectral line width $\Delta\lambda 1m$ of the first multiple semiconductor laser system. Such a function is obtained by, for example, previously measuring data of the spectral line width $\Delta\lambda$ of the pulse laser beam amplified by the excimer amplifier 14 and the spectral line width $\Delta\lambda m$ of the multiline generated by the first multiple semiconductor laser system 160 and calculating an approximate function from the measurement result.

The laser control unit 18 can call the approximate function as shown in FIG. 24 from a memory to calculate $\Delta\lambda 1mt$ from $\Delta\lambda t$.

In step S172 in FIG. 23, the laser control unit 18 uses the called function to calculate the target spectral line width $\Delta\lambda 1mt$ of the first multiple semiconductor laser system 160 from the target spectral line width $\Delta\lambda t$ of the excimer beam.

After step S172, the laser control unit 18 finishes the flowchart in FIG. 23 and returns to the flowchart in FIG. 22.

Instead of the function as shown in FIG. 24, table data may be stored in the memory and called to calculate $\Delta\lambda 1mt$ from $\Delta\lambda t$.

4.4 Control Example 1 of First Multiple Semiconductor Laser System

Figure 25:
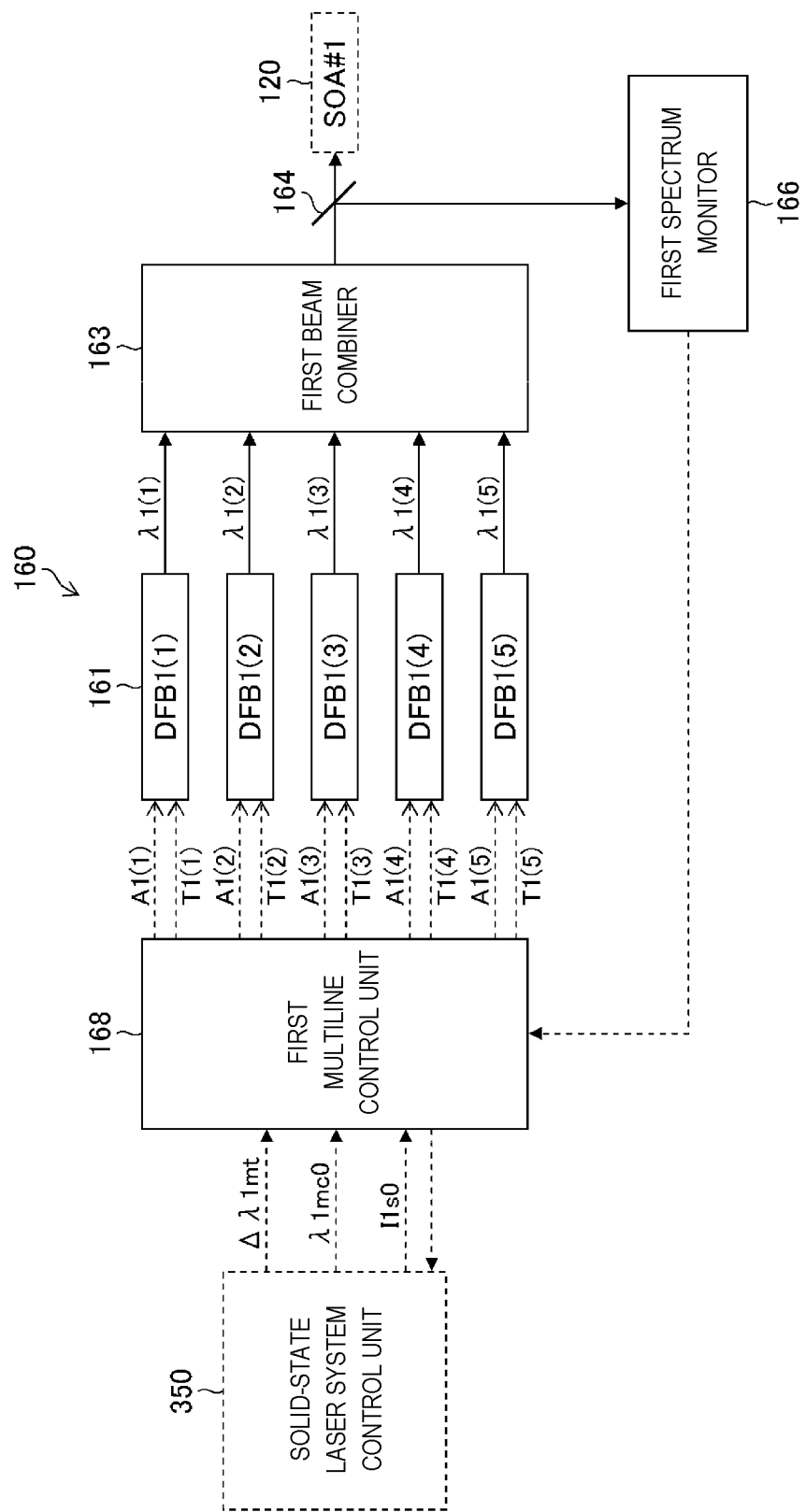
FIG. 25 is a block diagram of Control example 1 of the first multiple semiconductor laser system.

FIG. 25 is a block diagram of Control example 1 of the first multiple semiconductor laser system 160. Here, an example is shown in which a target center wavelength $\lambda 1mct$ and light intensity $I1st$ of the first multiline are fixed and control to change the spectral line width $\Delta\lambda 1m$ is performed.

The solid-state laser system control unit 350 transmits, to the first multiline control unit 168, data of the target spectral line width $\Delta\lambda 1mt$, the target center wavelength $\lambda 1mc0$, and target light intensity $I1s0$ of the first multiline. The first multiline control unit 168 controls current values A1(1) to A1(5) and temperatures T1(1) to T1(5) of the semiconductor lasers DFB1(1) to DFB(5). Wavelengths of laser beams output from the semiconductor lasers DFB1(1) to DFB(5) are denoted as $\lambda 1(1)$ to $\lambda 1(5)$. The plurality of laser beams are combined by the first beam combiner 163.

The multiline laser beam output from the first beam combiner 163 enters the first beam splitter 164. The laser beam having passed through the first beam splitter 164 enters the first semiconductor optical amplifier 120. The laser beam reflected by the first beam splitter 164 enters the first spectrum monitor 166. Part of the CW laser beam output from the first beam combiner 163 enters the first spectrum monitor 166.

Figure 26:
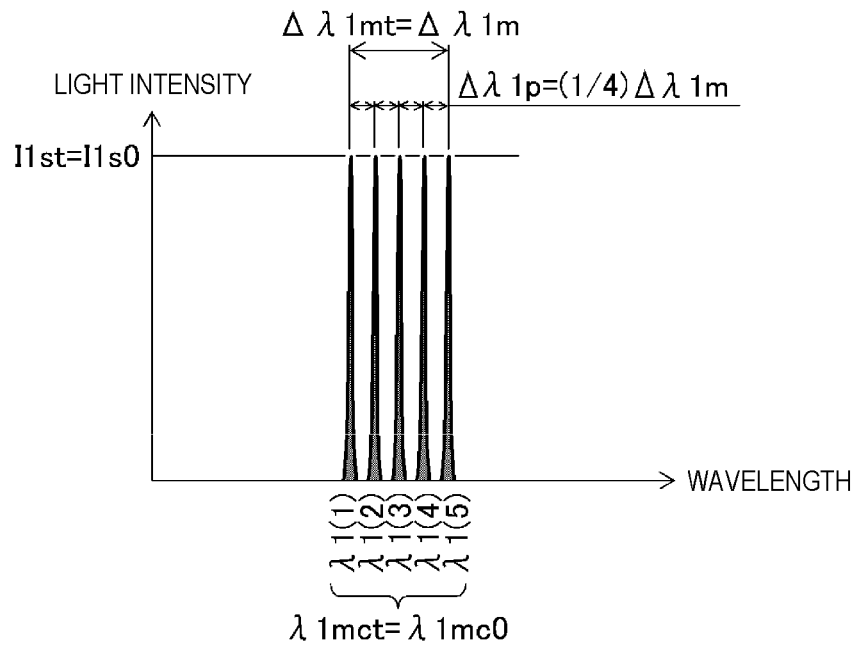
FIG. 26 shows an example of a multiline spectrum detected by a first spectrum monitor in Control example 1 in FIG. 25.

FIG. 26 shows an example of a multiline spectrum detected by the first spectrum monitor 166 in Control example 1 in FIG. 25. Here, an example of multiline is shown obtained when the target center wavelength $\lambda 1mct$ is $\lambda 1mc0$ and the target spectral line width $\Delta\lambda 1mt$ is $\Delta\lambda 1m$.

In FIG. 26, the wavelengths of the multiline are $\lambda 1(1)$ to $\lambda 1(5)$, and the center wavelength is $\lambda 1mc0$. A wavelength interval $\Delta\lambda 1p$ of the multiline is generally constant and one fourth of the spectral line width $\Delta\lambda 1m$. Further, the lines of the wavelengths $\lambda 1(1)$ to $\lambda 1(5)$ have the same light intensity $I1s0$. The wavelength interval $\Delta\lambda 1p$ of the multiline is an interval between the oscillation wavelengths of the semiconductor lasers DFB1(1) to DFB1(5).

Figure 27:
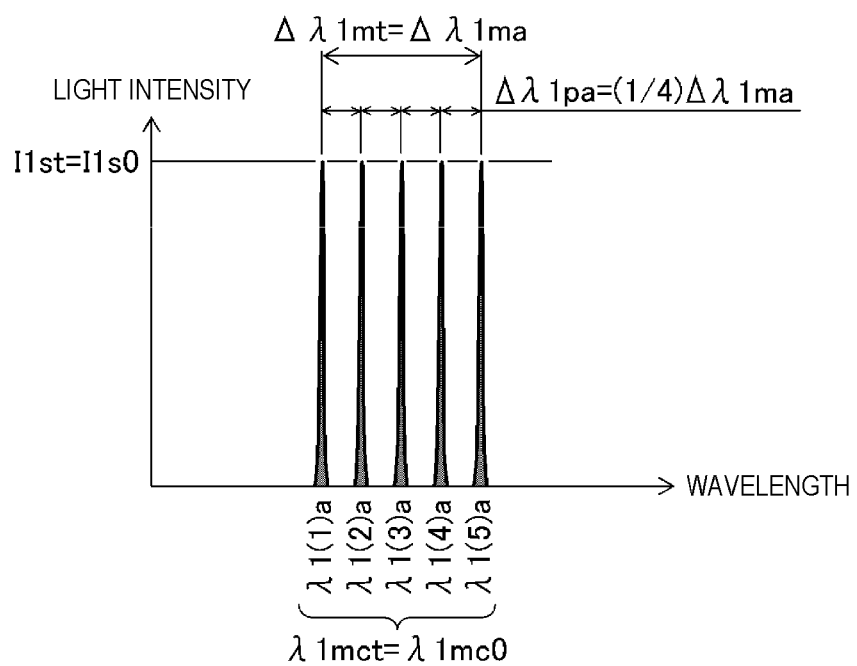
FIG. 27 shows an example of a multiline spectrum obtained when a center wavelength of the multiline is fixed and control to change a spectral line width of the multiline is performed in a spectral shape in FIG. 26.

FIG. 27 shows an example of a multiline spectrum obtained when the center wavelength of the multiline is fixed and control to change the spectral line width of the multiline is performed in a spectral shape in FIG. 26. In FIG. 27, as compared to FIG. 26, the target spectral line width $\Delta\lambda 1mt$ is changed to $\Delta\lambda 1ma$. Thus, the wavelengths of the semiconductor lasers DFB1(1) to DFB1(5) are changed to $\lambda 1(1)a$ to $\lambda 1(5)a$.

In FIG. 27, a wavelength interval $\Delta\lambda 1pa$ of the multiline is generally constant and one fourth of the spectral line width $\Delta\lambda 1ma$. On the other hand, the center wavelength of the multiline is still $\lambda 1mc0$ as in FIG. 26, and the lines of the wavelengths $\lambda 1(1)a$ to $\lambda 1(5)a$ have the same light intensity $I1s0$ as in FIG. 26.

4.5 Control Example 1 of Second Multiple Semiconductor Laser System

Figure 28:
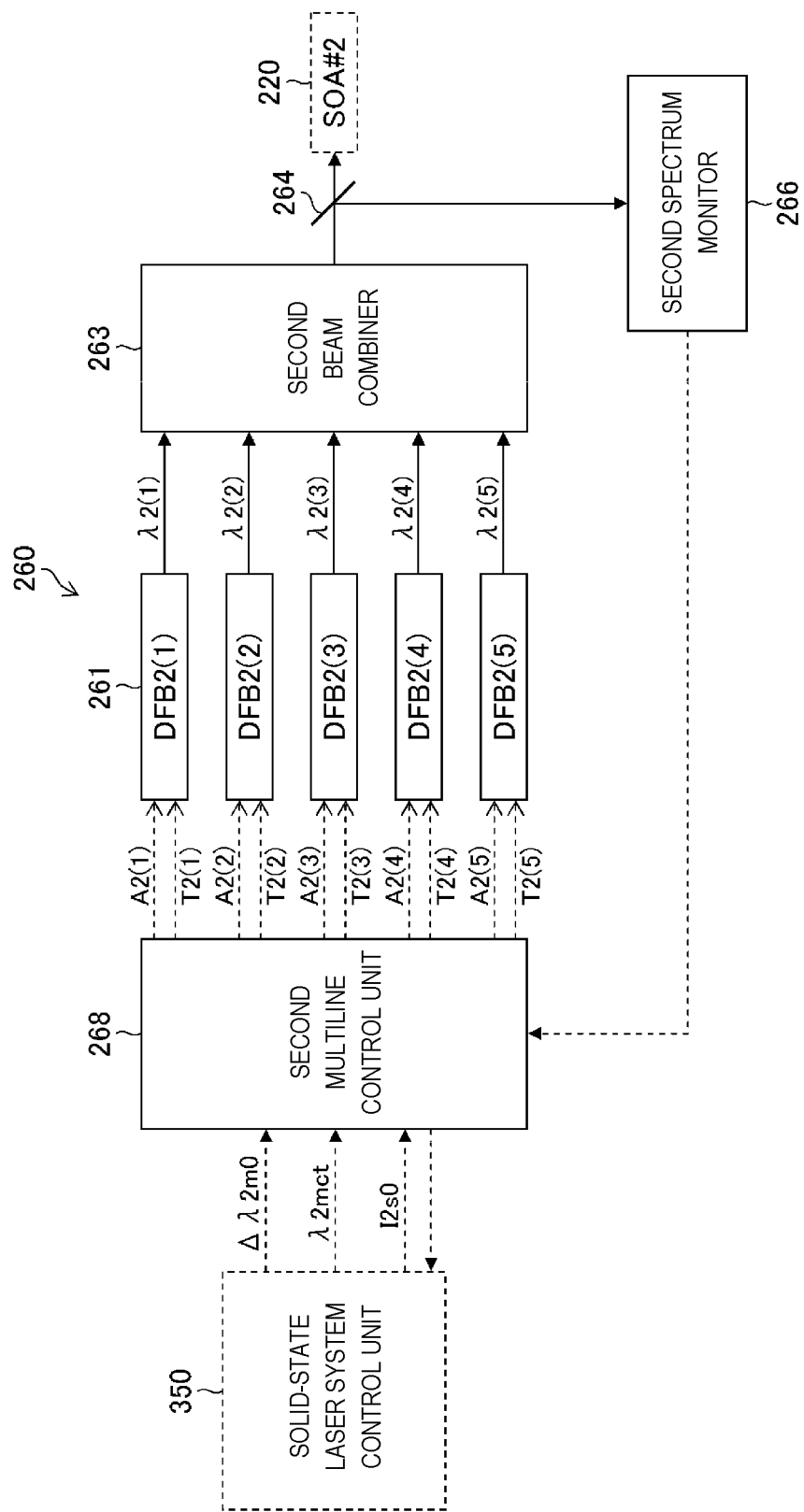
FIG. 28 is a block diagram of a control example of a second multiple semiconductor laser system.

FIG. 28 is a block diagram of a control example of the second multiple semiconductor laser system. Here, an example is shown in which a spectral line width $\Delta\lambda 2mt$ and light intensity $I2st$ of the second multiline are fixed and control to change the target center wavelength $\lambda 2mct$ is performed.

The solid-state laser system control unit 350 transmits, to the second multiline control unit 268, data of a target spectral line width $\Delta\lambda 2m0$, the target center wavelength $\lambda 2mct$, and target light intensity $I2s0$ of the second multiline. The second multiline control unit 268 controls current values $A2(1)$ to $A2(5)$ and temperatures $T2(1)$ to $T2(5)$ of the semiconductor lasers DFB2(1) to DFB2(5). Wavelengths of laser beams output from the semiconductor lasers DFB2(1) to DFB2(5) are denoted as $\lambda 2(1)$ to $\lambda 2(5)$. The plurality of laser beams are combined by the second beam combiner 263.

The multiline laser beam output from the second beam combiner 263 enters the second beam splitter 264. The laser beam having passed through the second beam splitter 264 enters the second semiconductor optical amplifier 220. The laser beam reflected by the second beam splitter 264 enters the second spectrum monitor 266. Part of the CW laser beam output from the second beam combiner 263 enters the second spectrum monitor 266.

Figure 29:
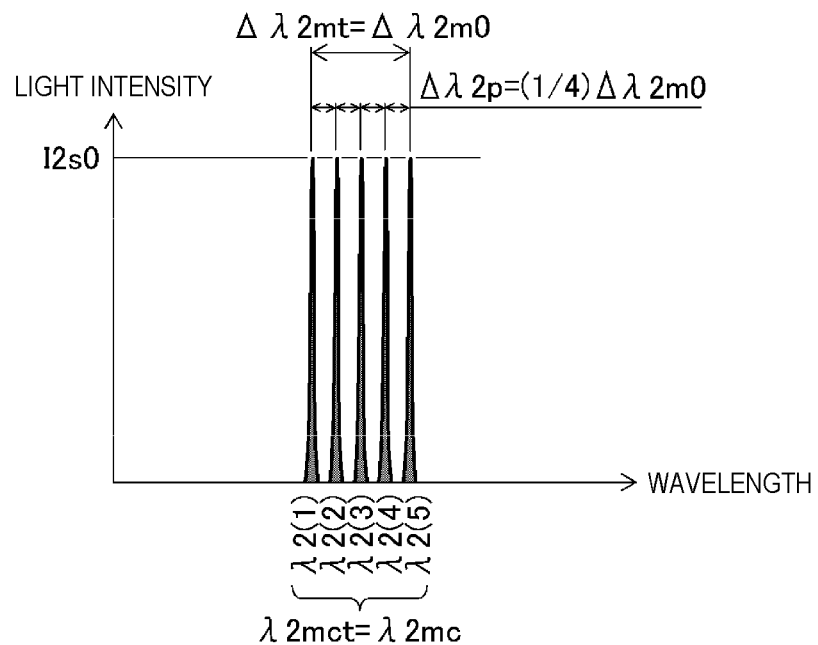
FIG. 29 shows an example of a multiline spectrum detected by a second spectrum monitor in Control example 1 in FIG. 28.

FIG. 29 shows an example of a multiline spectrum detected by the second spectrum monitor 266 in Control example 1 in FIG. 28. Here, an example of multiline is shown obtained when the target center wavelength $\lambda 2mct$ is $\lambda 2mc$ and the target spectral line width $\Delta\lambda 2mt$ is $\Delta\lambda 2m0$. In FIG. 29, the wavelengths of the multiline are $\lambda 2(1)$ to $\lambda 2(5)$ and the center wavelength is $\lambda 2mc$. A wavelength interval $\Delta\lambda 2p$ of the multiline is generally constant and one fourth of the spectral line width $\Delta\lambda 2m0$. Further, the lines of the wavelengths $\lambda 2(1)$ to $\lambda 2(5)$ have the same light intensity $I2s0$.

Figure 30:
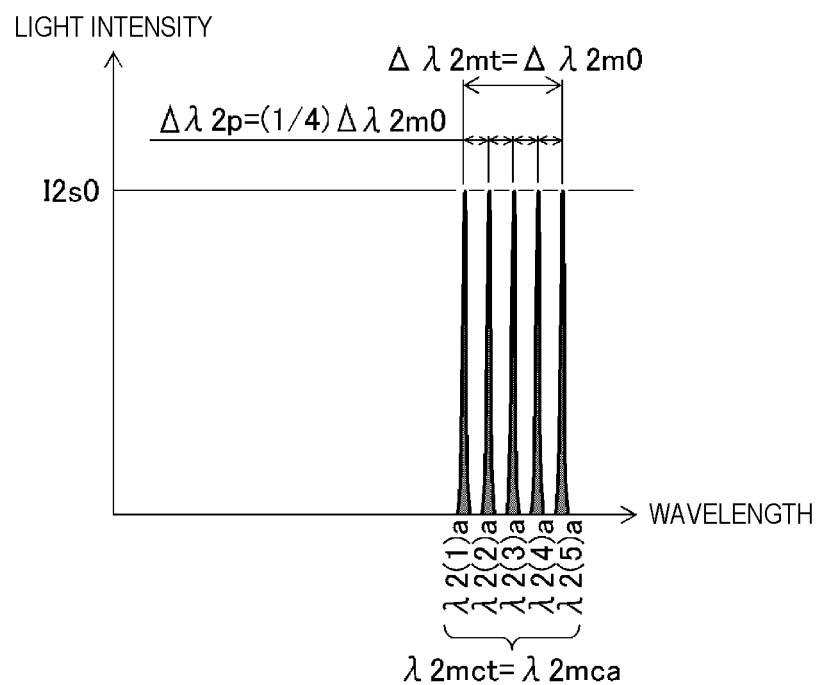
FIG. 30 shows an example of a multiline spectrum obtained when a spectral line width of the multiline is fixed and control to change a center wavelength of the multiline is performed in a spectral shape in FIG. 29.

FIG. 30 shows an example of a multiline spectrum obtained when the spectral line width of the multiline is fixed and control to change a center wavelength of the multiline is performed in a spectral shape in FIG. 29. In FIG. 30, as compared to FIG. 29, the target center wavelength $\lambda 2mct$ of the multiline is changed to $\lambda 2mca$. Thus, the wavelengths of the semiconductor lasers DFB2(1) to DFB2(5) are changed to $\lambda 2(1)a$ to $\lambda 2(5)a$. On the other hand, the target spectral line width $\Delta\lambda 2mt$ of the multiline is still $\Delta\lambda 2m0$, and the lines of the multiline have the same light intensity $I2s0$ as in FIG. 29. A variable range of the target center wavelength of the multiline generated by the second multiple semiconductor laser system 260 may be, for example, 1548 nm to 1557 nm.

4.6 Example of Processing of Solid-State Laser System Control Unit

Figure 31:
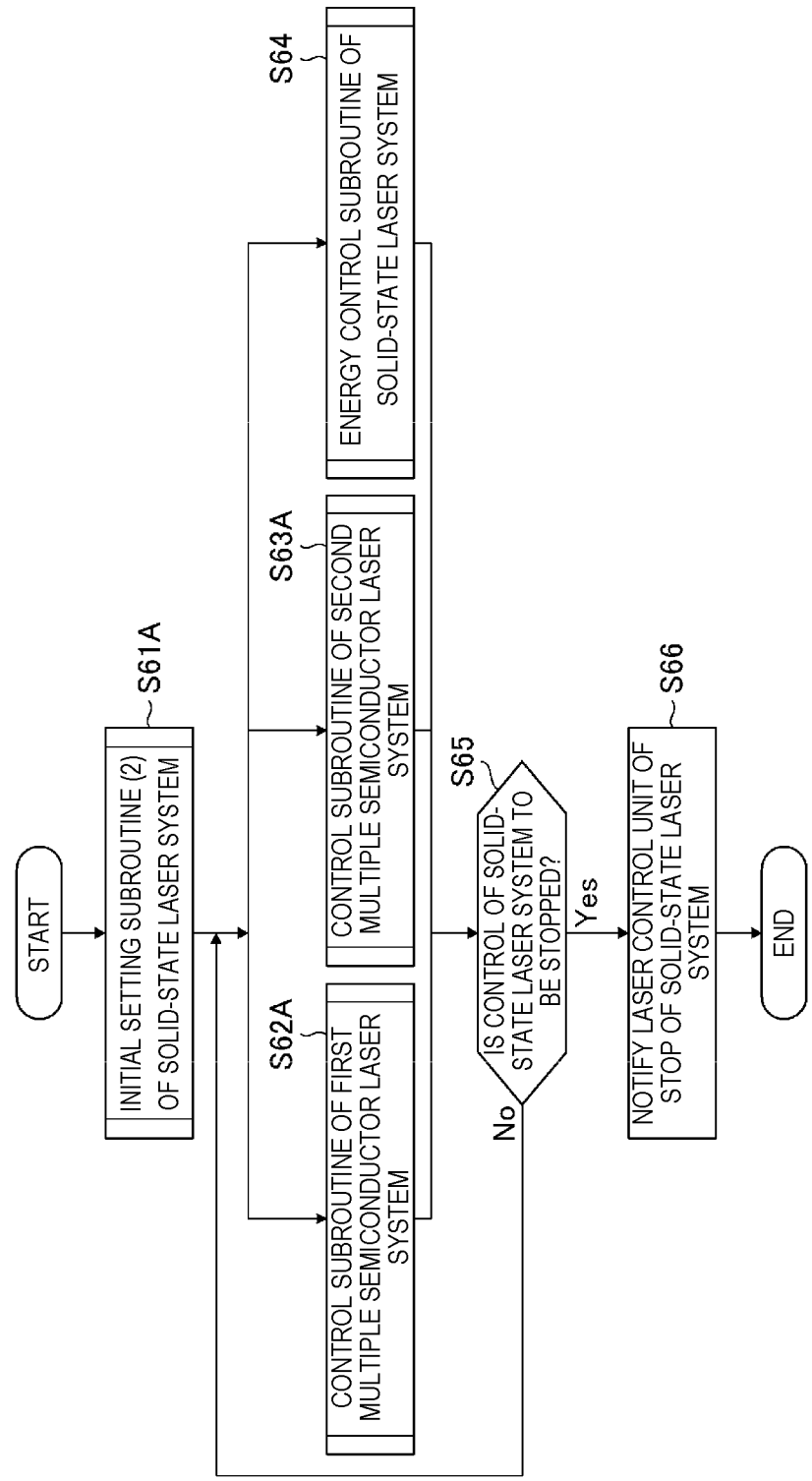
FIG. 31 is a flowchart of an example of processing of a solid-state laser system control unit.

FIG. 31 is a flowchart of an example of processing of the solid-state laser system control unit 350. The flowchart in FIG. 31 can be applied in place of the flowchart in FIG. 10. Differences from FIG. 10 will be described.

The flowchart in FIG. 31 includes step S61A, step S62A, and step S63A in place of step S61, step S62, and step S63 in FIG. 10.

In step S61A, the solid-state laser system control unit 350 performs an initial setting subroutine (2) of the solid-state laser system.

In step S62A, the solid-state laser system control unit 350 performs a control subroutine of the first multiple semiconductor laser system 160.

In step S63A, the solid-state laser system control unit 350 performs a control subroutine of the second multiple semiconductor laser system 260.

Figure 32:
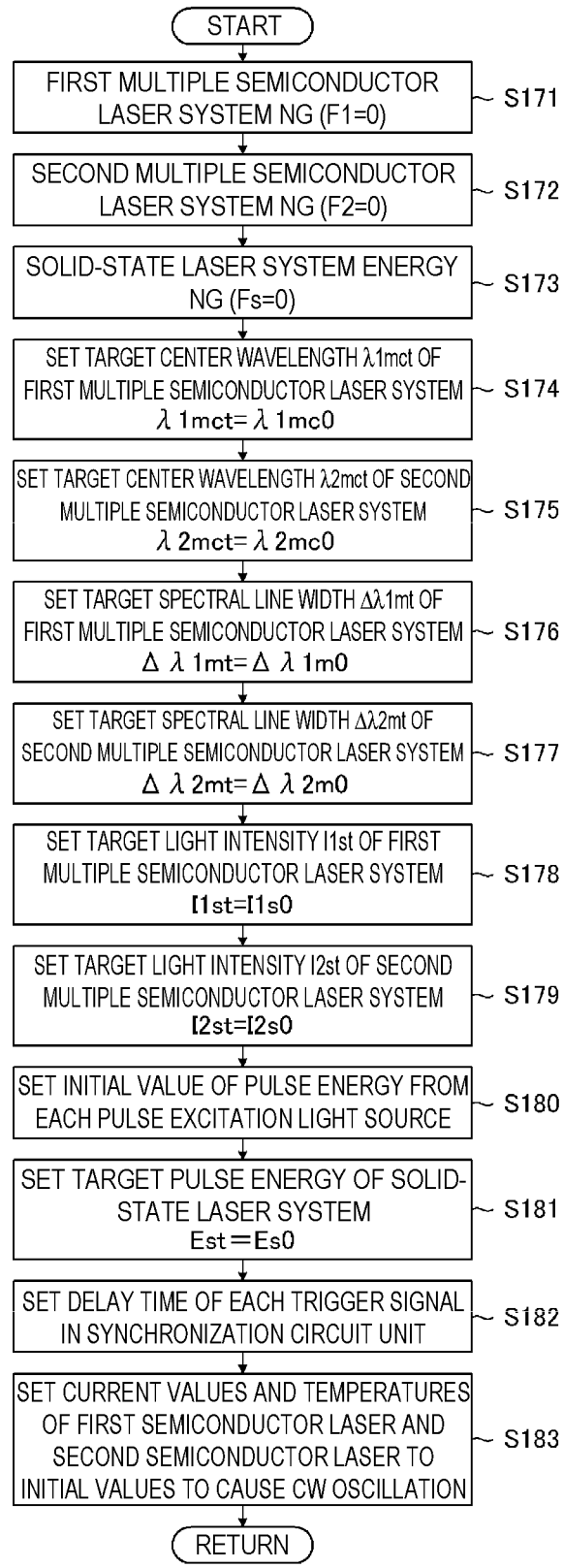
FIG. 32 is a flowchart of an example of an initial setting subroutine (2) of a solid-state laser system.

FIG. 32 is a flowchart of an example of the initial setting subroutine (2) of the solid-state laser system. The flowchart in FIG. 32 is applied to step S61A in FIG. 31.

In step S171 in FIG. 32, the solid-state laser system control unit 350 sets a flag signal indicating a state of the first multiple semiconductor laser system 160 to NG. In other words, the solid-state laser system control unit 350 sets a value of a flag F1 to "0".

In step S172, the solid-state laser system control unit 350 sets a flag signal indicating a state of the second multiple semiconductor laser system 260 to NG. In other words, the solid-state laser system control unit 350 sets a value of a flag F2 to "0".

In step S173, the solid-state laser system control unit 350 sets a flag signal indicating a state of energy of the solid-state laser system 10 to NG. In other words, the solid-state laser system control unit 350 sets a value of a flag Fs to "0".

In step S174, the solid-state laser system control unit 350 sets the target center wavelength $\lambda 1mct$ of the first multiple semiconductor laser system 160 to an initial value $\lambda 1mc0$. The initial value $\lambda 1mc0$ may be, for example, 1030 nm.

In step S175, the solid-state laser system control unit 350 sets the target center wavelength $\lambda 2mct$ of the second multiple semiconductor laser system 260 to an initial value $\lambda 2mc0$. The initial value $\lambda 2mc0$ may be, for example, 1554 nm.

In step S176, the solid-state laser system control unit 350 sets the target spectral line width $\Delta\lambda 1mt$ of the first multiple semiconductor laser system 160 to an initial value $\Delta\lambda 1m0$. Here, the target spectral line width $\Delta\lambda 1mt$ is set to the initial value $\Delta\lambda 1m0$ at which SBS is suppressed in the first fiber amplifier 140.

In step S177, the solid-state laser system control unit 350 sets the target spectral line width $\Delta\lambda 2mt$ of the second multiple semiconductor laser system 260 to an initial value $\Delta\lambda 2m0$. Here, the target spectral line width $\Delta\lambda 2mt$ is set to the initial value $\Delta\lambda 2m0$ at which SBS is suppressed in the second fiber amplifier 240.

In step S178, the solid-state laser system control unit 350 sets the target light intensity $I1st$ of the multiline generated by the first multiple semiconductor laser system 160 to an initial value $I1s0$.

In step S179, the solid-state laser system control unit 350 sets the target light intensity $I2st$ of the multiline generated by the second multiple semiconductor laser system 260 to an initial value $I2s0$.

Steps S180 to S183 are similar to steps S77 to S79 in FIG. 11.

In step S180 in FIG. 32, the solid-state laser system control unit 350 sets an initial value of pulse energy from each of the first pulse excitation light source 132, the second pulse excitation light source 144, and the third pulse excitation light source 232.

In step S181, the solid-state laser system control unit 350 sets target pulse energy Est of the solid-state laser system 10 to an initial value Es0.

In step S182, the solid-state laser system control unit 350 sets a delay time of each trigger signal in the synchronization circuit unit 340.

In step S183, the solid-state laser system control unit 350 sets current values and temperatures of the first semiconductor laser 161 and the second semiconductor laser 261 to initial values to cause CW oscillation.

After step S183, the solid-state laser system control unit 350 finishes the flowchart in FIG. 32 and returns to the flowchart in FIG. 31.

Figure 33:
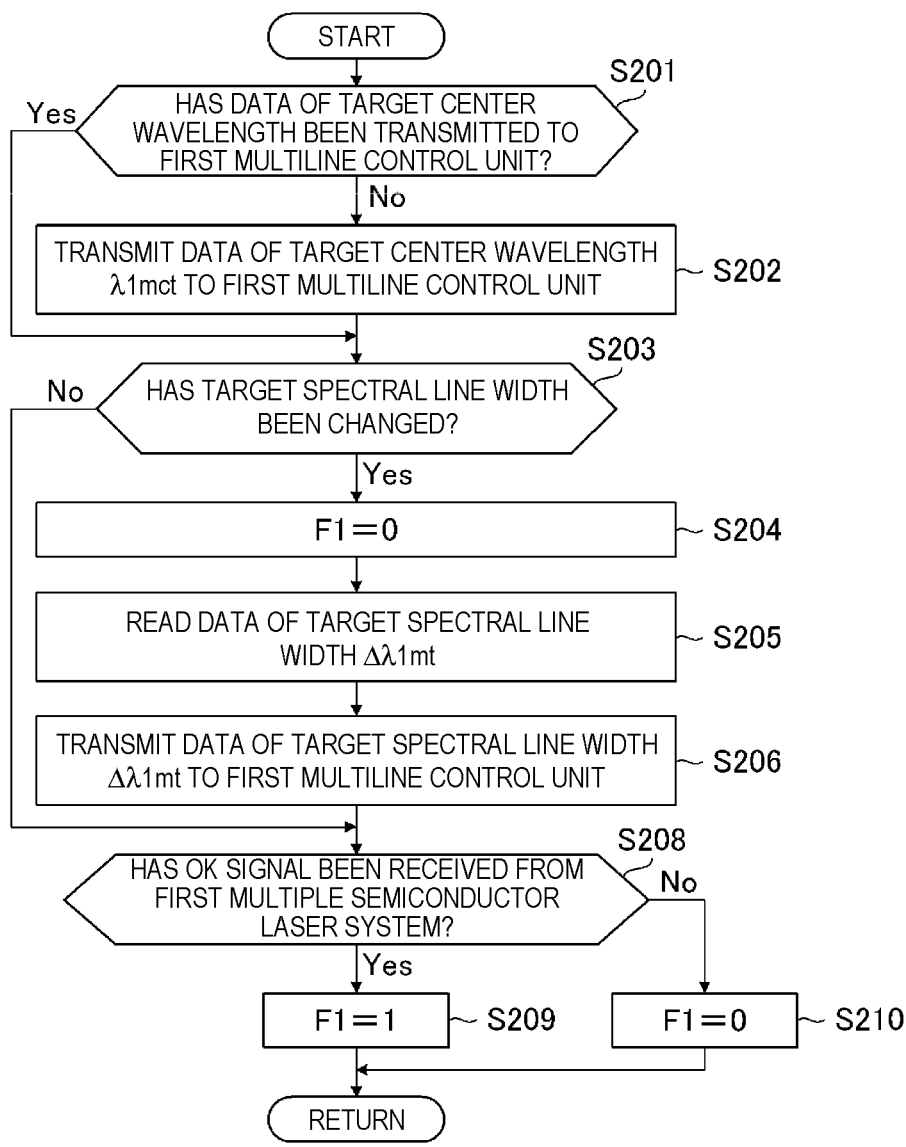
FIG. 33 is a flowchart of an example of a control subroutine of a first multiple semiconductor laser system.

FIG. 33 is a flowchart of an example of the control subroutine of the first multiple semiconductor laser system 160. The flowchart in FIG. 33 is applied to step S62A in FIG. 31.

In step S201 in FIG. 33, the solid-state laser system control unit 350 determines whether or not data of the target center wavelength of the multiline has been transmitted to the first multiline control unit 168. When the determination result in step S201 is No, the solid-state laser system control unit 350 goes to step S202, and transmits data of the target center wavelength λ1*mct* to the first multiline control unit 168. In this case, the target center wavelength λ1*mct* is a fixed value (initial value) λ1*mc*0, which is, for example, 1030 nm.

After step S202, the solid-state laser system control unit 350 goes to step S203. When the determination result in step S201 is Yes, the solid-state laser system control unit 350 skips step S202 and goes to step S203.

In step S203, the solid-state laser system control unit 350 determines whether or not the target spectral line width has been changed. When the determination result in step S203 is Yes, that is, when the target spectral line width has been changed, the solid-state laser system control unit 350 goes to step S204 and transmits, to the laser control unit 18, a flag signal of F1 being 0 indicating that the first multiple semiconductor laser system 160 is in an NG state.

Then, in step S205, the solid-state laser system control unit 350 reads data of the target spectral line width Δλ1*mt*.

In step S206, the solid-state laser system control unit 350 transmits the data of the target spectral line width Δλ1*mt* to the first multiline control unit 168.

After step S206, the solid-state laser system control unit 350 goes to step S208. When the determination result in step S203 is No, that is, when the exposure control unit 22 does not request the change of the target spectral line width, the solid-state laser system control unit 350 skips steps S204 to S206 and goes to step S208.

In step S208, the solid-state laser system control unit 350 determines whether or not an OK signal has been received from the first multiple semiconductor laser system 160.

When the determination result in step S208 is Yes, the solid-state laser system control unit 350 goes to step S209, and transmits a flag signal of F1 being 1 to the laser control unit 18.

When the determination result in step S208 is No, the solid-state laser system control unit 350 goes to step S210, and transmits a flag signal of F1 being 0 to the laser control unit 18.

After step S209 or S210, the solid-state laser system control unit 350 finishes the flowchart in FIG. 33 and returns to the flowchart in FIG. 31.

Figure 34:
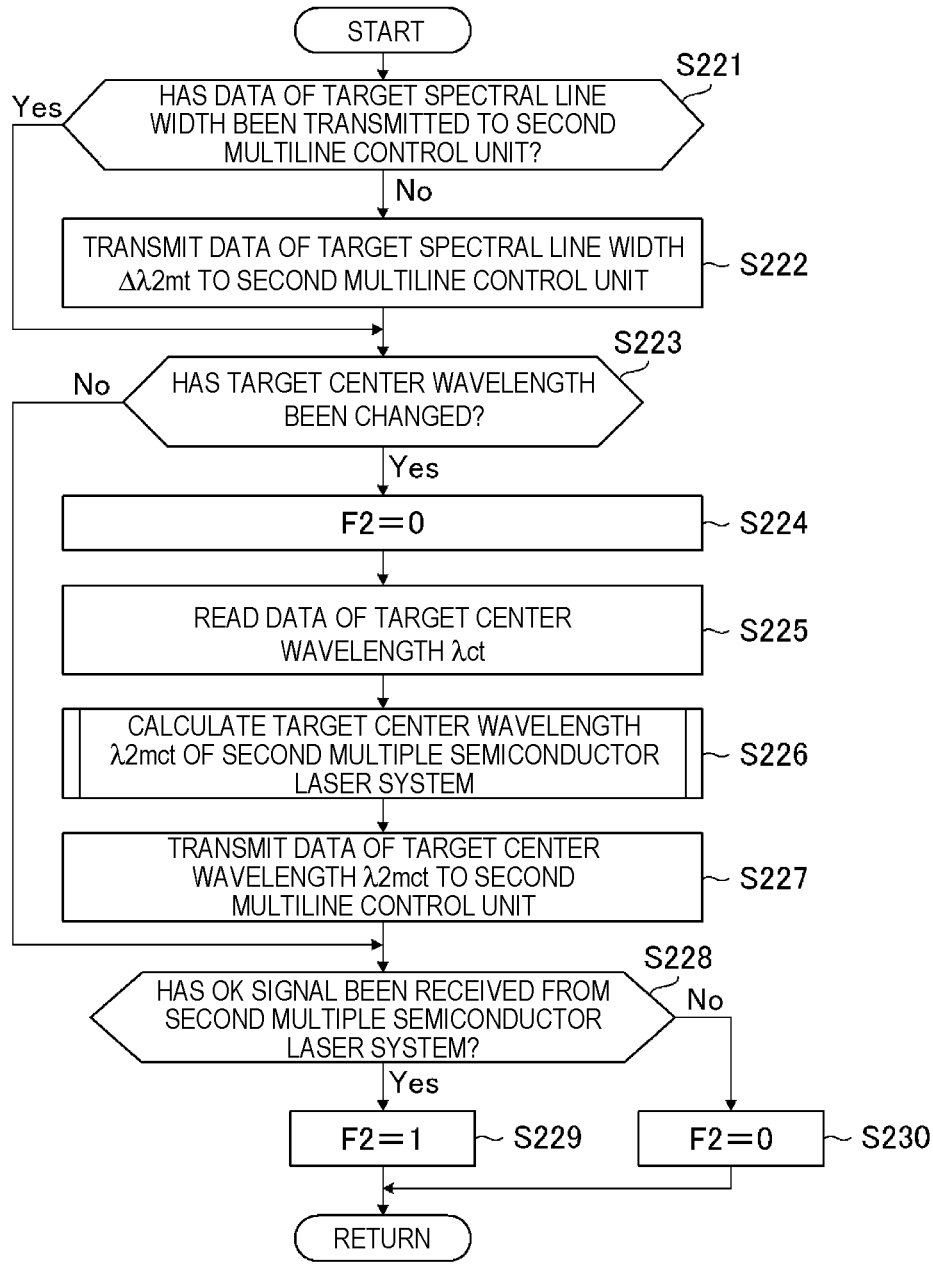
FIG. 34 is a flowchart of an example of a control subroutine of a second multiple semiconductor laser system.

FIG. 34 is a flowchart of an example of the control subroutine of the second multiple semiconductor laser system 260. The flowchart in FIG. 34 is applied to step S63A in FIG. 31.

In step S221 in FIG. 34, the solid-state laser system control unit 350 determines whether or not data of the target spectral line width of the multiline has been transmitted to the second multiline control unit 268. When the determination result in step S221 is No, the solid-state laser system control unit 350 goes to step S222, and transmits data of the target spectral line width Δλ2*mt* to the second multiline control unit 268. In this case, the target spectral line width Δλ2*mt* is a fixed value (initial value) Δλ2*m*0.

After step S222, the solid-state laser system control unit 350 goes to step S223. When the determination result in step S221 is Yes, the solid-state laser system control unit 350 skips step S222 and goes to step S223.

In step S223, the solid-state laser system control unit 350 determines whether or not the target center wavelength has been changed. When the determination result in step S223 is Yes, that is, when the target center wavelength has been changed, the solid-state laser system control unit 350 goes to step S224 and transmits, to the laser control unit 18, a flag signal of F2 being 0 indicating that the second multiple semiconductor laser system 260 is in an NG state.

Then, in step S225, the solid-state laser system control unit 350 reads data of the target center wavelength λct designated by the exposure control unit 22.

In step S226, the solid-state laser system control unit 350 calculates, from the target center wavelength λct, the target center wavelength λ2*mct* of the multiline of the second multiple semiconductor laser system 260.

In step S227, the solid-state laser system control unit 350 transmits data of the target center wavelength λ2*mct* to the second multiline control unit 268.

After step S227, the solid-state laser system control unit 350 goes to step S228. When the determination result in step S223 is No, that is, when the exposure control unit 22 does not request the change of the target center wavelength, the solid-state laser system control unit 350 skips steps S224 to S227 and goes to step S228.

In step S228, the solid-state laser system control unit 350 determines whether or not an OK signal has been received from the second multiple semiconductor laser system 260.

When the determination result in step S228 is Yes, the solid-state laser system control unit 350 goes to step S229, and transmits a flag signal of F2 being 1 to the laser control unit 18.

When the determination result in step S228 is No, the solid-state laser system control unit 350 goes to step S230, and transmits a flag signal of F2 being 0 to the laser control unit 18.

After step S229 or S230, the solid-state laser system control unit 350 finishes the flowchart in FIG. 34 and returns to the flowchart in FIG. 31.

Figure 35:
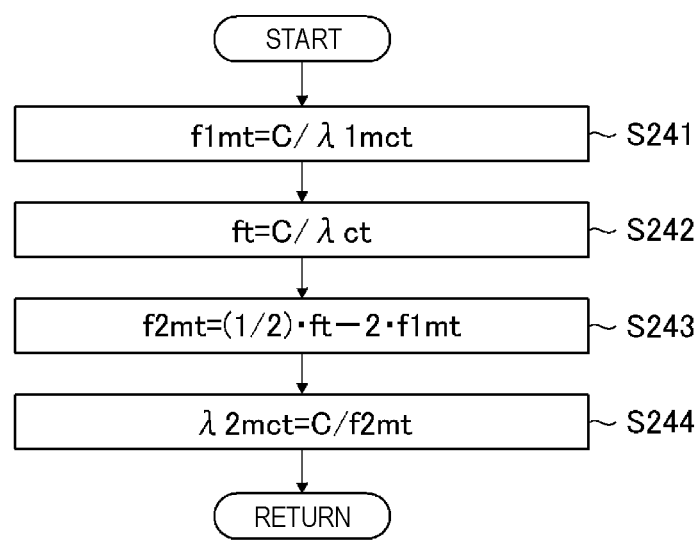
FIG. 35 is a flowchart of an example of processing for calculating a target center wavelength $\lambda 2mct$ of the second multiple semiconductor laser system.

FIG. 35 is a flowchart of an example of processing for calculating the target center wavelength λ2*mct* of the second multiple semiconductor laser system 260. The flowchart in FIG. 35 is applied to step S226 in FIG. 34. A calculation method in the flowchart in FIG. 35 is the same as in the flowchart in FIG. 14.

In step S241 in FIG. 35, the solid-state laser system control unit 350 converts, into a frequency f1*mt*, the target center wavelength λ1*mct* of the first multiline from the first multiple semiconductor laser system 160.

The conversion formula is expressed by $$f1mt = C/\lambda 1mct$$

where C is light speed.

In step S242, the solid-state laser system control unit 350 converts the target center wavelength λct after wavelength conversion by the wavelength conversion system 300 into a frequency ft.

The conversion formula is expressed by $$ft = C/\lambda ct.$$

In step S243, the solid-state laser system control unit 350 calculates a target frequency f2*mt* of the second multiple semiconductor laser system 260 from Expression (5) of wavelength conversion. The target frequency f2*mt* can be calculated by Expression (7) below.

$$f2mt = (1/2) \cdot ft - 2 \cdot f1mt \qquad (7)$$

In step S244, the solid-state laser system control unit 350 converts the target frequency f2*mt* into the target center wavelength λ2*mct*. The conversion formula is expressed by $$\lambda 2mct = C/f2mt.$$

The calculation is not limited to the procedure described in steps S241 to S244 in FIG. 35, but may be performed using table data or the like that provides similar conversion results.

After step S244, the solid-state laser system control unit 350 finishes the flowchart in FIG. 35 and returns to the flowchart in FIG. 34.

4.7 Example of Processing of First Multiline Control Unit

Figure 36:
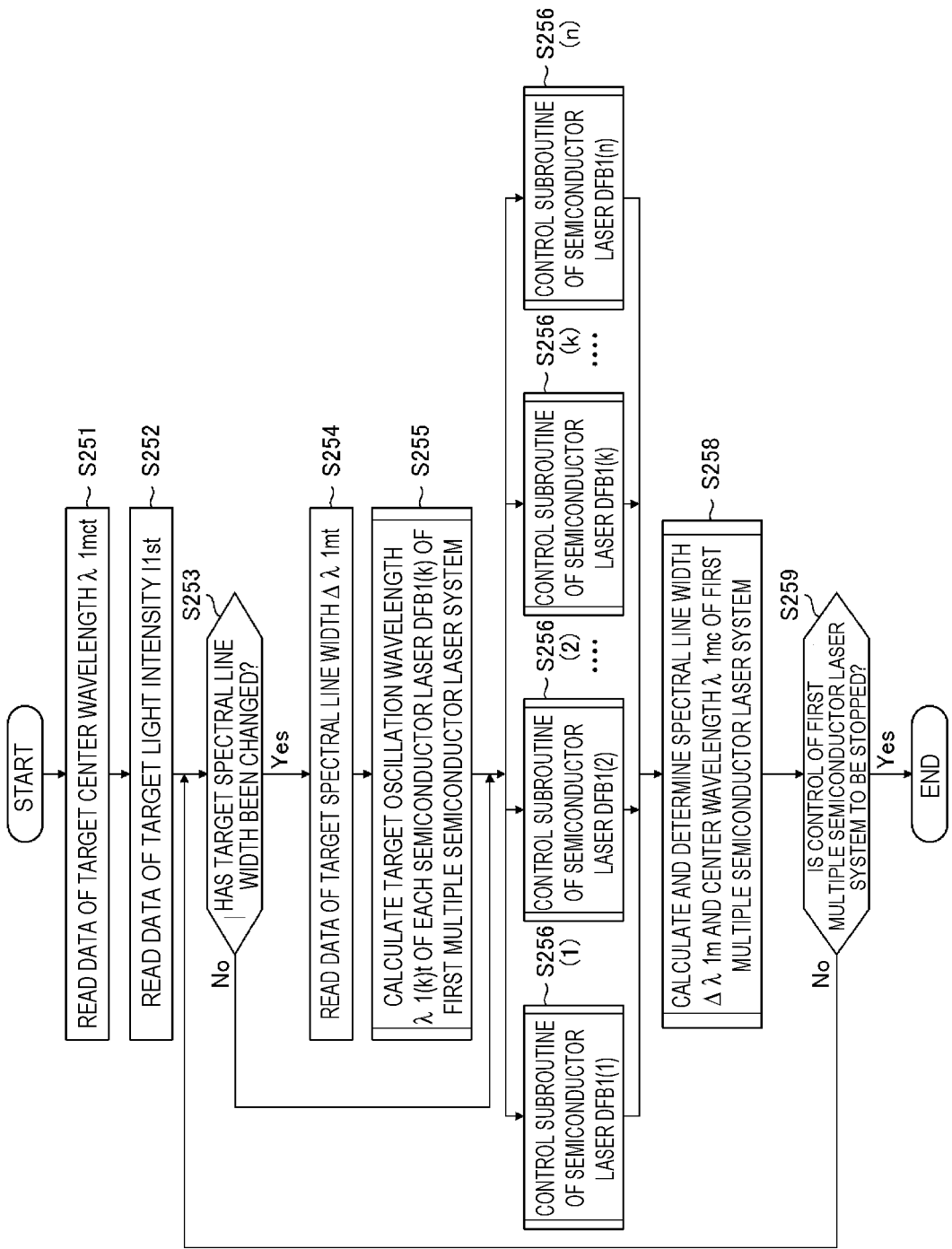
FIG. 36 is a flowchart of an example of processing of a first multiline control unit.

FIG. 36 is a flowchart of an example of processing of the first multiline control unit 168. The processing and the operation in the flowchart in FIG. 36 are realized by, for example, a processor that functions as the first multiline control unit 168 executing a program.

In step S251, the first multiline control unit 168 reads data of the target center wavelength $\lambda 1mct$ of the multiline (first multiline) of the first multiple semiconductor laser system 160. Here, the target center wavelength $\lambda 1mct$ is a fixed value (initial value) $\lambda 1mc0$, which is, for example, 1030 nm.

In step S252, the first multiline control unit 168 reads data of target light intensity $I1st$ of the first multiline. Here, the target light intensity $I1st$ is a fixed value (initial value) $I1s0$.

In step S253, the first multiline control unit 168 determines whether or not the target spectral line width has been changed. When the determination result in step S253 is Yes, the first multiline control unit 168 goes to step S254, and reads data of the target spectral line width $\Delta\lambda 1mt$.

Then, in step S255, the first multiline control unit 168 calculates a target oscillation wavelength $\lambda 1(k)t$ of each semiconductor laser DFB1(k) of the first multiple semiconductor laser system 160 in accordance with the target center wavelength $\lambda 1mct$ and the target spectral line width $\Delta\lambda 1mt$. The letter k represents an index number for identifying each of the semiconductor lasers. The letter k represents an integer equal to or larger than 1 and equal to or smaller than n. The letter n represents the number of semiconductor lasers 161 included in the first multiple semiconductor laser system 160.

In FIG. 36, after step S255, the first multiline control unit 168 goes to step S256(1), step S256(2) . . . step S256(k) . . . step S256(n). Hereinafter, step S256(k) will be descried as a representative of steps S256(1) to S256(n).

In step S256(k), the first multiline control unit 168 performs a control subroutine of the semiconductor laser DFB1(k) such that a wavelength and light intensity of the semiconductor laser DFB1(k) are brought close to a target center wavelength and target light intensity. Steps S256(k) for k of 1, 2 . . . n may be performed in parallel or concurrently. After step S256(k), the first multiline control unit 168 goes to step S258.

In step S258, the first multiline control unit 168 calculates a spectral line width $\Delta\lambda 1m$ and a center wavelength $\lambda 1mc$ of the multiline generated by the first multiple semiconductor laser system 160, and determines whether or not differences from the target values are within allowable ranges.

Then, in step S259, the first multiline control unit 168 determines whether or not to stop control of the first multiple semiconductor laser system 160. When the determination result in step S259 is No, the first multiline control unit 168 returns to step S253 and repeats the processes in steps S253 to S259.

When the determination result in step S259 is Yes, the first multiline control unit 168 finishes the flowchart in FIG. 36.

Figure 37:
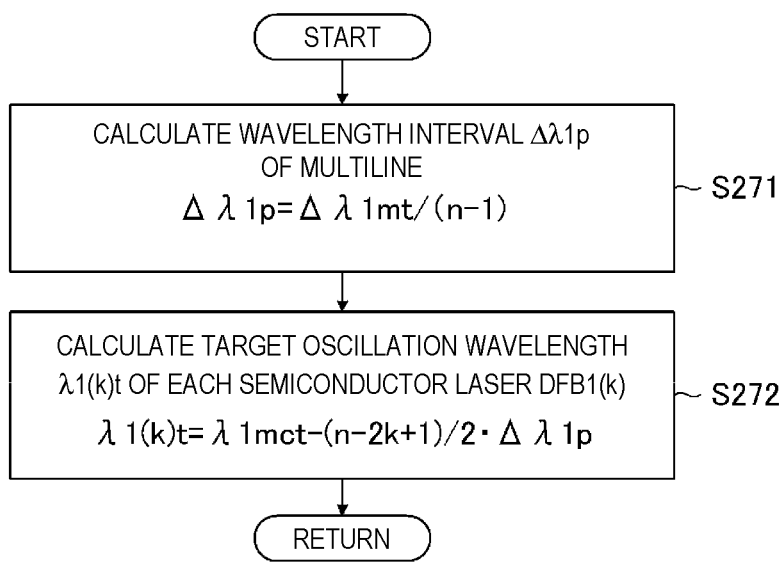
FIG. 37 is a flowchart of an example of processing for calculating a target oscillation wavelength of each semiconductor laser of the first multiple semiconductor laser system.

FIG. 37 is a flowchart of an example of processing for calculating a target oscillation wavelength of each semiconductor laser of the first multiple semiconductor laser system 160. The flowchart in FIG. 37 is applied to step S255 in FIG. 36.

In step S271 in FIG. 37, the first multiline control unit 168 calculates a wavelength interval $\Delta\lambda 1p$ of the multiline from the target spectral line width $\lambda 1mt$. With the number of semiconductor lasers 161 included in the first multiple semiconductor laser system 160 being n, the wavelength interval $\Delta\lambda 1p$ of the multiline can be calculated by Expression (8) below.

$$\Delta\lambda 1p = \Delta\lambda 1mt/(n-1) \quad (8)$$

In step S272, the first multiline control unit 168 calculates a target oscillation wavelength $\lambda 1(k)t$ of each semiconductor laser DFB1(k).

The target oscillation wavelength $\lambda 1(k)t$ can be calculated from the target center wavelength $\lambda 1mct$ and the wavelength interval $\Delta\lambda 1p$ by Expression (9) below.

$$\lambda 1(k)t = \lambda 1mct - \{(n-2k+1)/2\}\cdot\Delta\lambda 1p \quad (9)$$

After step S272, the first multiline control unit 168 finishes the flowchart in FIG. 37 and returns to the flowchart in FIG. 36.

Figure 38:
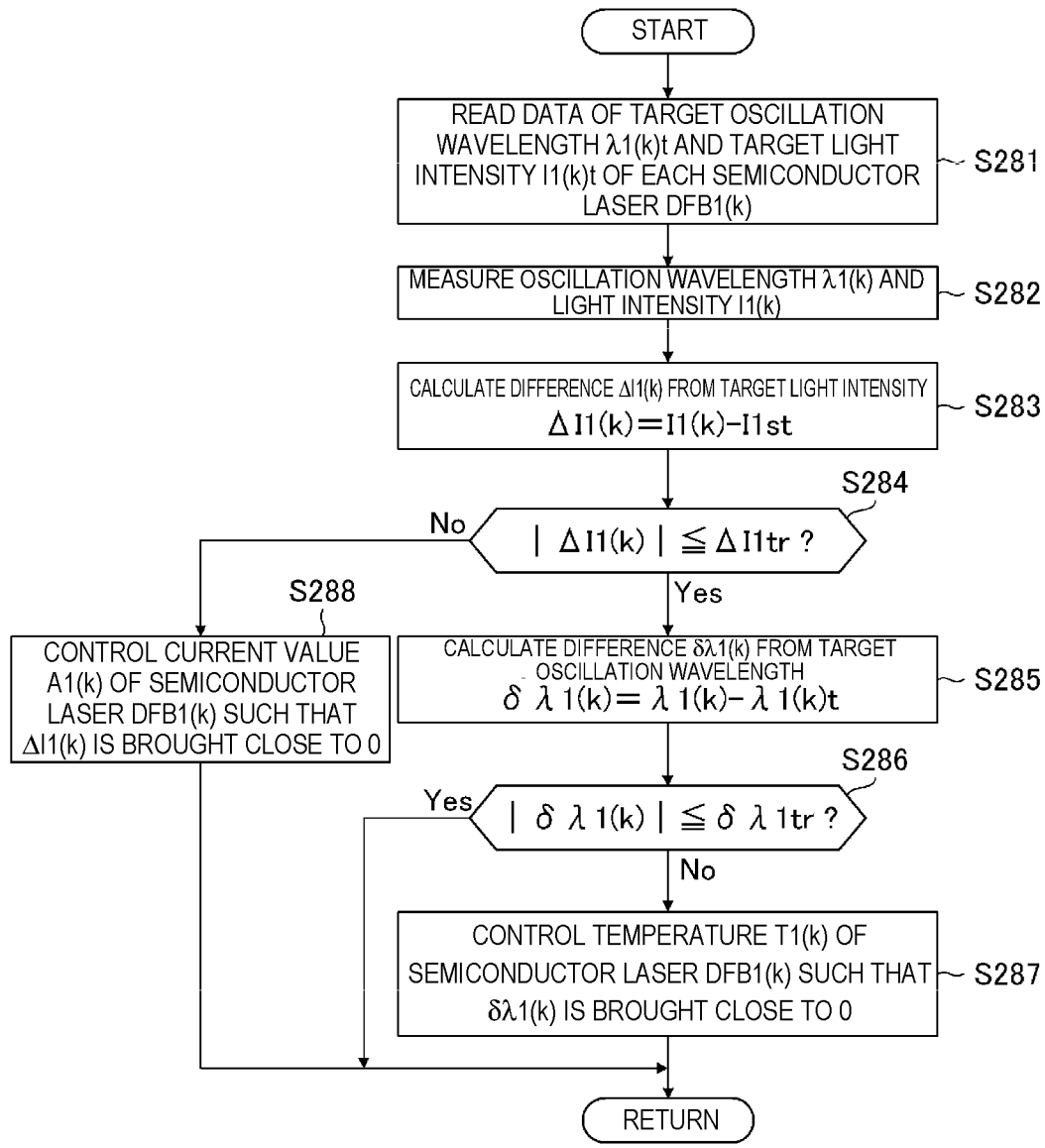
FIG. 38 is a flowchart of an example of a control subroutine of each semiconductor laser DFB1($k$).

FIG. 38 is a flowchart of an example of the control subroutine of each semiconductor laser DFB1(k). The flowchart in FIG. 38 is applied to step S256(k) in FIG. 36.

In step S281 in FIG. 38, the first multiline control unit 168 reads data of the target oscillation wavelength $\lambda 1(k)t$ and target light intensity $I1(k)t$ of each semiconductor laser DFB1(k).

In step S282, the first multiline control unit 168 uses the first spectrum monitor 166 to measure an oscillation wavelength $\lambda 1(k)$ and light intensity $I1(k)$ of the semiconductor laser DFB1(k).

In step S283, the first multiline control unit 168 calculates a difference $\Delta I1(k)$ between the light intensity $I1(k)$ and the target light intensity $I1st$.

In step S284, the first multiline control unit 168 determines whether or not an absolute value of $\Delta I1(k)$ is equal to or smaller than an allowable upper limit value $\Delta I1tr$ which indicates an allowable range. When the determination result in step S284 is Yes, the first multiline control unit 168 goes to step S285, and calculates a difference $\delta\lambda 1(k)$ between the oscillation wavelength $\lambda 1(k)$ and the target oscillation wavelength $\lambda 1(k)t$.

In step S286, the first multiline control unit 168 determines whether or not an absolute value of $\Delta\lambda 1(k)$ is equal to or smaller than an allowable upper limit value $\delta\lambda 1tr$ which indicates an allowable range. When the determination result in step S286 is No, the first multiline control unit 168 goes to step S287.

In step S287, the first multiline control unit 168 controls a temperature $T1(k)$ of the semiconductor laser DFB1(k) such that $\delta\lambda 1(k)$ is brought close to 0. After step S287, the first multiline control unit 168 finishes the flowchart in FIG. 38 and returns to the flowchart in FIG. 36.

When the determination result in step S286 in FIG. 38 is Yes, the first multiline control unit 168 skips step S287, finishes the flowchart in FIG. 38, and returns to the flowchart in FIG. 36.

When the determination result in step S284 in FIG. 38 is No, the first multiline control unit 168 goes to step S288. In step S288, the first multiline control unit 168 controls a current value $A1(k)$ of the semiconductor laser DFB1(k) such that $\Delta I1(k)$ is brought close to 0. After step S288, the first multiline control unit 168 finishes the flowchart in FIG. 38 and returns to the flowchart in FIG. 36.

Figure 39:
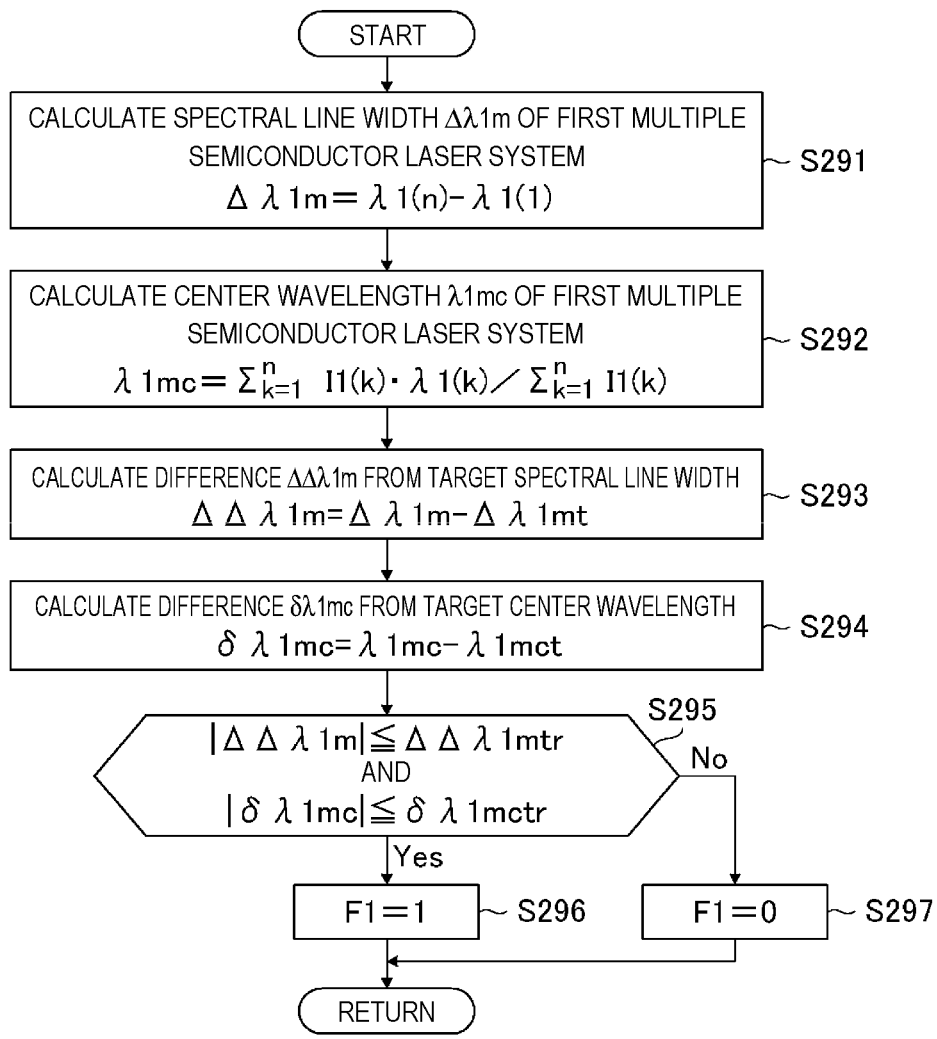
FIG. 39 is a flowchart of an example of processing for calculating and determining a spectral line width $\Delta\lambda 1m$ and a center wavelength $\lambda 1mc$ of the first multiple semiconductor laser system.

FIG. 39 is a flowchart of an example of processing for calculating and determining a spectral line width $\Delta\lambda 1m$ and a center wavelength λ1mc of the first multiple semiconductor laser system 160. The flowchart in FIG. 39 is applied to step S258 in FIG. 36.

In step S291 in FIG. 39, the first multiline control unit 168 calculates a spectral line width Δλ1m of the multiline of the first multiple semiconductor laser system 160 from a spectrum measured by the first spectrum monitor 166. The spectral line width Δλ1m can be obtained by calculating a difference between a minimum wavelength and a maximum wavelength of oscillation wavelengths λ1(1) to λ1(n) of the semiconductor lasers DFB1(1) to DFB1(5).

$$\Delta\lambda 1m = \lambda 1(n) - \lambda 1(1) \quad (10)$$

In step S292, the first multiline control unit 168 calculates a center wavelength λ1mc of the multiline from the spectrum measured by the first spectrum monitor 166. For example, the first multiline control unit 168 calculates a centroid of the measured multiline spectrum as the center wavelength λ1mc. The spectrum centroid is calculated from each oscillation wavelength and light intensity by Expression (11) below.

[Expression 11]

$$\lambda 1mc = \Sigma_{k=1}^{n} I1(k) \cdot \lambda 1(k) / \Sigma_{k=1}^{n} I1(k) \quad (11)$$

Then, in step S293, the first multiline control unit 168 calculates a difference ΔΔλ1m between the spectral line width Δλ1m obtained in step S291 and the target spectral line width Δ1mt of the multiline of the first multiple semiconductor laser system 160.

$$\Delta\Delta\lambda 1m = \Delta\lambda 1m - \Delta\lambda 1mt \quad (12)$$

In step S294, the first multiline control unit 168 calculates a difference δλ1mc between the center wavelength λ1mc obtained in step S292 and the target center wavelength λ1mct of the first multiple semiconductor laser system 160.

Then, in step S295, the first multiline control unit 168 determines whether or not an absolute value of ΔΔλ1m is equal to or smaller than an allowable upper limit value ΔΔλ1mtr which indicates an allowable range and an absolute value of δλ1mc is equal to or smaller than an allowable upper limit value δλ1mctr which indicates an allowable range. When the determination result in step S295 is Yes, the first multiline control unit 168 goes to step S296, and transmits, to the solid-state laser system control unit 350, a flag signal of F1 being 1 indicating that the first multiple semiconductor laser system 160 is in an OK state.

When the determination result in step S295 is No, the first multiline control unit 168 goes to step S297, and transmits, to the solid-state laser system control unit 350, a flag signal of F1 being 0 indicating that the first multiple semiconductor laser system 160 is in an NG state.

After step S296 or S297, the first multiline control unit 168 finishes the flowchart in FIG. 39 and returns to the flowchart in FIG. 36.

4.8 Example of Processing of Second Multiline Control Unit

Figure 40:
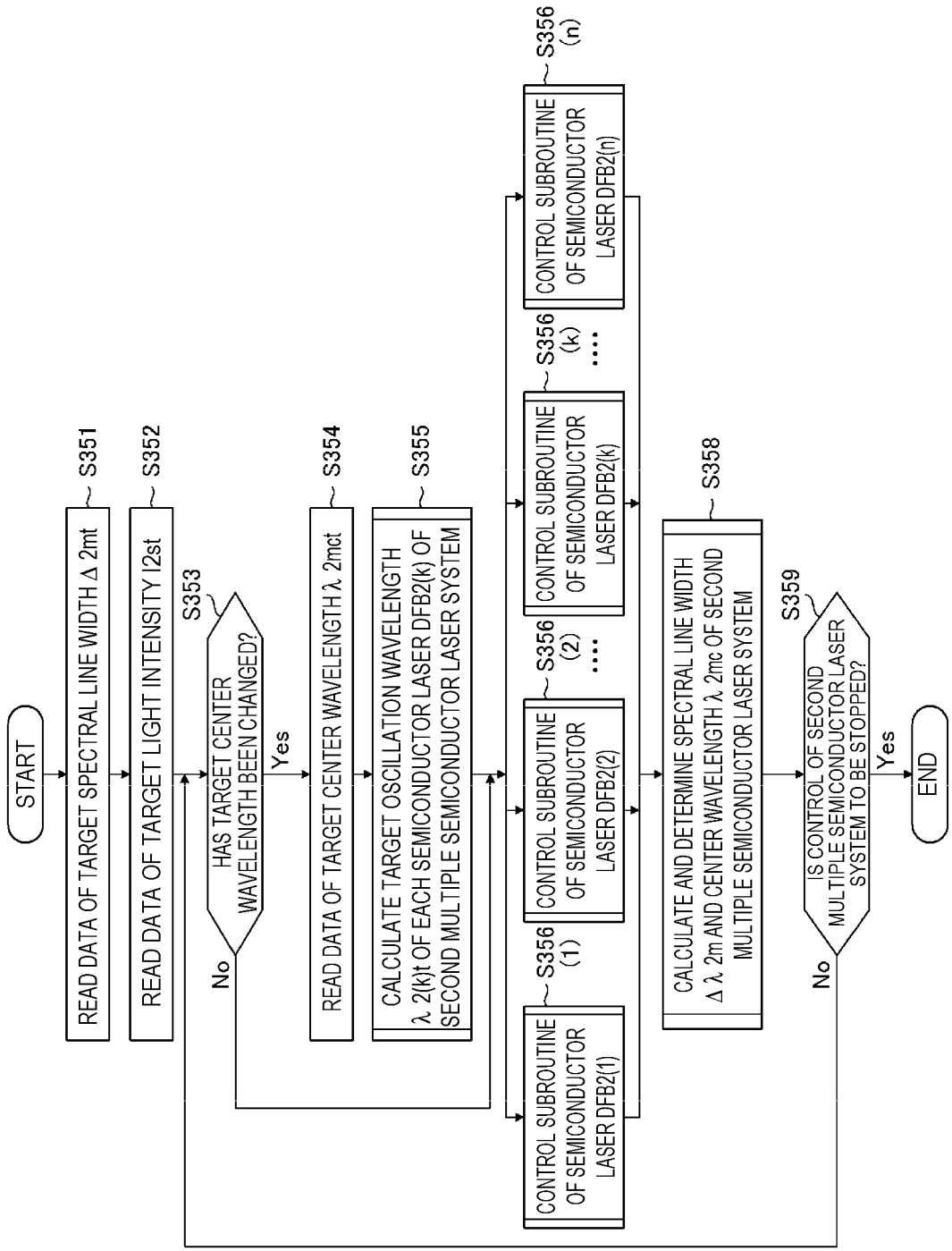
FIG. 40 is a flowchart of an example of processing of a second multiline control unit.

FIG. 40 is a flowchart of an example of processing of the second multiline control unit 268. The processing and the operation in the flowchart in FIG. 40 are realized by, for example, a processor that functions as the second multiline control unit 268 executing a program.

In step S351, the second multiline control unit 268 reads data of the target spectral line width Δλ2mt of the multiline (second multiline) of the second multiple semiconductor laser system 260. Here, the target spectral line width Δλ2mt is a fixed value (initial value) Δλ2m0.

In step S352, the second multiline control unit 268 reads data of target light intensity I2st of the second multiline. Here, the target light intensity I2st is a fixed value (initial value) I2s0.

In step S353, the second multiline control unit 268 determines whether or not the target center wavelength has been changed. When the determination result in step S353 is Yes, the second multiline control unit 268 goes to step S354 and reads data of the target center wavelength λ2mct.

Then, in step S355, the second multiline control unit 268 calculates a target oscillation wavelength λ2(k)t of each semiconductor laser DFB2(k) of the second multiple semiconductor laser system 260 in accordance with the target center wavelength λ2mct. After step S355, the second multiline control unit 268 goes to step S356(1), step S356(2) . . . step S356(k) . . . step S356(n). The letter k represents an integer equal to or larger than 1 and equal to or smaller than n. The letter n represents the number of semiconductor lasers 261 included in the second multiple semiconductor laser system 260. FIG. 20 shows an example of n being 5. Here, the number of semiconductor lasers 161 included in the first multiple semiconductor laser system 160 and the number of semiconductor lasers 261 included in the second multiple semiconductor laser system 260 are the same and five (n is 5), but may be different.

Step S356(k) will be descried as a representative of steps S356(1) to S356(n).

In step S356(k), the second multiline control unit 268 performs a control subroutine of the semiconductor laser DFB2(k) such that a wavelength and light intensity of the semiconductor laser DFB2(k) are brought close to a target oscillation wavelength and target light intensity. Steps S356 (k) for k of 1, 2 . . . n may be performed in parallel or concurrently. After step S356(k), the second multiline control unit 268 goes to step S358.

In step S358, the second multiline control unit 268 calculates a spectral line width Δλ2m and a center wavelength λ2mc of the second multiline generated by the second multiple semiconductor laser system 260, and determines whether or not differences from target values are within allowable ranges.

Then, in step S359, the second multiline control unit 268 determines whether or not to stop control of the second multiple semiconductor laser system 260. When the determination result in step S359 is No, the second multiline control unit 268 returns to step S353 and repeats the processes in steps S353 to S359.

When the determination result in step S359 is Yes, the second multiline control unit 268 finishes the flowchart in FIG. 40.

Figure 41:
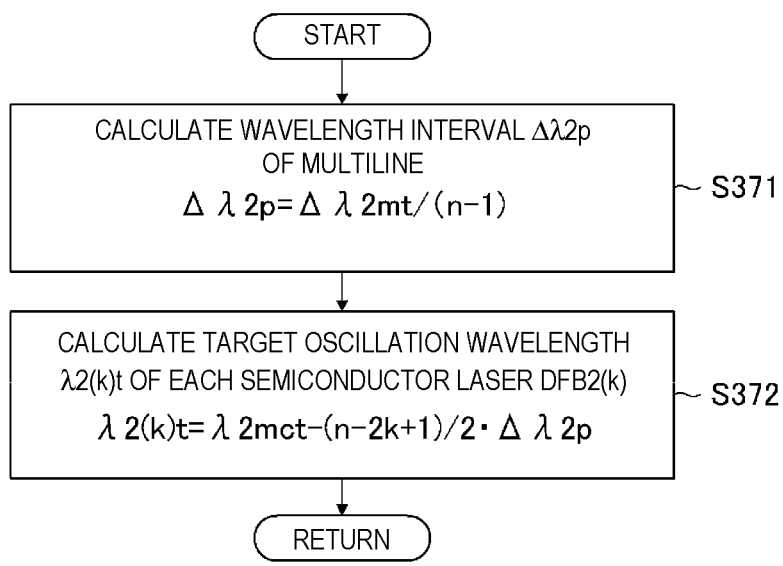
FIG. 41 is a flowchart of an example of processing for calculating a target wavelength of each semiconductor laser of the second multiple semiconductor laser system.

FIG. 41 is a flowchart of an example of processing for calculating a target oscillation wavelength of each semiconductor laser of the second multiple semiconductor laser system 260. The flowchart in FIG. 41 is applied to step S355 in FIG. 40.

In step S371 in FIG. 41, the second multiline control unit 268 calculates a wavelength interval Δλ2p of the multiline from the target spectral line width Δλ2mt. With the number of semiconductor lasers included in the second multiple semiconductor laser system 260 being n, the wavelength interval Δλ2p of the multiline can be calculated by Expression (13) below.

$$\Delta\lambda 2p = \Delta\lambda 2mt/(n-1) \quad (13)$$

In step S372, the second multiline control unit 268 calculates a target oscillation wavelength λ2(k)t of each semiconductor laser DFB2(k).

The target oscillation wavelength $\lambda 2(k)t$ can be calculated from the target center wavelength $\lambda 2mct$ and the wavelength interval $\Delta\lambda 2p$ of the multiline by Expression (14) below.

$$\lambda 2(k)t = \lambda 2mct - \{(n-2k+1)/2\} \cdot \Delta\lambda 2p \quad (14)$$

After step S372, the second multiline control unit 268 finishes the flowchart in FIG. 41 and returns to the flowchart in FIG. 40.

Figure 42:
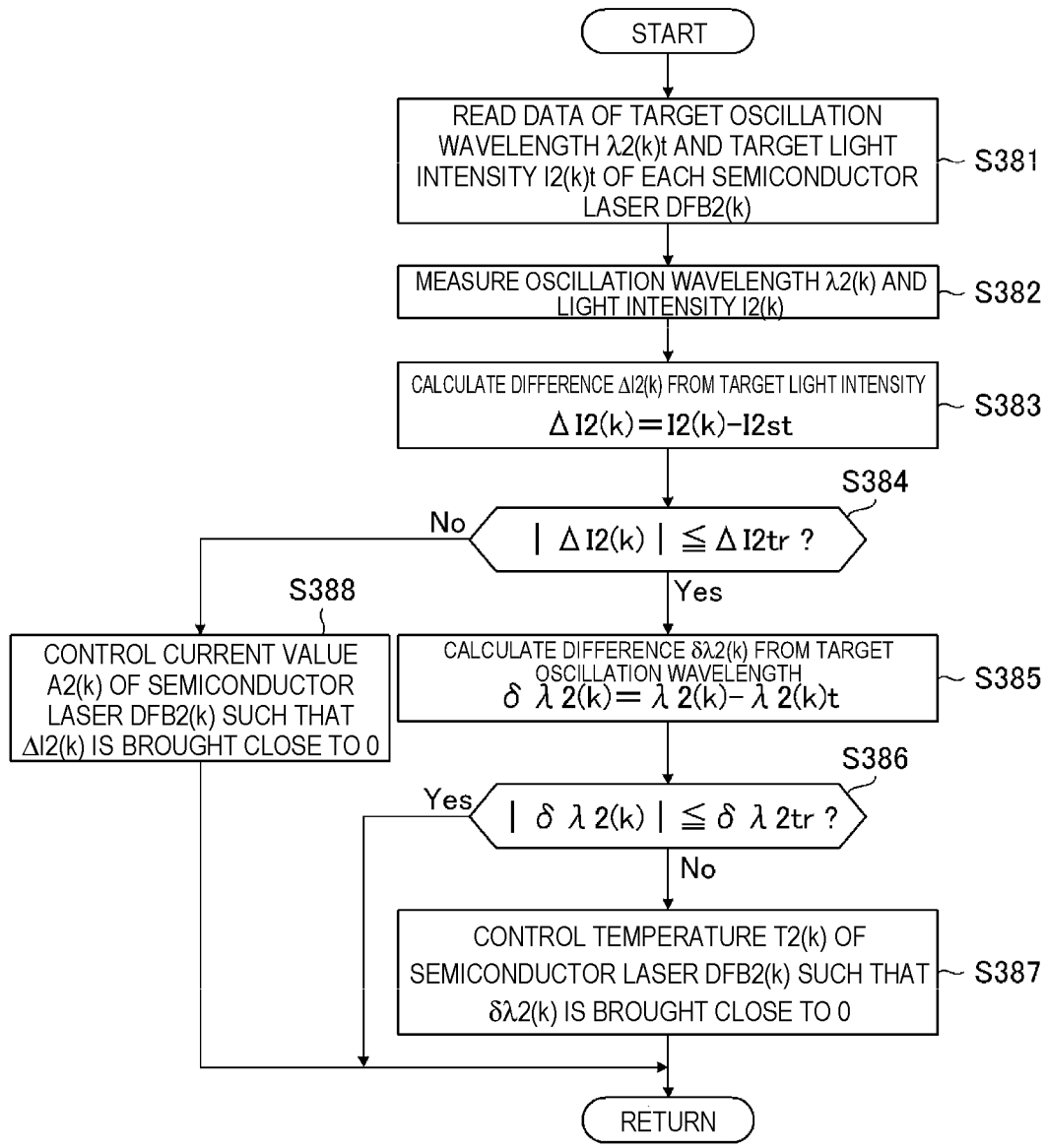
FIG. 42 is a flowchart of an example of a control subroutine of each semiconductor laser DFB2($k$).

FIG. 42 is a flowchart of an example of the control subroutine of each semiconductor laser DFB2($k$). The flowchart in FIG. 42 is applied to step S356($k$) in FIG. 40.

In step S381 in FIG. 42, the second multiline control unit 268 reads data of the target oscillation wavelength $\lambda 2(k)t$ and target light intensity $I2(k)t$ of each semiconductor laser DFB2($k$).

In step S382, the second multiline control unit 268 uses the second spectrum monitor 266 to measure an oscillation wavelength $\lambda 2(k)$ and light intensity $I2(k)$ of the semiconductor laser DFB2($k$).

In step S383, the second multiline control unit 268 calculates a difference $\Delta I2(k)$ between the light intensity $I2(k)$ and the target light intensity $I2st$.

In step S384, the second multiline control unit 268 determines whether or not an absolute value of $\Delta I2(k)$ is equal to or smaller than an allowable upper limit value $\Delta I2tr$ which indicates an allowable range. When the determination result in step S384 is Yes, the second multiline control unit 268 goes to step S385 and calculates a difference $\delta\lambda 2(k)$ between the oscillation wavelength $\lambda 2(k)$ and the target oscillation wavelength $\lambda 2(k)t$.

In step S386, the second multiline control unit 268 determines whether or not an absolute value of $\Delta\lambda 2(k)$ is equal to or smaller than an allowable upper limit value $\delta\lambda 2tr$ which indicates an allowable range. When the determination result in step S386 is No, the second multiline control unit 268 goes to step S387.

In step S387, the second multiline control unit 268 controls a temperature $T1(k)$ of the semiconductor laser DFB2($k$) such that $\delta\lambda 2(k)$ is brought close to 0. After step S387, the second multiline control unit 268 finishes the flowchart in FIG. 42 and returns to the flowchart in FIG. 40.

When the determination result in step S386 in FIG. 42 is Yes, the second multiline control unit 268 skips step S387, finishes the flowchart in FIG. 42, and returns to the flowchart in FIG. 40.

When the determination result in step S384 in FIG. 42 is No, the second multiline control unit 268 goes to step S388. In step S388, the second multiline control unit 268 controls a current value $A2(k)$ of the semiconductor laser DFB2($k$) such that $\Delta I2(k)$ is brought close to 0. After step S388, the second multiline control unit 268 finishes the flowchart in FIG. 42 and returns to the flowchart in FIG. 40.

Figure 43:
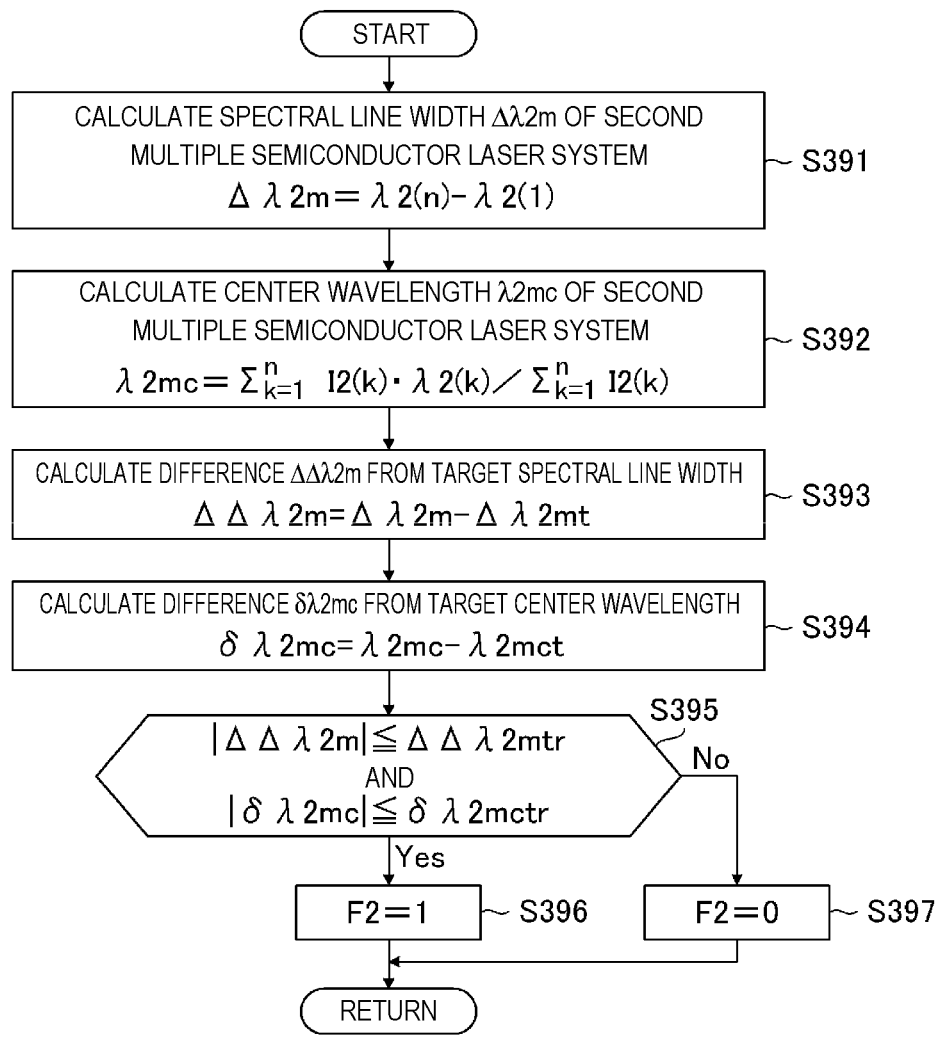
FIG. 43 is a flowchart of an example of processing for calculating and determining a spectral line width $\Delta\lambda 2m$ and a center wavelength $\lambda 2mc$ of the second multiple semiconductor laser system.

FIG. 43 is a flowchart of an example of processing for calculating and determining a spectral line width $\Delta\lambda 2m$ and a center wavelength $\lambda 2mc$ of the multiline of the second multiple semiconductor laser system. The flowchart in FIG. 43 is applied to step S358 in FIG. 40.

In step S391 in FIG. 43, the second multiline control unit 268 calculates a spectral line width $\Delta\lambda 2m$ of the multiline of the second multiple semiconductor laser system 260 from a spectrum measured by the second spectrum monitor 266. The spectral line width $\Delta\lambda 2m$ of the multiline can be obtained by calculating a difference between a minimum wavelength and a maximum wavelength of oscillation wavelengths $\lambda 2(1)$ to $\lambda 2(n)$ of the semiconductor lasers DFB2(1) to DFB2(5).

$$\Delta\lambda 2m = \lambda 2(n) - \lambda 2(1) \quad (15)$$

In step S392, the second multiline control unit 268 calculates a center wavelength $\lambda 2mc$ of the multiline from the spectrum measured by the second spectrum monitor 266. For example, the second multiline control unit 268 calculates a centroid of the measured multiline spectrum as the center wavelength $\lambda 2mc$.

[Expression 16]

$$\lambda 2\ mc = \Sigma_{k=1}^{n} I2(k) \cdot \lambda 2(k) / \Sigma_{k=1}^{n} I2(k) \quad (16)$$

Then, in step S393, the second multiline control unit 268 calculates a difference $\Delta\Delta\lambda 2m$ between the spectral line width $\Delta\lambda 2m$ obtained in step S391 and the target spectral line width $\Delta\lambda 2mt$ of the multiline of the second multiple semiconductor laser system 260.

$$\Delta\Delta\lambda 2m = \Delta\lambda 2m - \Delta\lambda 2mt \quad (17)$$

In step S394, the second multiline control unit 268 calculates a difference $\delta\lambda 2mc$ between the center wavelength $\lambda 2mc$ obtained in step S392 and the target center wavelength $\lambda 2mct$ of the multiline of the second multiple semiconductor laser system 260.

Then, in step S395, the second multiline control unit 268 determines whether or not an absolute value of $\Delta\Delta\lambda 2m$ is equal to or smaller than an allowable upper limit value $\Delta\Delta\lambda 2mtr$ which indicates an allowable range and an absolute value of $\delta\lambda 2mc$ is equal to or smaller than an allowable upper limit value $\delta\lambda 2mctr$ which indicates an allowable range. When the determination result in step S395 is Yes, the second multiline control unit 268 goes to step S396, and transmits, to the solid-state laser system control unit 350, a flag signal of F2 being 1 indicating that the second multiple semiconductor laser system 260 is in an OK state.

When the determination result in step S395 is No, the second multiline control unit 268 goes to step S397, and transmits, to the solid-state laser system control unit 350, a flag signal of F2 being 0 indicating that the second multiple semiconductor laser system is in an NG state.

After step S396 or S397, the second multiline control unit 268 finishes the flowchart in FIG. 43 and returns to the flowchart in FIG. 40.

4.9 Effect

The laser system 1A according to Embodiment 1 provides the following effects.

[1] The oscillation wavelength intervals of the semiconductor lasers of the multiline generated by the semiconductor lasers DFB1(1) to DFB1(5) included in the first multiple semiconductor laser system 160 can be constantly controlled to control the spectral line width of the pulse-amplified excimer laser beam with high accuracy.

[2] The solid-state laser system 10 can constantly control the spectral line width and the center wavelength in accordance with the data of the target center wavelength $\lambda ct$ and the target spectral line width $\Delta\lambda t$ irrespective of whether or not the excimer amplifier 14 generates a pulse laser beam (excimer beam). Thus, the spectral line width and the center wavelength can be controlled with high accuracy irrespective of a laser operation load (repetition frequency) and burst operation of the laser system 1A. Specifically, when receiving the data of the target spectral line width $\Delta\lambda t$, the laser control unit 18 can control the first solid-state laser device 100 before pulse amplification, thereby increasing control speed of the spectral line width.

[3] The oscillation wavelength intervals of the semiconductor lasers of the multiline generated by the semiconductor lasers DFB1(1) to DFB1(5) of the first multiple semiconductor laser system 160 are controlled to suppress SBS in the first fiber amplifier 140. This can suppress damage to the first fiber amplifier 140 and the first multiple semiconductor laser system 160. Similarly, the oscillation wavelength intervals of the semiconductor lasers of the multiline generated by the semiconductor lasers DFB2(1) to DFB2(5) of the second multiple semiconductor laser system 260 are controlled to suppress SBS in the second fiber amplifier 240. This can suppress damage to the second fiber amplifier 240 and the second multiple semiconductor laser system 260.

[4] In Embodiment 1, the target center wavelength λ1$mct$ of the first multiline generated by the first multiple semiconductor laser system 160 is fixed. Thus, there is no need to control an incident angle for phase matching of an LBO crystal 310 and a first CLBO crystal 312 for generating fourth harmonic light in the wavelength conversion system 300.

[5] For significantly changing the target center wavelength λ2$mct$ of the second multiline generated by the second multiple semiconductor laser system 260 according to the change in the target center wavelength λ$ct$, it is only necessary to control an incident angle for phase matching of a second CLBO crystal 316 and a third CLBO crystal 320 that generate a sum frequency in the wavelength conversion system 300.

The laser control unit 18 of the laser system 1A according to Embodiment 1 described above is an example of "control unit" in the present disclosure. The exposure apparatus 20 including the exposure control unit 22 is an example of "external device" in the present disclosure. The LBO crystal 310 and the first CLBO crystal 312 are examples of "first nonlinear crystal" and "second nonlinear crystal" in the present disclosure. The second CLBO crystal 316 is an example of "third nonlinear crystal" in the present disclosure. The third CLBO crystal 320 is an example of "fourth nonlinear crystal" in the present disclosure.

4.10 Variant

As a variant of Embodiment 1, the first multiple semiconductor laser system 160 may have a configuration in which the spectral line width of the multiline is fixed and the center wavelength is variable. The second multiple semiconductor laser system 260 may have a configuration in which the center wavelength of the multiline is fixed and the spectral line width is variable.

4.10.1 Control Example 2 of First Multiple Semiconductor Laser System

Figure 44:
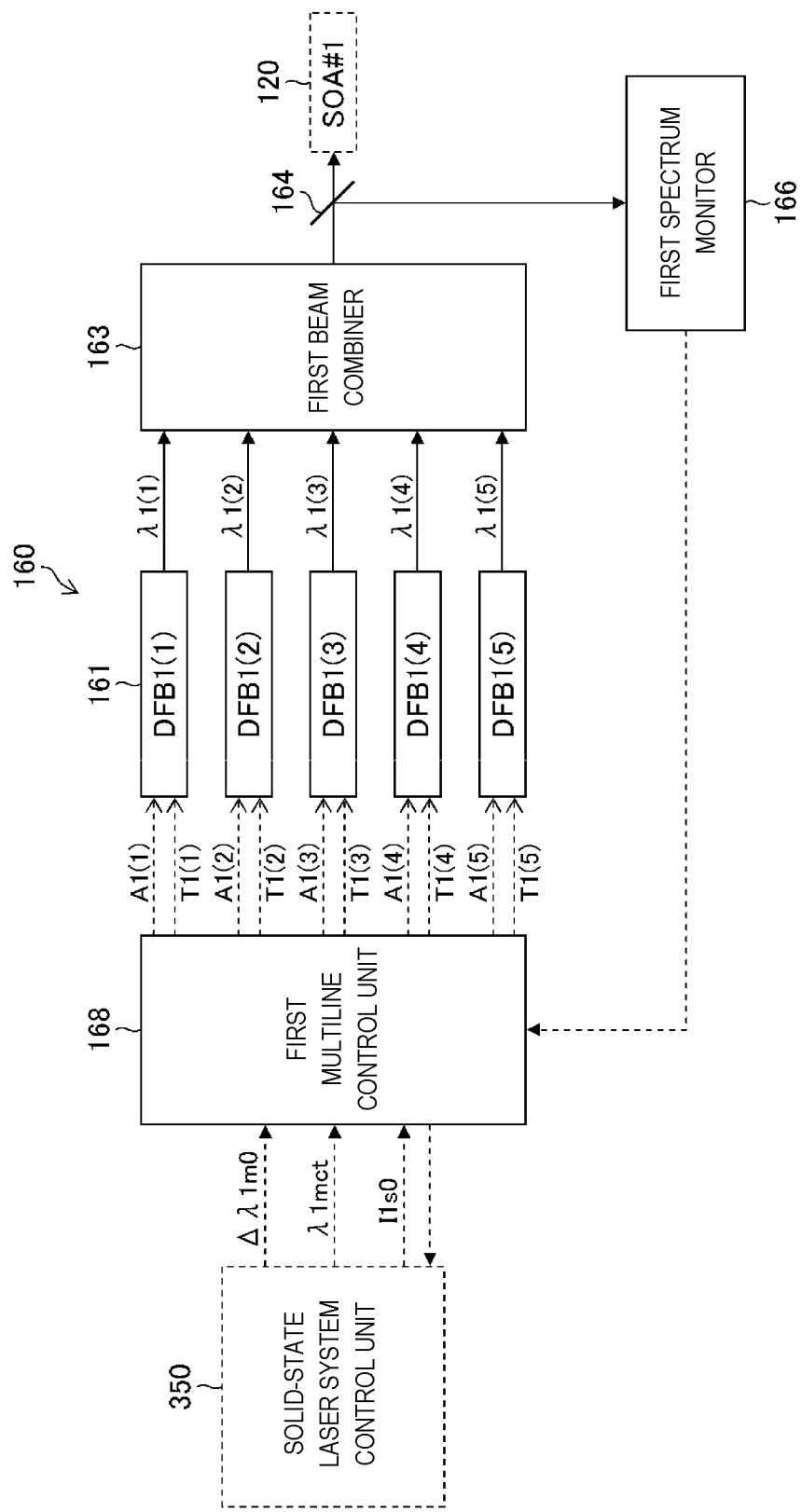
FIG. 44 is a block diagram of Control example 2 of the first multiple semiconductor laser system.

FIG. 44 is a block diagram of Control example 2 of the first multiple semiconductor laser system 160. Here, an example is shown in which the spectral line width Δλ1$mt$ and the light intensity I1$st$ of the first multiline are fixed and control to change the target center wavelength is performed. As shown in FIG. 44, in the first multiple semiconductor laser system 160, a spectral line width Δλ1$m0$ of the first multiline may be fixed at a spectral line width at which SBS is suppressed and a target center wavelength λ1$mct$ may be variable. For example, a variable wavelength range of λ1$mct$ may be 1028.5 nm to 1030.7 nm. In this case, for significantly changing the target center wavelength, it is necessary to rotate the second CLBO crystal 316 and the third CLBO crystal 320 in the wavelength conversion system 300 and also the LBO crystal 310 and the first CLBO crystal 312 for generating fourth harmonic light to suppress a reduction in wavelength conversion efficiency.

The solid-state laser system control unit 350 transmits, to the first multiline control unit 168, data of a target spectral line width Δλ1$mt$ (=Δλ1$m0$), the target center wavelength λ1$mct$, and the target light intensity I1$st$ (=I1$s0$) of the multiline. The first multiline control unit 168 controls the current values A1(1) to A1(5) and the temperatures T1(1) to T1(5) of the semiconductor lasers DFB1(1) to DFB(5).

Figure 45:
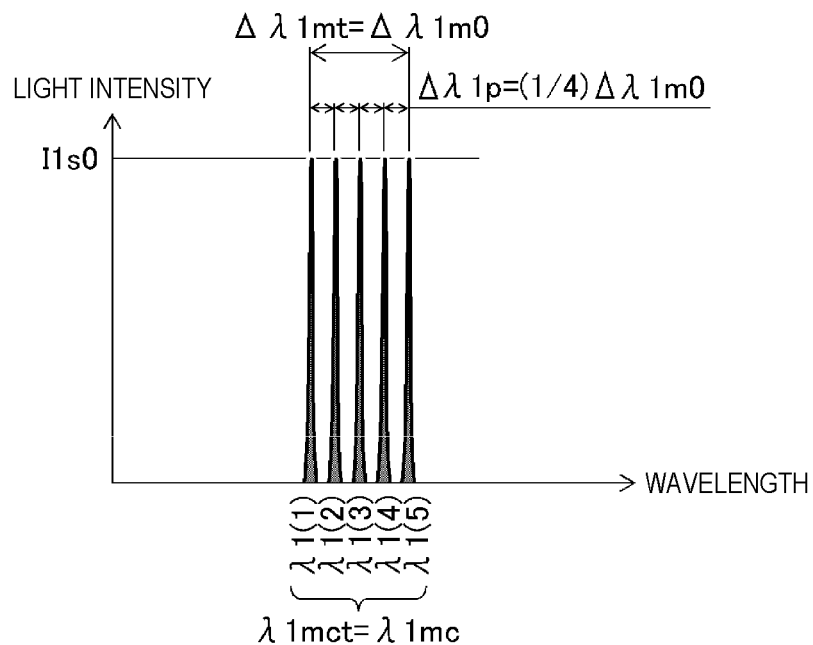
FIG. 45 shows an example of a multiline spectrum detected by a first spectrum monitor in Control example 2 in FIG. 44.

FIG. 45 shows an example of a multiline spectrum detected by the first spectrum monitor 166 in Control example 2 in FIG. 44. Here, an example of multiline is shown obtained when the target center wavelength λ1$mct$ is λ1$mc$ and the target spectral line width Δλ1$mt$ is Δλ1$m0$.

In FIG. 45, the wavelengths of the multiline are λ1(1) to λ1(5) and the center wavelength is λ1$mc$. A wavelength interval Δλ1$p$ of the multiline is generally constant and one fourth of the spectral line width Δλ1$m0$. Further, the lines of the wavelengths λ1(1) to λ1(5) have the same light intensity I1$s0$.

Figure 46:
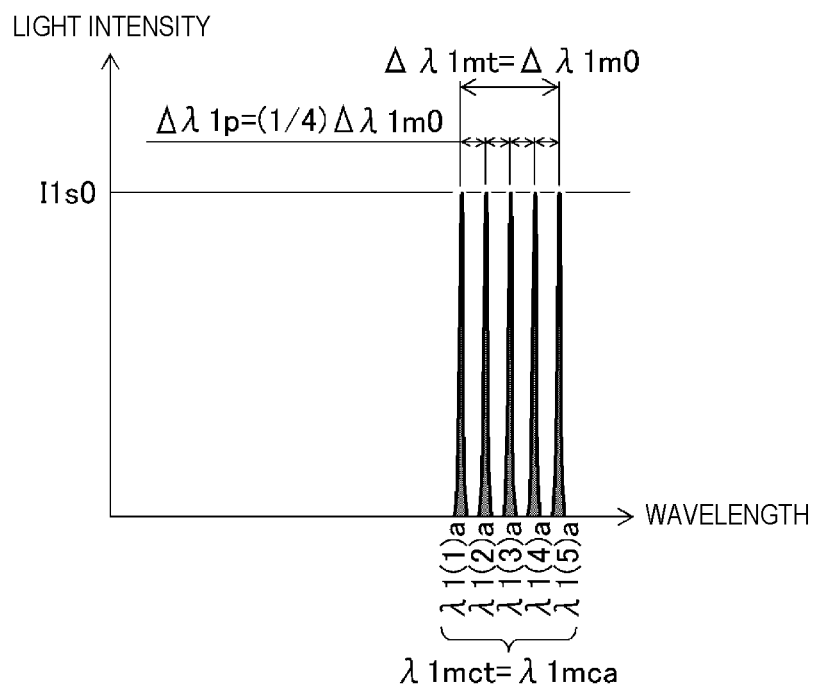
FIG. 46 shows an example of a multiline spectrum obtained when a spectral line width of the multiline is fixed and control to change a center wavelength of the multiline is performed in a spectral shape in FIG. 45.

FIG. 46 shows an example of a multiline spectrum obtained when the spectral line width of the multiline is fixed and control to change the center wavelength of the multiline is performed in a spectral shape in FIG. 45. In FIG. 46, as compared to FIG. 45, the target center wavelength λ1$mct$ of the multiline is changed to λ1$mca$. Thus, the wavelengths of the semiconductor lasers DFB1(1) to DFB1(5) are changed to λ1(1)$a$ to λ1(5)$a$. On the other hand, the target spectral line width Δλ1$mt$ of the multiline is still Δλ1$m0$, and the lines of the multiline have the same light intensity I1$s0$ as in FIG. 45.

4.10.2 Control Example 2 of Second Multiple Semiconductor Laser System

Figure 47:
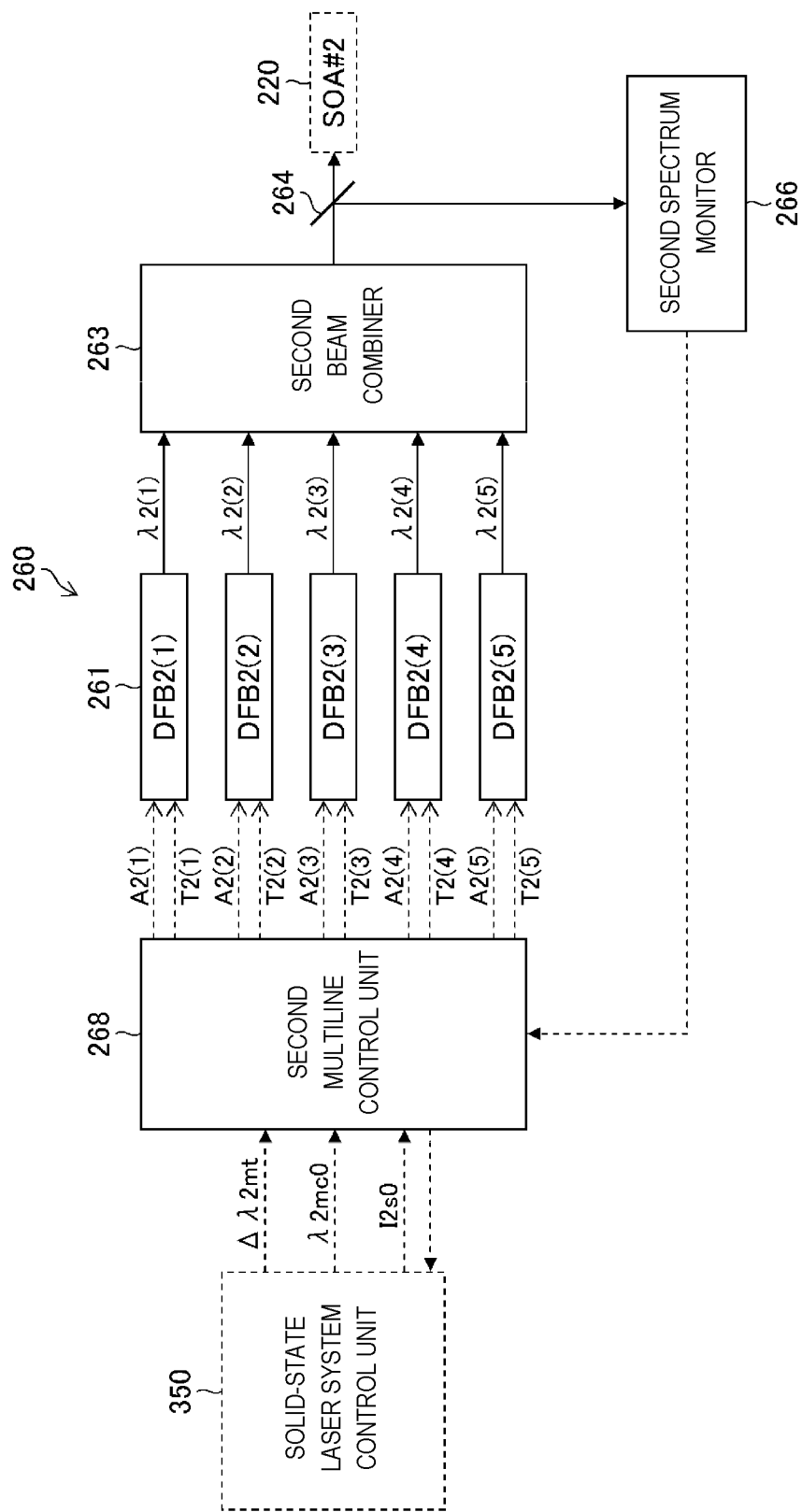
FIG. 47 is a block diagram of Control example 2 of the second multiple semiconductor laser system.

FIG. 47 is a block diagram of Control example 2 of the second multiple semiconductor laser system 260. Here, an example is shown in which the target center wavelength λ2$mct$ and the light intensity I2$st$ of the multiline are fixed and control to change the spectral line width Δλ2$mt$ is performed. In the second multiple semiconductor laser system 260, the center wavelength of the multiline may be fixed at, for example, 1554 nm and the spectral line width Δλ2$mt$ may be variable.

Figure 48:
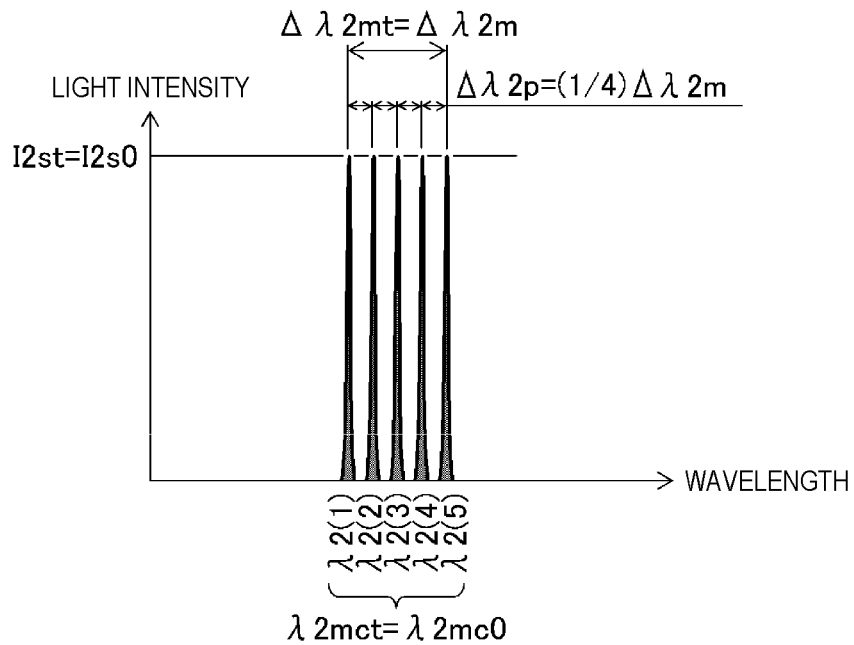
FIG. 48 shows an example of a multiline spectrum detected by a second spectrum monitor in Control example 2 in FIG. 47.

FIG. 48 shows an example of a multiline spectrum detected by the second spectrum monitor 266 in Control example 2 in FIG. 47. Here, an example of multiline is shown obtained when the target center wavelength λ2$mct$ is λ2$mc0$ and the target spectral line width Δλ2$mt$ is Δλ2$m$.

In FIG. 48, the wavelengths of the multiline are λ2(1) to λ2(5) and the center wavelength is λ2$mc0$. A wavelength interval Δλ2$p$ of the multiline is generally constant and one fourth of the spectral line width Δλ2$m$. Further, the lines of the wavelengths λ2(1) to λ2(5) have the same light intensity I2$s0$.

Figure 49:
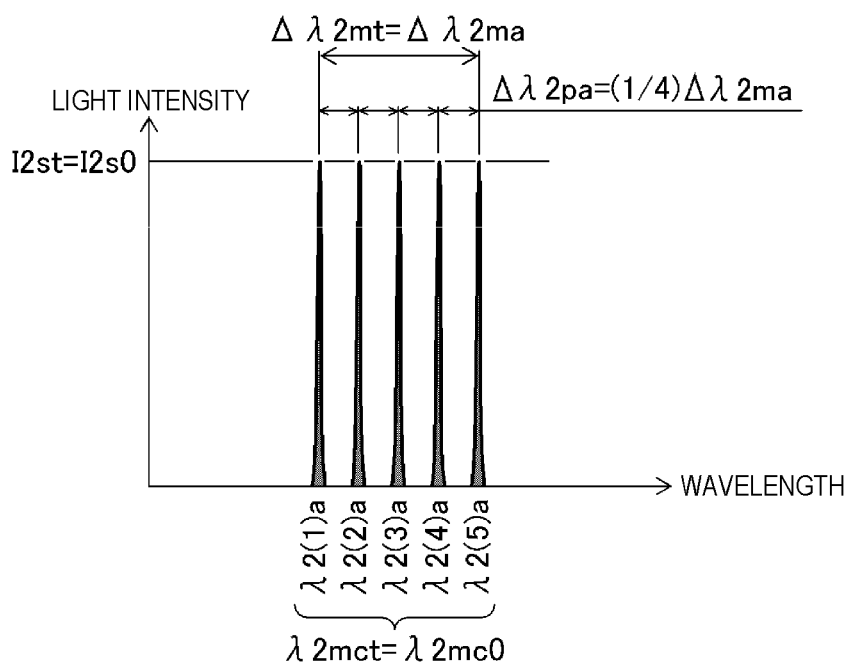
FIG. 49 shows an example of a multiline spectrum obtained when a center wavelength of the multiline is fixed and control to change a spectral line width of the multiline is performed in a spectral shape in FIG. 48.

FIG. 49 shows an example of a multiline spectrum obtained when the center wavelength of the multiline is fixed and control to change the spectral line width of the multiline is performed in a spectral shape in FIG. 48. In FIG. 49, as compared to FIG. 48, the target spectral line width Δλ2$mt$ is changed to Δλ2$ma$. Thus, the wavelengths of the semiconductor lasers DFB2(1) to DFB2(5) are changed to λ2(1)$a$ to λ2(5)$a$.

In FIG. 49, a wavelength interval Δλ2$pa$ of the multiline is generally constant and one fourth of the spectral line width Δλ2$ma$. On the other hand, the center wavelength of the multiline is still λ2$mc0$ as in FIG. 48, and the lines of the wavelengths λ2(1)$a$ to λ2(5)$a$ have the same light intensity I2$s0$ as in FIG. 48.

5. Embodiment 2

5.1 Configuration

A laser system according to Embodiment 2 may have the same configuration as in Embodiment 1 in FIG. 20.

5.2 Operation

One of the first multiple semiconductor laser system 160 and the second multiple semiconductor laser system 260 may perform control to fix the center wavelength and the spectral line width, and the other may perform variable control of the center wavelength and the spectral line width.

For example, in the first multiple semiconductor laser system 160, the center wavelength of the multiline may be fixed at 1030 nm, and the spectral line width may be also fixed at a spectral line width at which SBS is suppressed in the first fiber amplifier 140. In this case, the center wavelength of the laser beam output from the first solid-state laser device 100 is fixed, and thus there is no need to change an incident angle on the LBO crystal 310 and the first CLBO crystal 312 for generating fourth harmonic light.

5.2.1 Control Example 3 of First Multiple Semiconductor Laser System

Figure 50:
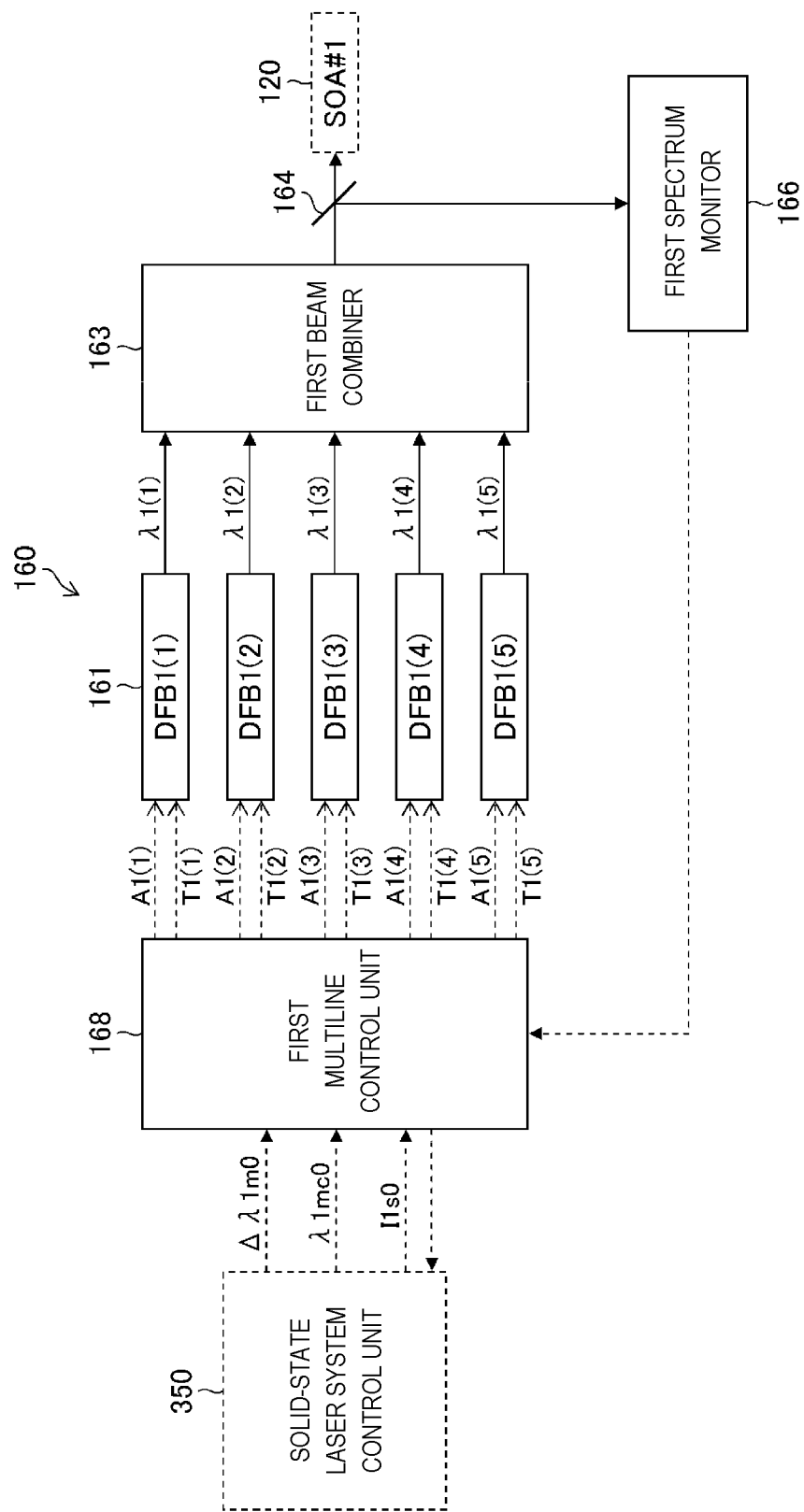
FIG. 50 is a block diagram of Control example 3 of the first multiple semiconductor laser system.

FIG. 50 is a block diagram of Control example 3 of the first multiple semiconductor laser system 160. The solid-state laser system control unit 350 transmits, to the first multiline control unit 168, data of a target spectral line width $\Delta\lambda 1mt$ (=$\Delta\lambda 1m0$), a target center wavelength $\lambda 1mct$ (=$\lambda 1mc0$), and target light intensity I1st (=I1s0) of the multiline. The first multiline control unit 168 controls current values A1(1) to A1(5) and temperatures T1(1) to T1(5) of the semiconductor lasers DFB1(1) to DFB1(5).

Figure 51:
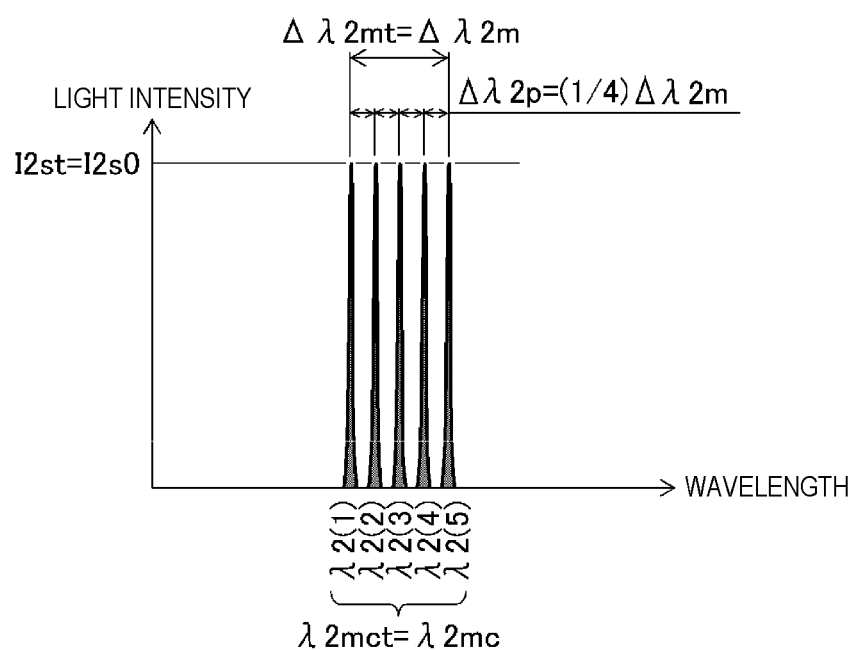
FIG. 51 shows an example of a multiline spectrum detected by the first spectrum monitor.

FIG. 51 shows an example of a multiline spectrum detected by the first spectrum monitor 166. Here, an example of multiline is shown obtained when the target center wavelength $\lambda 1mct$ is $\lambda 1mc0$ and the target spectral line width $\Delta\lambda 1mt$ is $\Delta\lambda 1m0$.

In FIG. 51, wavelengths of the multiline are $\lambda 1(1)$ to $\lambda 1(5)$ and a center wavelength is $\lambda 1mc0$. A wavelength interval $\Delta\lambda 1p$ of the multiline is generally constant and one fourth of the spectral line width $\Delta\lambda 1m0$. Further, the lines of the wavelengths $\lambda 1(1)$ to $\lambda 1(5)$ have the same light intensity I1s0.

5.2.2 Control Example 3 of Second Multiple Semiconductor Laser System

Figure 52:
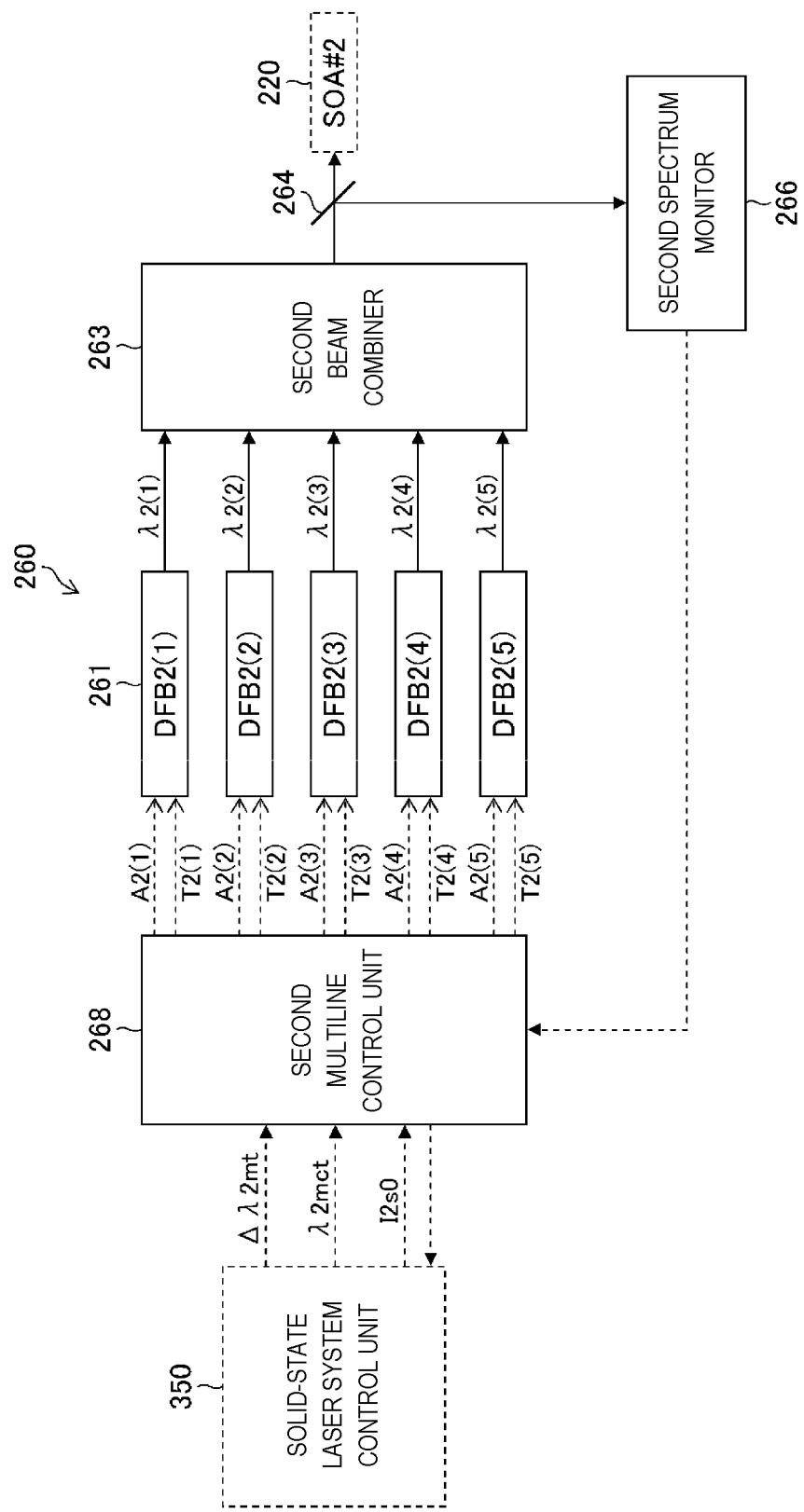
FIG. 52 is a block diagram of Control example 3 of the second multiple semiconductor laser system.

FIG. 52 is a block diagram of Control example 3 of the second multiple semiconductor laser system. In the second multiple semiconductor laser system 260, the center wavelength of the multiline may be variable and the spectral line width may be also variable.

The solid-state laser system control unit 350 transmits, to the second multiline control unit 268, a target spectral line width $\Delta\lambda 2mt$, a target center wavelength $\lambda 2mct$, and target light intensity I2s0 of the multiline. The second multiline control unit 268 controls current values A2(1) to A2(5) and temperatures T2(1) to T2(5) of the semiconductor lasers DFB2(1) to DFB2(5).

Figure 53:
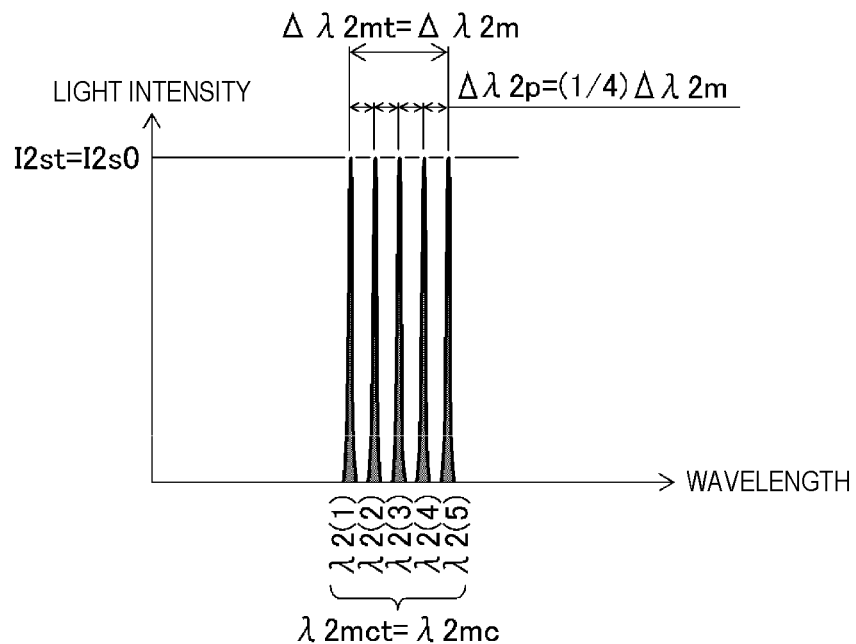
FIG. 53 shows an example of a multiline spectrum detected by the second spectrum monitor in Control example 3 in FIG. 52.

FIG. 53 shows an example of a multiline spectrum detected by the second spectrum monitor 266 in Control example 3 in FIG. 52. Here, an example of multiline is shown obtained when the target center wavelength $\lambda 2mct$ is $\lambda 2mc$ and the target spectral line width $\Delta\lambda 2mt$ is $\Delta\lambda 2m$. In FIG. 53, wavelengths of the multiline are $\lambda 2(1)$ to $\lambda 2(5)$ and a center wavelength is $\lambda 2mc$. A wavelength interval $\Delta\lambda 2p$ of the multiline is generally constant and one fourth of the spectral line width $\Delta\lambda 2m$. Further, the lines of the wavelengths $\lambda 2(1)$ to $\lambda 2(5)$ have the same light intensity I2s0.

Figure 54:
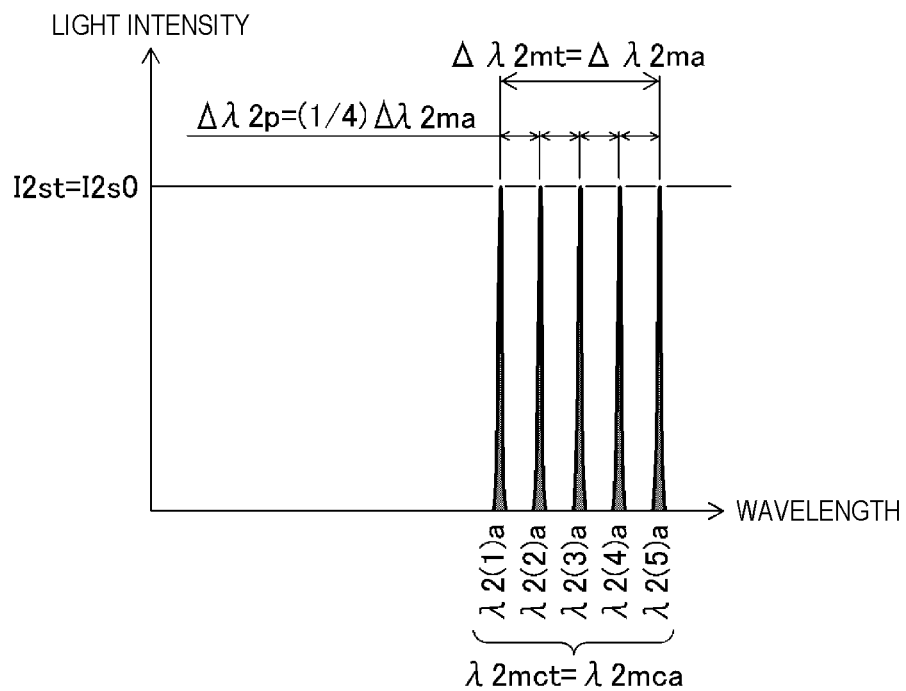
FIG. 54 shows an example of a multiline spectrum when control to change a center wavelength and a spectral line width of the multiline is performed in a spectral shape in FIG. 53.

FIG. 54 shows an example of a multiline spectrum when control to change the center wavelength and the spectral line width of the multiline is performed in a spectral shape in FIG. 53. In FIG. 54, as compared to FIG. 53, the target center wavelength $\lambda 2mct$ of the multiline is changed to $\lambda 2mca$. Further, the target spectral line width $\Delta\lambda 2mt$ is changed to $\Delta\lambda 2ma$.

Thus, the wavelengths of the semiconductor lasers DFB2(1) to DFB2(5) are changed to $\lambda 2(1)a$ to $\lambda 2(5)a$. In FIG. 54, the wavelength interval $\Delta\lambda 2p$ of the multiline is generally constant and one fourth of the spectral line width $\Delta\lambda 2ma$. The lines of the wavelengths $\lambda 2(1)a$ to $\lambda 2(5)a$ of the multiline have the same light intensity I2s0 as in FIG. 53.

5.3 Effect

Embodiment 2 provides the same effects as Embodiment 1. Also, the first multiple semiconductor laser system 160 does not need to perform the variable control of the center wavelength and the spectral line width, thereby simplifying the wavelength conversion control by the wavelength conversion system 300.

The second multiple semiconductor laser system 260 in Embodiment 2 is an example of "first multiple semiconductor laser system" in the present disclosure. The second solid-state laser device 200 in Embodiment 2 is an example of "first solid-state laser device" in the present disclosure.

5.4 Variant

As a variant of Embodiment 2, in the second multiple semiconductor laser system 260, for example, the center wavelength of the multiline may be fixed at 1554 nm and the spectral line width may be also fixed at a spectral line width at which SBS is suppressed in the second fiber amplifier 240. In the first multiple semiconductor laser system 160, the center wavelength of the multiline may be variable and the spectral line width may be variable.

In a configuration with such a combination, for significantly changing the center wavelength of the first multiple semiconductor laser system 160, it is necessary to rotate the second CLBO crystal 316 and the third CLBO crystal 320 in the wavelength conversion system 300 and also the LBO crystal 310 and the first CLBO crystal 312 for generating fourth harmonic light to suppress a reduction in wavelength conversion efficiency.

5.4.1 Control Example 4 of First Multiple Semiconductor Laser System

Figure 55:
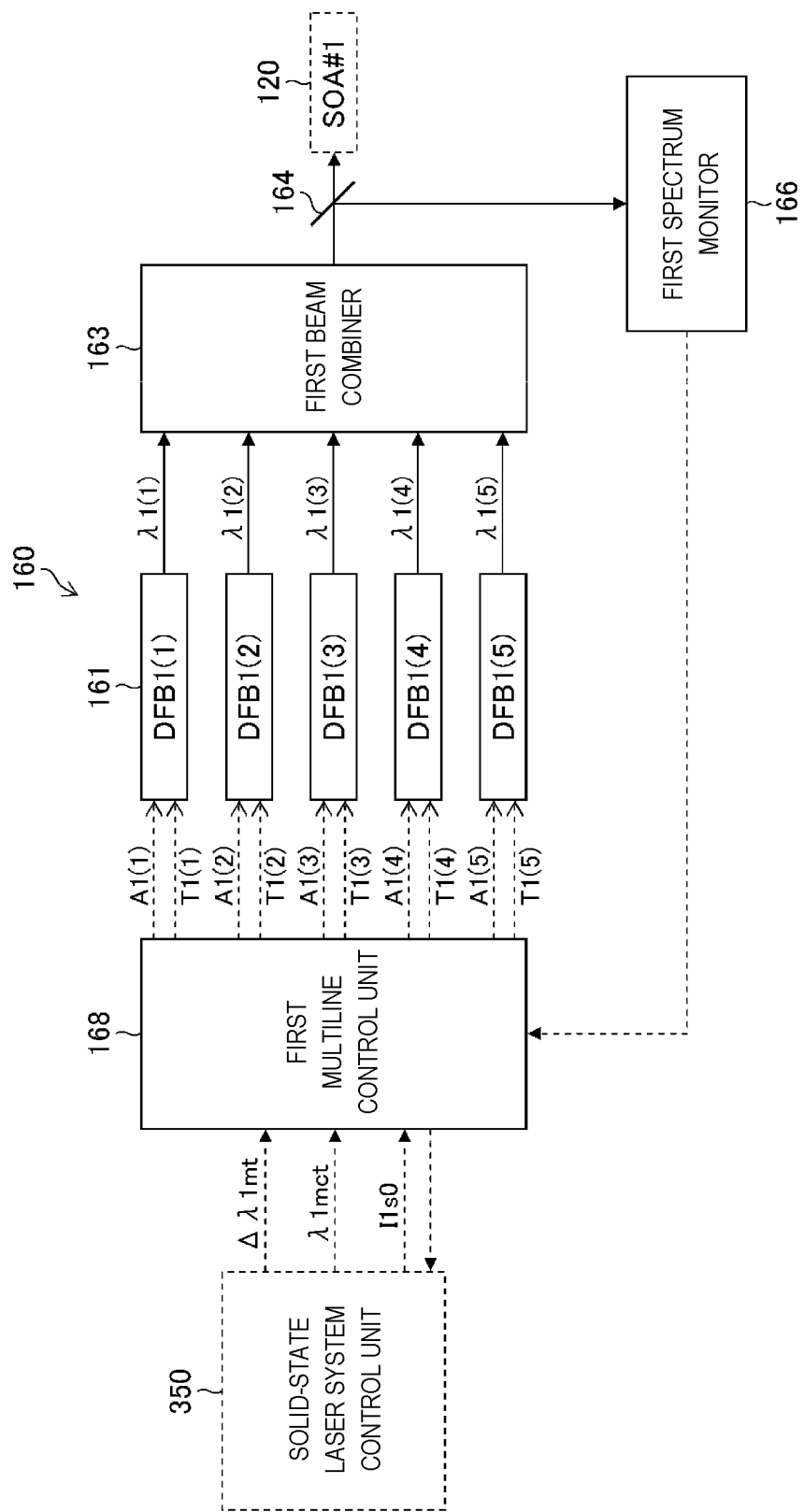
FIG. 55 is a block diagram of Control example 4 of the first multiple semiconductor laser system.

FIG. 55 is a block diagram of Control example 4 of the first multiple semiconductor laser system 160. The solid-state laser system control unit 350 transmits, to the first multiline control unit 168, data of the target spectral line width $\Delta\lambda 1mt$, the target center wavelength $\lambda 1mct$, and the target light intensity list (=I1s0) of the multiline. The first multiline control unit 168 controls the current values A1(1) to A1(5) and the temperatures T1(1) to T1(5) of the semiconductor lasers DFB1(1) to DFB1(5).

Figure 56:
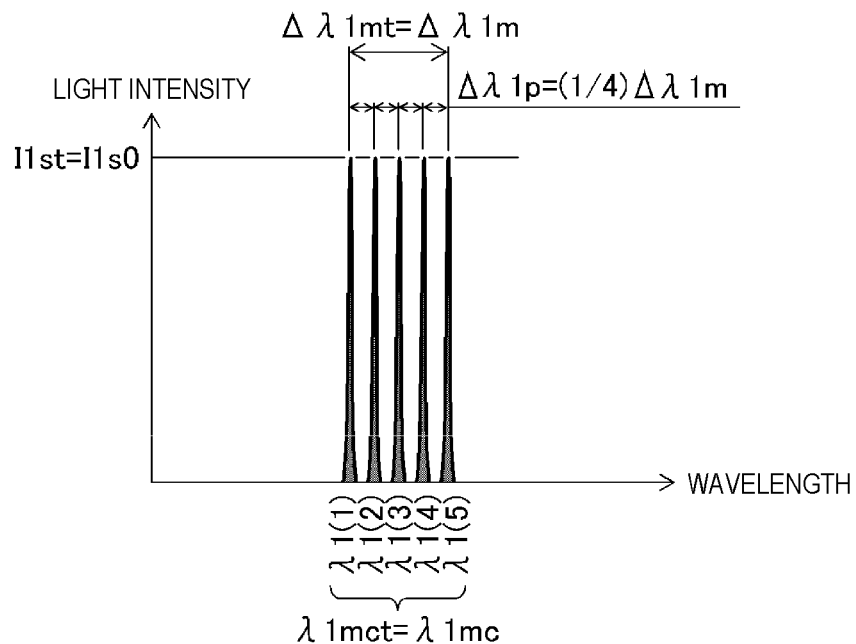
FIG. 56 shows an example of a multiline spectrum detected by the first spectrum monitor in Control example 4 in FIG. 55.

FIG. 56 shows an example of a multiline spectrum detected by the first spectrum monitor 166 in Control example 4 in FIG. 56. Here, an example of multiline is shown obtained when the target center wavelength $\lambda 1mct$ is $\lambda 1mc$ and the target spectral line width $\Delta\lambda 1mt$ is $\Delta\lambda 1m$. In FIG. 56, the wavelength interval $\Delta\lambda 1p$ of the multiline is generally constant and one fourth of the spectral line width $\Delta\lambda 1m$. Further, the lines of the wavelengths $\lambda 1(1)$ to $\lambda 1(5)$ have the same light intensity I1s0.

Figure 57:
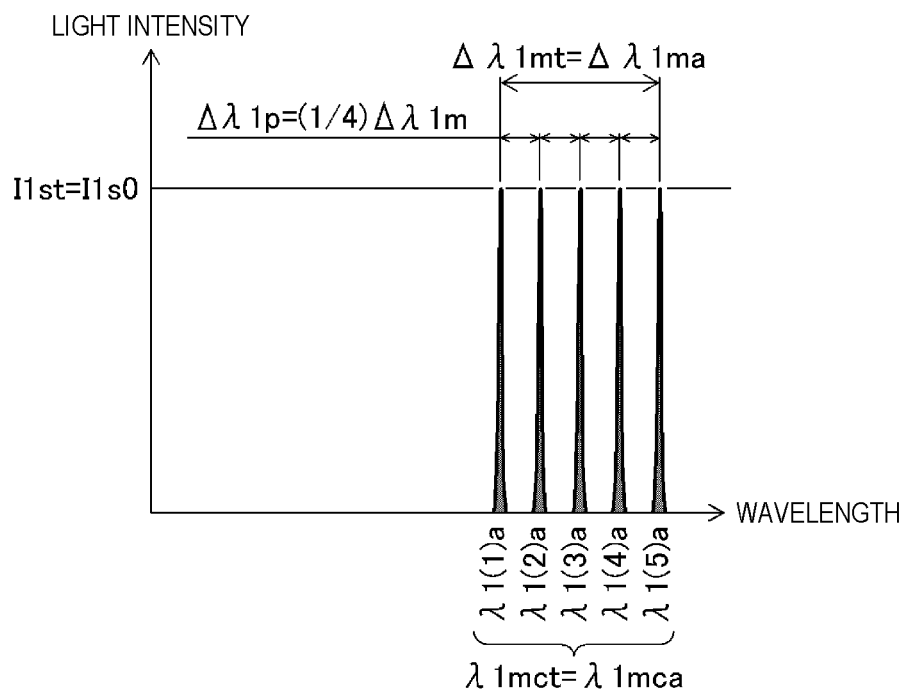
FIG. 57 shows an example of a multiline spectrum when control to change a center wavelength and a spectral line width of the multiline is performed in a spectral shape in FIG. 56.

FIG. 57 shows an example of a multiline spectrum when control to change the center wavelength and the spectral line width of the multiline is performed in a spectral shape in FIG. 56. In FIG. 57, as compared to FIG. 56, the target center wavelength λ1mct of the multiline is changed to λ1mca. Further, the target spectral line width Δλ1mt is changed to Δλ1ma.

Thus, the wavelengths of the semiconductor lasers DFB1(1) to DFB1(5) are changed to λ1(1)a to λ1(5)a. In FIG. 57, the wavelength interval Δλ1p of the multiline is generally constant and one fourth of the spectral line width Δλ1ma. The lines of the wavelengths λ1(1)a to λ1(5)a of the multiline have the same light intensity I1s0 as in FIG. 56.

5.4.2 Control Example 4 of Second Multiple Semiconductor Laser System

Figure 58:
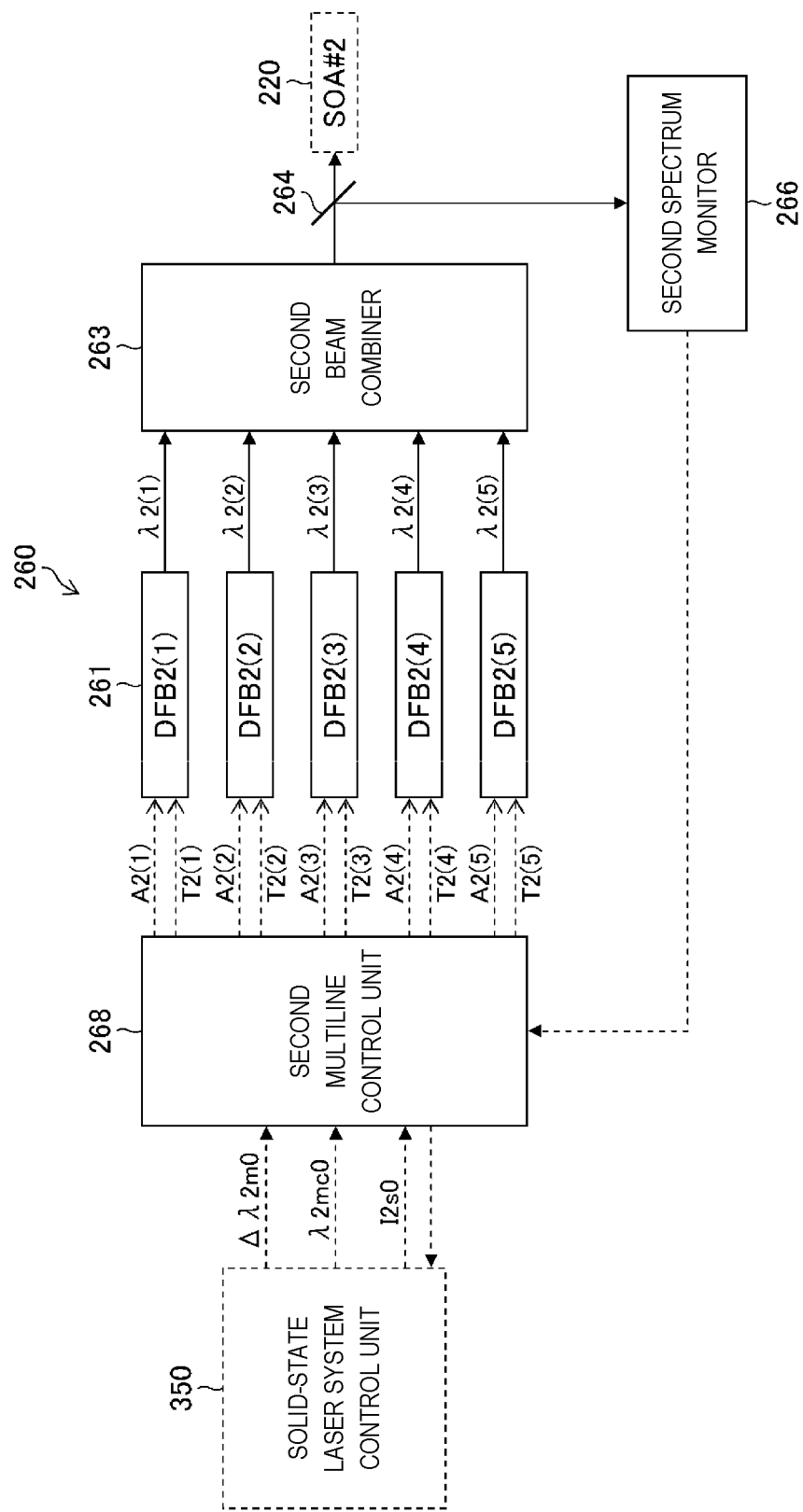
FIG. 58 is a block diagram of Control example 4 of the second multiple semiconductor laser system.

FIG. 58 is a block diagram of Control example 4 of the second multiple semiconductor laser system. In the second multiple semiconductor laser system 260, the center wavelength and the spectral line width of the multiline may be fixed.

The solid-state laser system control unit 350 transmits, to the second multiline control unit 268, data of the target spectral line width Δλ2mt (=Δλ2m0), the target center wavelength λ2mct (=λ2mc0), and the target light intensity I2st (=I2s0) of the multiline. The second multiline control unit 268 controls the current values A2(1) to A2(5) and the temperatures T2(1) to T2(5) of the semiconductor lasers DFB2(1) to DFB2(5).

Figure 59:
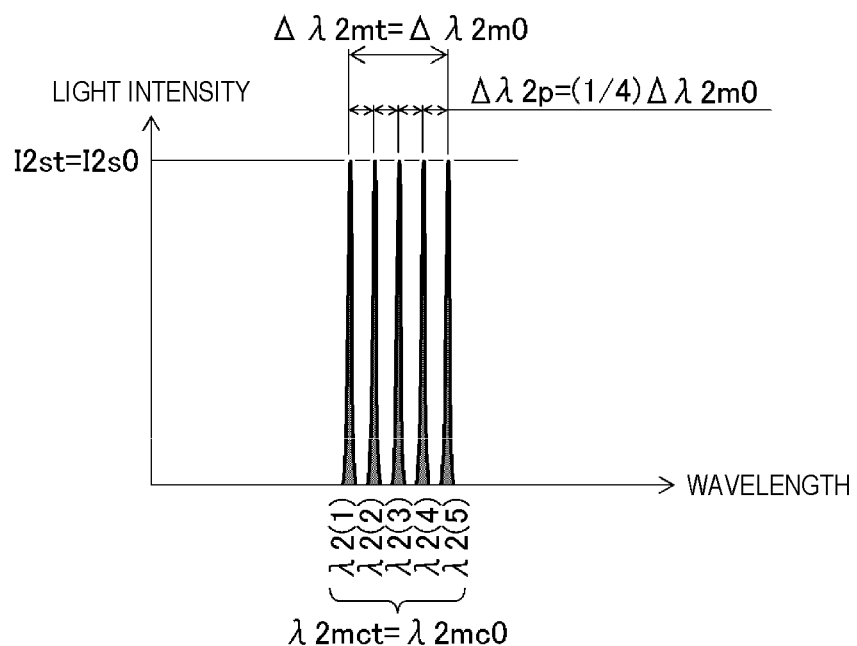
FIG. 59 shows an example of a multiline spectrum detected by the second spectrum monitor in Control example 4 in FIG. 58.

FIG. 59 shows an example of a multiline spectrum detected by the second spectrum monitor 266 in Control example 4 in FIG. 58. Here, an example of multiline is shown obtained when the target center wavelength λ2mct is λ2mc0 and the target spectral line width Δλ2mt is Δλ2m0.

In FIG. 59, the wavelengths of the multiline are λ2(1) to λ2(5) and the center wavelength is λ2mc0. The wavelength interval Δλ2p of the multiline is generally constant and one fourth of the spectral line width Δλ2m0. Further, the lines of the wavelengths λ2(1) to λ2(5) have the same light intensity I2s0.

6. Variant 1 of Multiple Semiconductor Laser System 6.1 Configuration

Figure 60:
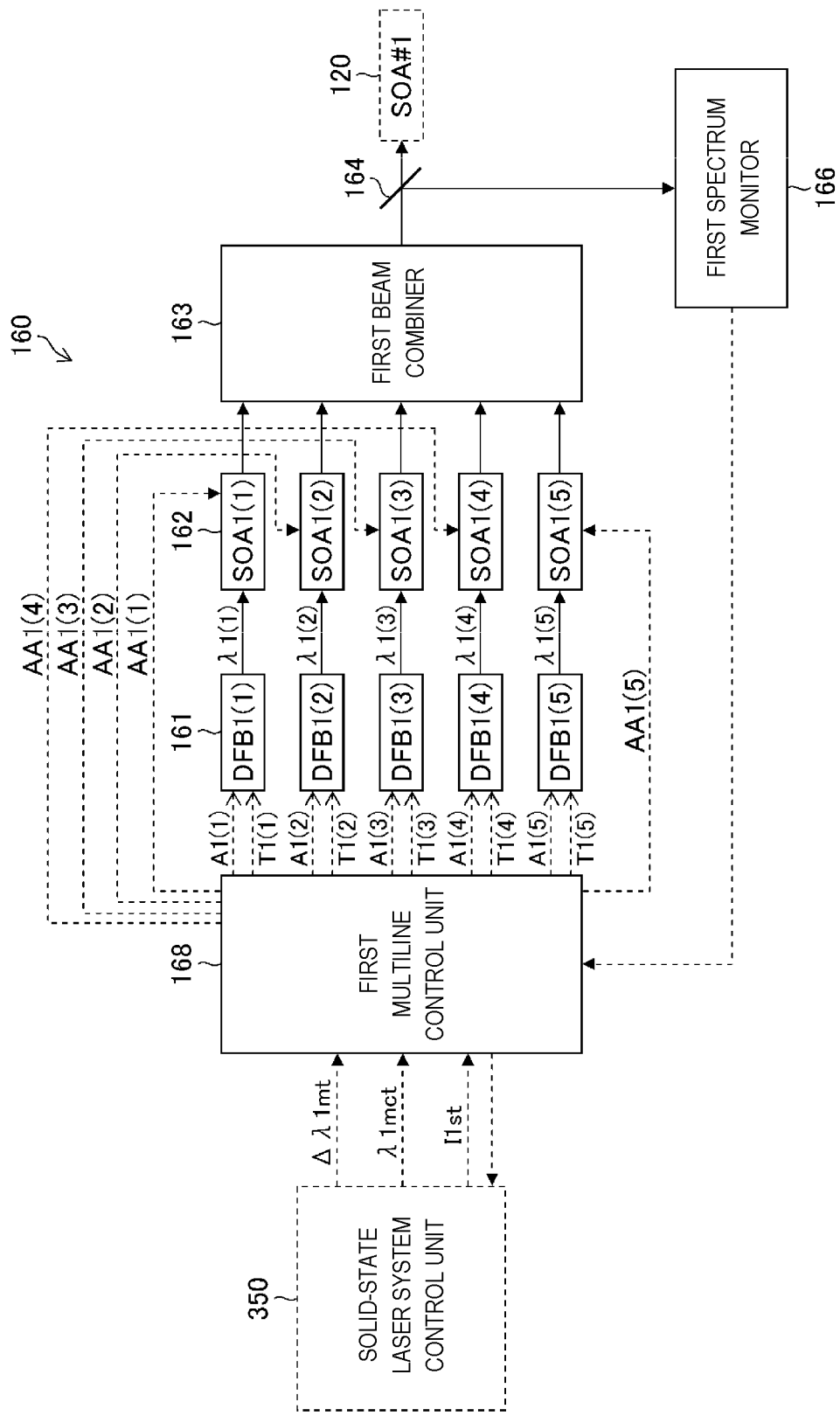
FIG. 60 is a block diagram of Variant 1 of the multiple semiconductor laser system.

FIG. 60 is a block diagram of Variant 1 of the multiple semiconductor laser system. FIG. 60 shows an example of the first multiple semiconductor laser system 160, but the second multiple semiconductor laser system 260 may have the same configuration as in FIG. 60.

Differences between the configurations in FIG. 60 and FIG. 25 will be described. In the first multiple semiconductor laser system 160 in FIG. 60, a semiconductor optical amplifier 162 is arranged in an optical path of a laser beam between each semiconductor laser DFB1(k) and the first beam combiner 163. A value of current AA1(k) passed through each semiconductor optical amplifier SOA1(k) can be controlled to control light intensity of each wavelength λ1(k) at high speed with high accuracy.

6.2 Operation

In FIG. 60, the solid-state laser system control unit 350 transmits, to the first multiline control unit 168, data of the target spectral line width Δλ1mt, the target center wavelength λ1mct, and the target light intensity I1st of the multiline. The first multiline control unit 168 controls the current values A1(1) to A1(5) and the temperatures T1(1) to T1(5) of the semiconductor lasers DFB1(1) to DFB1(5). The first multiline control unit 168 also controls current values AA1(1) to AA1(5) of semiconductor optical amplifiers SOA1(1) to SOA1(5).

Figure 61:
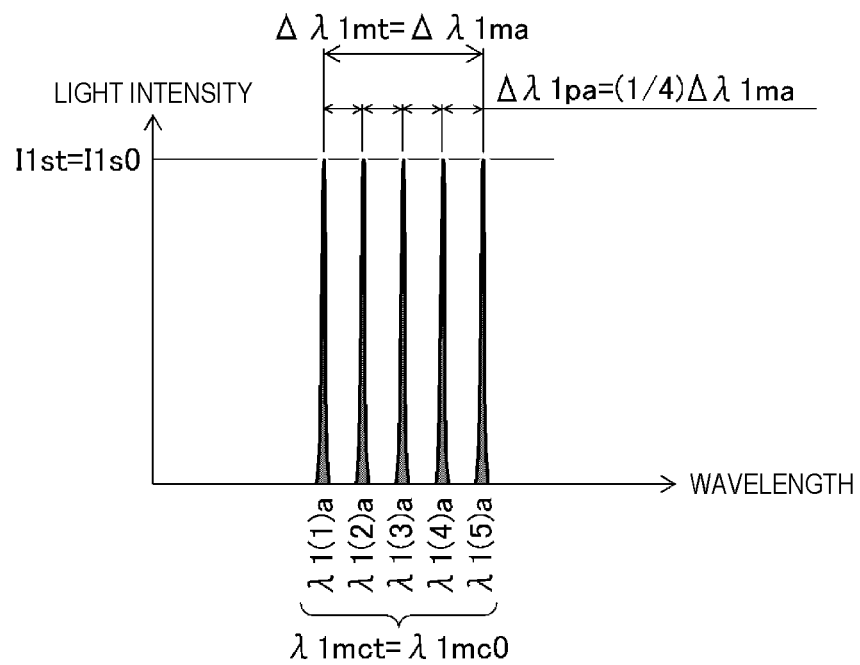
FIG. 61 shows an example of a multiline spectrum detected by the first spectrum monitor in a control example of a configuration in FIG. 60.

FIG. 61 shows an example of a multiline spectrum detected by the first spectrum monitor 166 in a control example of the configuration in FIG. 60. Here, an example is shown in which control is performed such that the lines of the multiline have the same light intensity. As shown in FIG. 61, the current values A1(1) to A1(5) and the temperatures T1(1) to T1(5) of the semiconductor lasers DFB1(1) to DFB1(5) and the current values AA1(1) to AA1(5) of the semiconductor optical amplifiers SOA1(1) to SOA1(5) may be controlled such that the lines of the multiline have the same light intensity.

Figure 62:
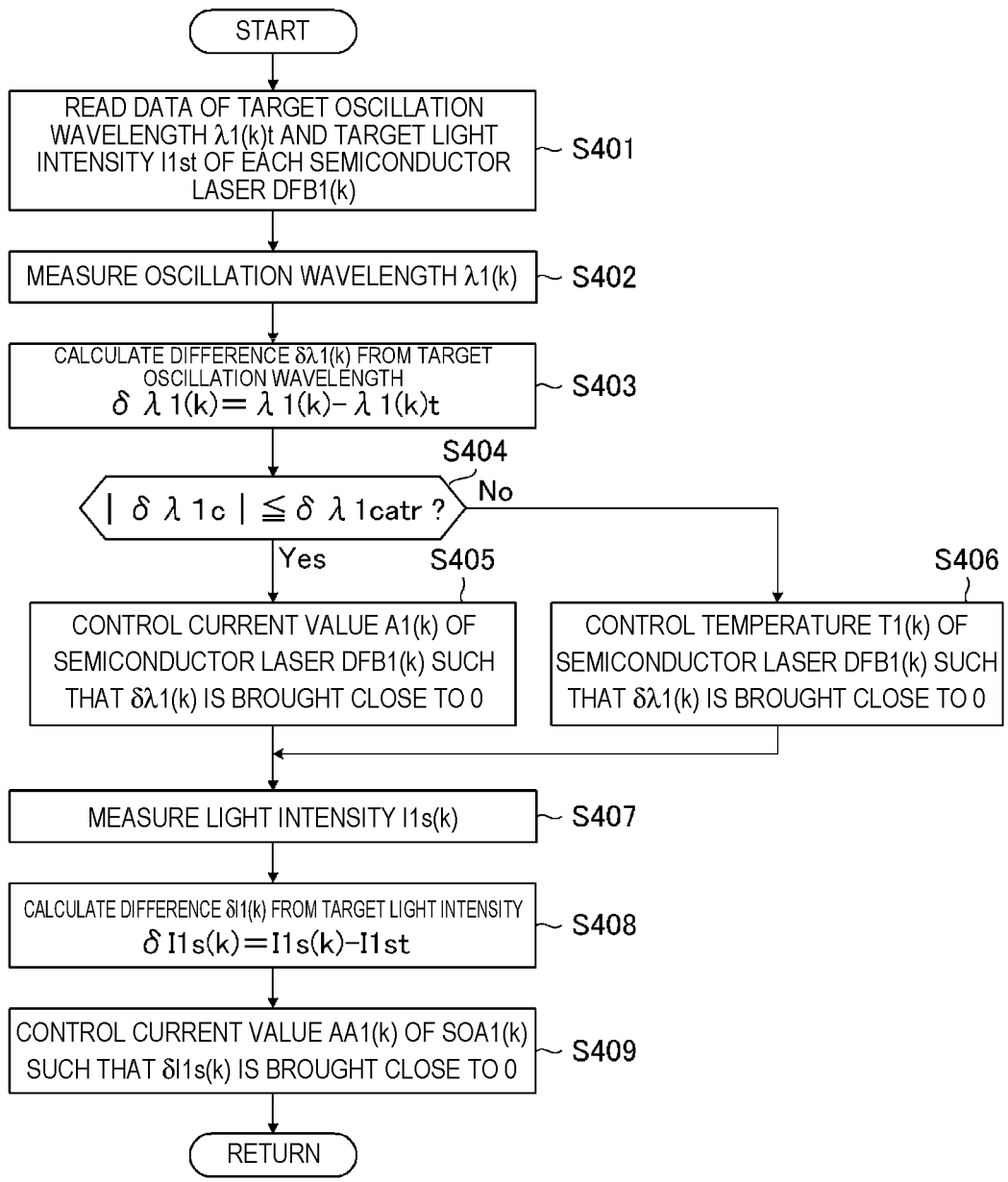
FIG. 62 is a flowchart of an example of a control subroutine of the semiconductor laser DFB1($k$).

FIG. 62 is a flowchart of an example of a control subroutine of the semiconductor laser DFB1(k). The flowchart in FIG. 62 can be applied in place of the flowchart in FIG. 38.

In step S401 in FIG. 62, the first multiline control unit 168 reads data of a target oscillation wavelength λ1(k)t and the target light intensity list of the semiconductor laser DFB1(k).

In step S402, the first multiline control unit 168 uses the first spectrum monitor 166 to measure an oscillation wavelength λ1(k) of each semiconductor laser DFB1(k).

In step S403, the first multiline control unit 168 calculates a difference δλ1(k) between the oscillation wavelength λ1(k) measured in step S402 and the target oscillation wavelength λ1(k)t.

$$\delta\lambda1(k)=\lambda1(k)-\lambda1(k)t \quad (18)$$

In step S404, the first multiline control unit 168 determines whether or not an absolute value of δλ1(k) is within a predetermined range. The first multiline control unit 168 determines whether or not |δλ1(k)| is equal to or smaller than δλ1catr, where δλ1catr is an allowable upper limit value of the predetermined range.

When the determination result in step S404 is Yes, the first multiline control unit 168 goes to step S405.

In step S405, the first multiline control unit 168 controls the current value A1(k) of the semiconductor laser DFB1(k) such that δλ1(k) is brought close to 0. In other words, when the absolute value of the difference δλ1(k) between the oscillation wavelength λ1(k) and the target oscillation wavelength λ1(k) is within the predetermined range, the first multiline control unit 168 controls the current value A1(k) of the semiconductor laser DFB1(k) such that δλ1(k) is brought close to 0.

When the determination result in step S404 is No, the first multiline control unit 168 goes to step S406.

In step S406, the first multiline control unit 168 controls the temperature T1(k) of the semiconductor laser DFB1(k) such that δλ1(k) is brought close to 0. In other words, when the absolute value of the difference δλ1(k) between the oscillation wavelength λ1(k) and the target oscillation wavelength λ1(k)t exceeds the predetermined range, the first multiline control unit 168 controls the temperature T1(k) of the semiconductor laser DFB1(k) such that δλ1(k) is brought close to 0.

After step S405 or S406, the first multiline control unit 168 goes to step S407.

In step S407, the first spectrum monitor 166 measures light intensity I1s(k) of the semiconductor laser DFB1(k).

In step S408, the first multiline control unit 168 calculates a difference SI1(k) between the light intensity I1s(k) measured in step S407 and the target light intensity I1st.

$$\delta I1s(k)=I1s(k)-I1st \quad (19)$$

In step S409, the first multiline control unit 168 controls the current value AA1(k) of the semiconductor optical amplifier SOA1(k) such that δI1s(k) is brought close to 0.

After step S409, the first multiline control unit 168 finishes the flowchart in FIG. 62 and returns to the flowchart in FIG. 36.

7. Variant 2 of Multiple Semiconductor Laser System

7.1 Configuration

Figure 63:
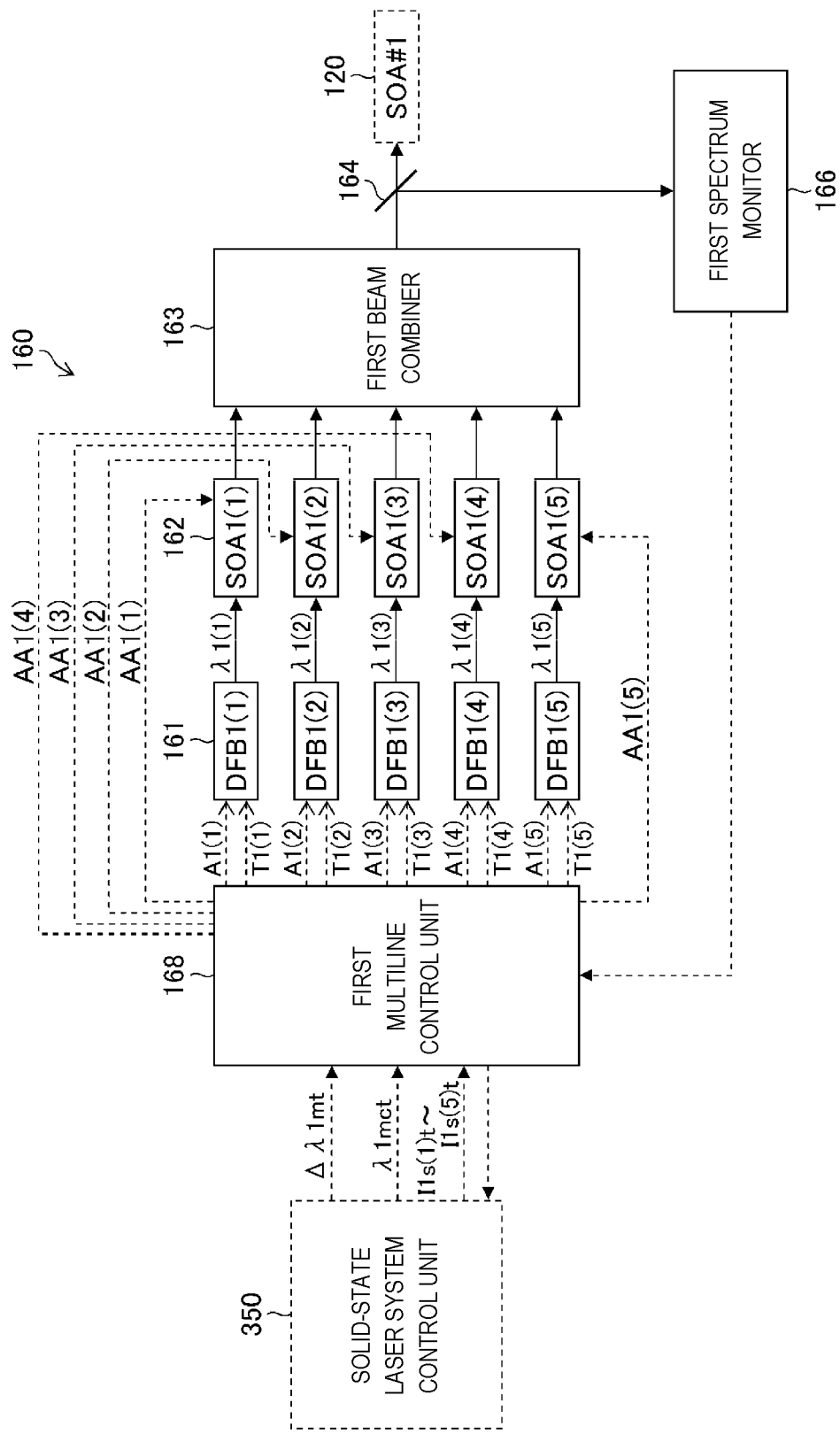
FIG. 63 is a block diagram of Variant 2 of the multiple semiconductor laser system.

FIG. 63 is a block diagram of Variant 2 of the multiple semiconductor laser system. FIG. 63 shows an example of the first multiple semiconductor laser system 160, but the second multiple semiconductor laser system 260 may have the same configuration as in FIG. 63. Differences between the configurations in FIG. 63 and FIG. 60 will be described.

In FIG. 63, the semiconductor optical amplifier SOA1($k$) is arranged in the optical path of the laser beam between each semiconductor laser DFB1($k$) and the first beam combiner 163 as in FIG. 60. The first multiple semiconductor laser system 160 in FIG. 63 can freely control each light intensity of multiline.

7.2 Operation

In FIG. 63, the solid-state laser system control unit 350 transmits, to the first multiline control unit 168, data of the target spectral line width $\Delta\lambda 1mt$, the target center wavelength $\lambda 1mct$, and target light intensities $I1s(1)t$ to $I1s(5)t$ of respective wavelengths $\lambda 1(k)$ of the multiline.

The first multiline control unit 168 controls a current value AA1($k$) of each semiconductor optical amplifier SOA1($k$) such that the light intensities of the oscillation wavelengths $\lambda 1(k)$ are the target light intensities $I1s(1)t$ to $I1s(5)t$.

Figure 64:
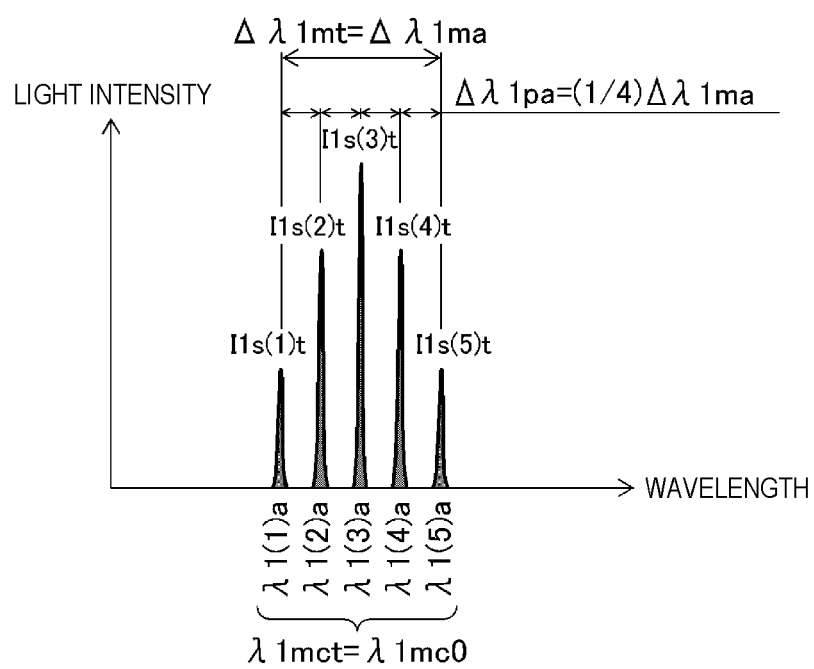
FIG. 64 shows an example of a multiline spectrum detected by the first spectrum monitor in Variant 2 in FIG. 63.

FIG. 64 shows an example of a multiline spectrum detected by the first spectrum monitor 166 in Variant 2 in FIG. 63. As shown in FIG. 64, the light intensity of each wavelength $\lambda 1(k)$ of the multiline can be freely controlled, and thus this example can be also applied to control of a spectral waveform.

The second multiple semiconductor laser system 260 may have the same configuration as in FIG. 63.

Figure 65:
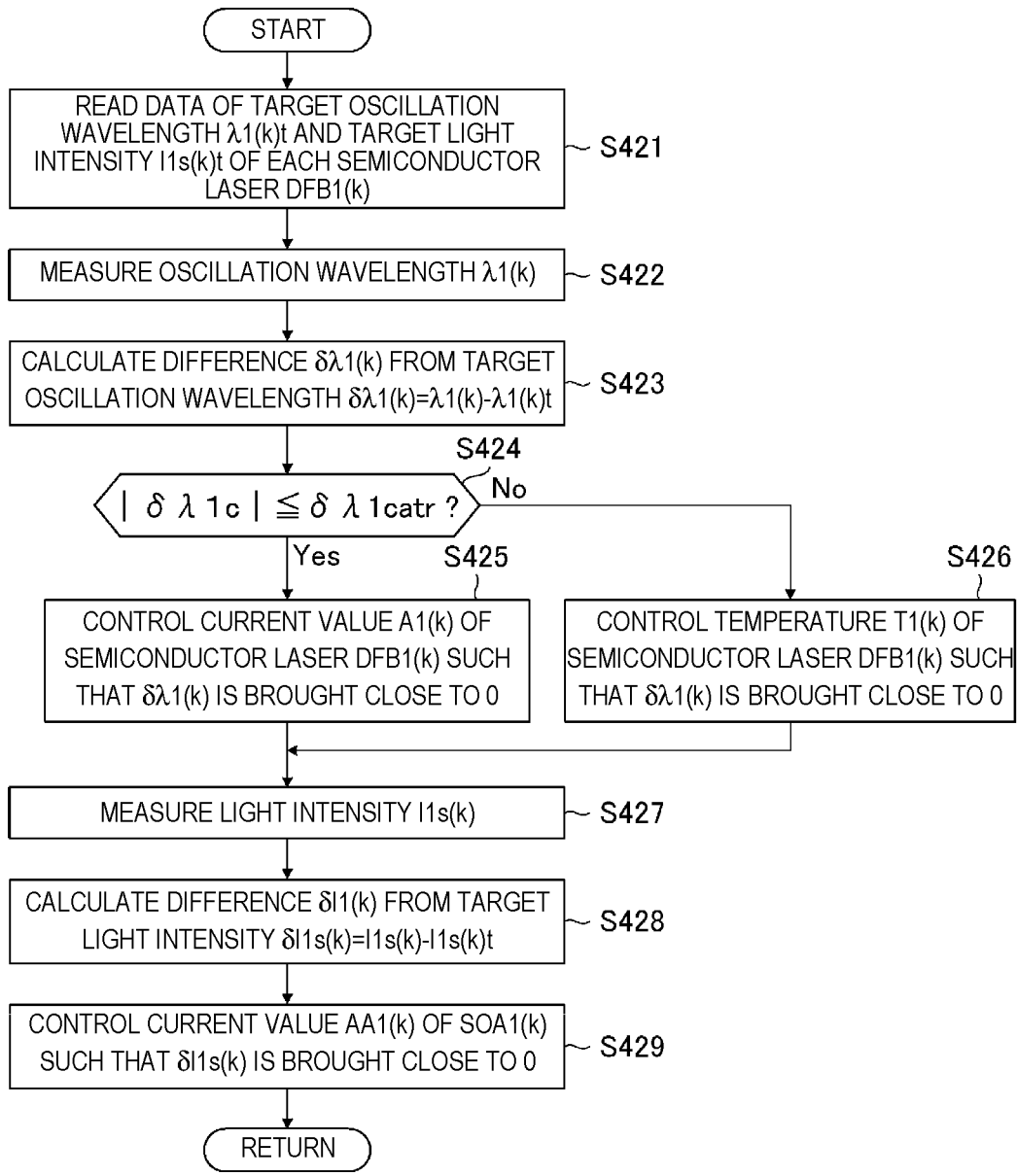
FIG. 65 is a flowchart of an example of a control subroutine of the semiconductor laser DFB1($k$).

FIG. 65 is a flowchart of an example of a control subroutine of the semiconductor laser DFB1($k$). The flowchart in FIG. 65 can be applied in place of the flowchart in FIG. 38.

In step S421 in FIG. 65, the first multiline control unit 168 reads data of a target oscillation wavelength $\lambda 1(k)t$ and target light intensity $I1s(k)t$ of the semiconductor laser DFB1($k$). The target light intensity $I1s(k)t$ may be set to a different value for each target oscillation wavelength $\lambda 1(k)t$.

In step S422, the first multiline control unit 168 uses the first spectrum monitor 166 to measure an oscillation wavelength $\lambda 1(k)$ of each semiconductor laser DFB1($k$).

In step S423, the first multiline control unit 168 calculates a difference a1($k$) between the measured oscillation wavelength $\lambda 1(k)$ and the target oscillation wavelength $\lambda 1(k)t$.

$$\delta\lambda 1(k)=\lambda 1(k)-\lambda 1(k)t \quad (20)$$

In step S424, the first multiline control unit 168 determines whether or not an absolute value of $\delta\lambda 1(k)$ is within a predetermined range. The first multiline control unit 168 determines whether or not $|\delta\lambda 1(k)|$ is equal to or smaller than $\delta\lambda 1catr$, where $\delta\lambda 1catr$ is an upper limit value of the predetermined range.

When the determination result in step S424 is Yes, the first multiline control unit 168 goes to step S425.

In step S425, the first multiline control unit 168 controls the current value A1($k$) of the semiconductor laser DFB1($k$) such that $\delta\lambda 1(k)$ is brought close to 0. In other words, when the absolute value of the difference $\delta\lambda 1(k)$ between the oscillation wavelength $\lambda 1(k)$ and the target oscillation wavelength $\lambda 1(k)t$ is within the predetermined range, the first multiline control unit 168 controls the current value A1($k$) of the semiconductor laser DFB1($k$) such that $\delta\lambda 1(k)$ is brought close to 0.

When the determination result in step S424 is No, the first multiline control unit 168 goes to step S426.

In step S426, the first multiline control unit 168 controls the temperature T1($k$) of the semiconductor laser DFB1($k$) such that $\delta\lambda 1(k)$ is brought close to 0. In other words, when the absolute value of the difference $\delta\lambda 1(k)$ between the oscillation wavelength $\lambda 1(k)$ and the target oscillation wavelength $\lambda 1(k)t$ exceeds the predetermined range, the temperature T1($k$) of the semiconductor laser DFB1($k$) is controlled such that $\delta\lambda 1(k)$ is brought close to 0.

After step S425 or S426, the first multiline control unit 168 goes to step S427.

In step S427, the first multiline control unit 168 uses the first spectrum monitor 166 to measure light intensity $I1s(k)$ of the semiconductor laser DFB1($k$).

In step S428, the first multiline control unit 168 calculates a difference $\delta I1(k)$ between the light intensity $I1s(k)$ measured in step S427 and the target light intensity $I1s(k)t$.

$$\delta I1s(k)=I1s(k)-I1s(k)t \quad (21)$$

In step S429, the first multiline control unit 168 controls the current value AA1($k$) of the semiconductor optical amplifier SOA1($k$) such that $\delta I1s(k)$ is brought close to 0.

After step S429, the first multiline control unit 168 finishes the flowchart in FIG. 62 and returns to the flowchart in FIG. 36.

8. Specific Example of Spectrum Monitor

8.1 Example of Spectrum Monitor Using Spectrometer and Reference Laser Beam Source

8.1.1 Configuration

Figure 66:
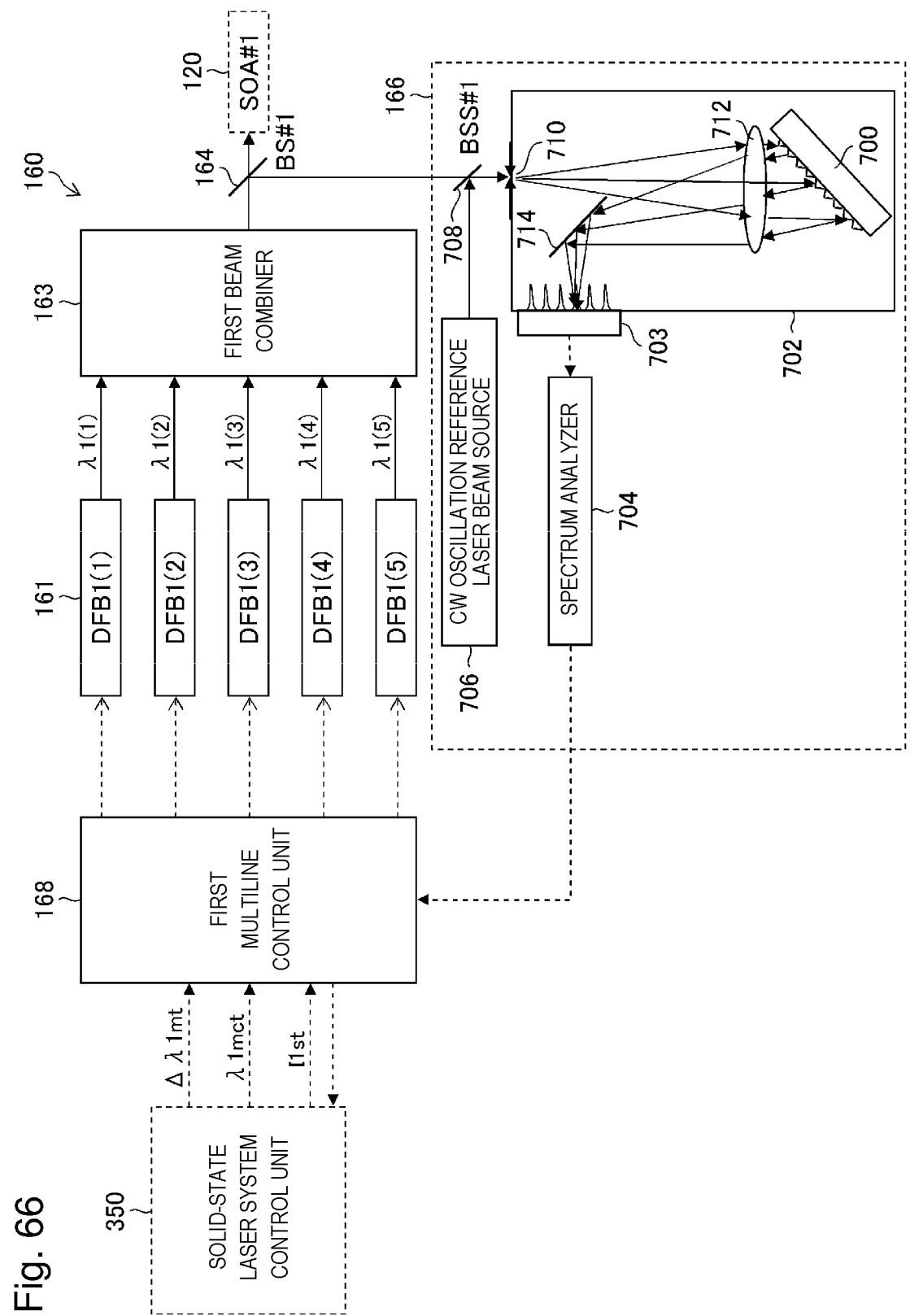
FIG. 66 schematically shows an exemplary configuration of a spectrum monitor.

FIG. 66 schematically shows an exemplary configuration of the spectrum monitor. FIG. 66 shows an example of the first spectrum monitor 166, but the second spectrum monitor 266 may have the same configuration as in FIG. 66.

The first spectrum monitor 166 in FIG. 66 may include a spectrometer 702 including a grating 700, a line sensor 703, a spectrum analyzer 704, a CW oscillation reference laser beam source 706, and a beam splitter 708.

The spectrometer 702 includes an entrance slit 710, a collimator lens 712, and a high reflective mirror 714. The CW oscillation reference laser beam source 706 is a reference light source that outputs a laser beam having a reference wavelength by CW oscillation. Here, the laser beam having a reference wavelength output from the CW oscillation reference laser beam source 706 is referred to as "reference laser beam". The laser beam output from each semiconductor laser DFB1($k$) is referred to as "semiconductor laser beam".

8.1.2 Operation

In FIG. 66, part of the laser beam reflected by the first beam splitter 164 passes through the beam splitter 708. The reference laser beam output from the CW oscillation reference laser beam source 706 is reflected by the beam splitter 708 and overlapped with the multiline laser beam having passed through the beam splitter 708.

The laser beam overlapped with the reference laser beam by the beam splitter 708 enters the spectrometer 702 through the entrance slit 710. The laser beam having passed through the entrance slit 710 enters the grating 700 via the collimator lens 712 and is dispersed by the grating 700. A peak position and peak intensity of a slit image of each semiconductor laser beam and the reference laser beam formed on the line sensor 703 via the collimator lens 712 and the high reflective mirror 714 can be measured to measure an absolute wavelength and light intensity of each semiconductor laser.

In FIG. 66, the example of the spectrometer 702 including the grating 700 is shown, but an etalon spectrometer in FIG. 71 described later may be used. The CW oscillation reference laser beam source 706 is an example of "first reference laser beam source" in the present disclosure. The spectrometer 702 is an example of "first spectrometer" in the present disclosure.

Figure 67:
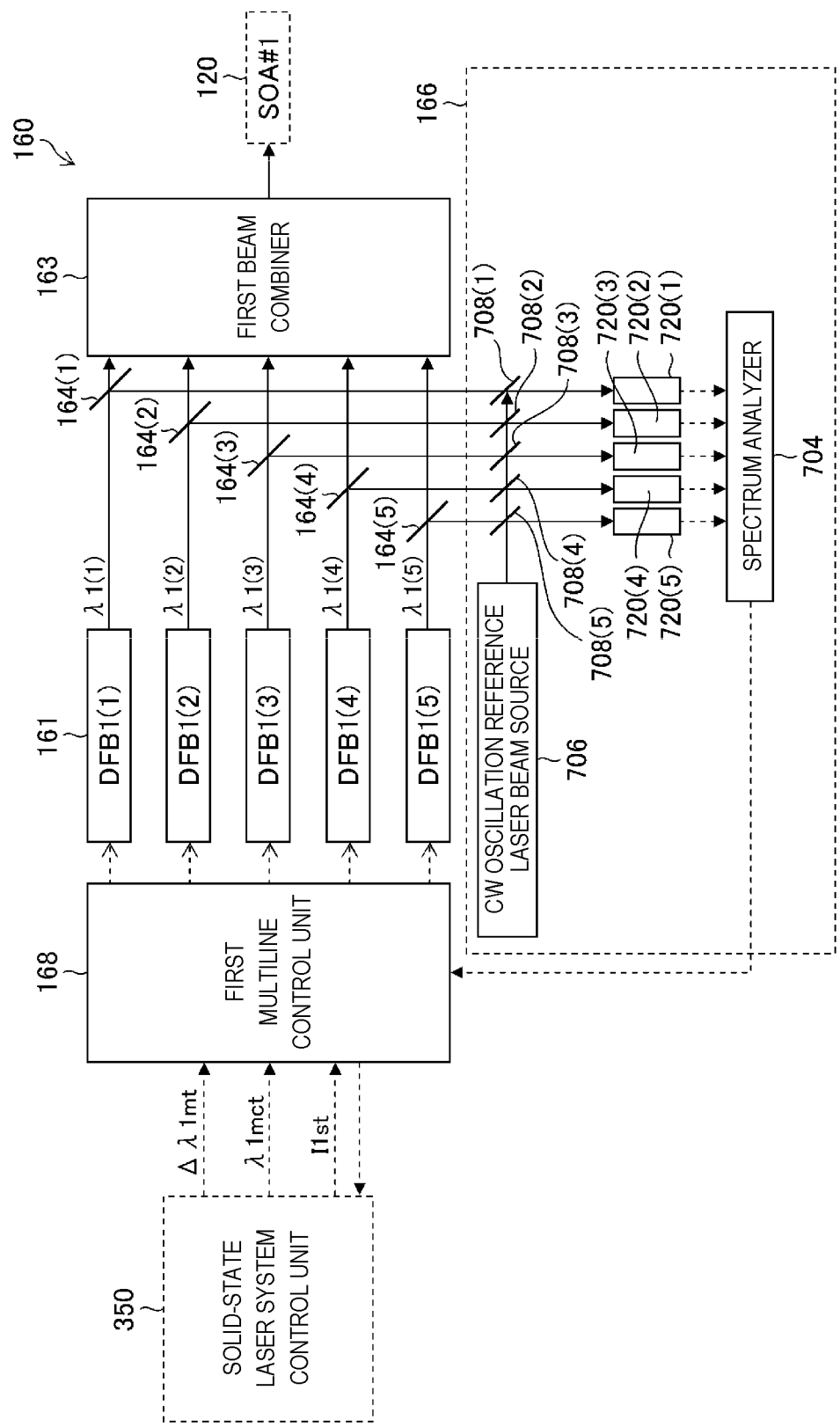
FIG. 67 schematically shows another exemplary configuration of the spectrum monitor.

8.2 Example of Spectrum Monitor Using Heterodyne Interferometer 8.2.1 Configuration FIG. 67 schematically shows another exemplary configuration of the spectrum monitor. FIG. 67 shows an example of the first spectrum monitor 166. As shown in FIG. 67, the first spectrum monitor 166 may include a heterodyne interferometer. The first multiple semiconductor laser system 160 in FIG. 67 includes beam splitters 164(1) to 164(5) in optical paths of laser beams between the semiconductor lasers DFB1(1) to DFB1(5) and the first beam combiner 163.

The first spectrum monitor 166 includes a CW oscillation reference laser beam source 706, a plurality of beam splitters 708(1) to 708(5), a plurality of light intensity sensors 720(1) to 720(5), and a spectrum analyzer 704.

As shown in FIG. 67, the beam splitter 164(k) is arranged in the optical path of the laser beam output from the semiconductor laser DFB1(k). The beam splitter 708(k) is arranged in the optical path between the beam splitter 164(k) and the light intensity sensor 720(k). The beam splitter 708(k) is arranged such that a reference laser beam output from the CW oscillation reference laser beam source 706 and overlapped with part of the laser beam output from the semiconductor laser DFB1(k) enters the light intensity sensor 720(k).

8.2.2 Operation

The first spectrum monitor 166 in FIG. 67 uses the light intensity sensor 720(k) to measure a change in light intensity of the reference laser beam output from the CW oscillation reference laser beam source 706 and overlapped with part of the laser beam output from each semiconductor laser DFB1(k).

The spectrum analyzer 704 can analyze a beat signal detected by each light intensity sensor 720(k) to measure a frequency difference between the laser beam of each semiconductor laser DFB1(k) and the reference laser beam and the light intensity. A wavelength difference can be calculated from the frequency difference.

In FIG. 67, the example is shown in which the beat signals of the reference laser beam and the laser beam of each semiconductor laser are detected, but not limited to this. For example, beat signals of the CW oscillation reference laser beam source and the semiconductor laser DFB1(1) may be detected, and beat signals of the semiconductor lasers DFB1(1) and DFB1(2), beat signals of the semiconductor lasers DFB1(2) and DFB1(3), beat signals of the semiconductor lasers DFB1(3) and DFB1(4), and beat signals of the semiconductor lasers DFB1(4) and DFB1(5) may be detected, thereby detecting a wavelength and light intensity of each semiconductor laser.

Not limited to the first spectrum monitor 166, the second spectrum monitor 266 (see FIG. 20) may have the same configuration as in FIG. 67.

8.2.3 Example of Beat Signal

Figure 68:
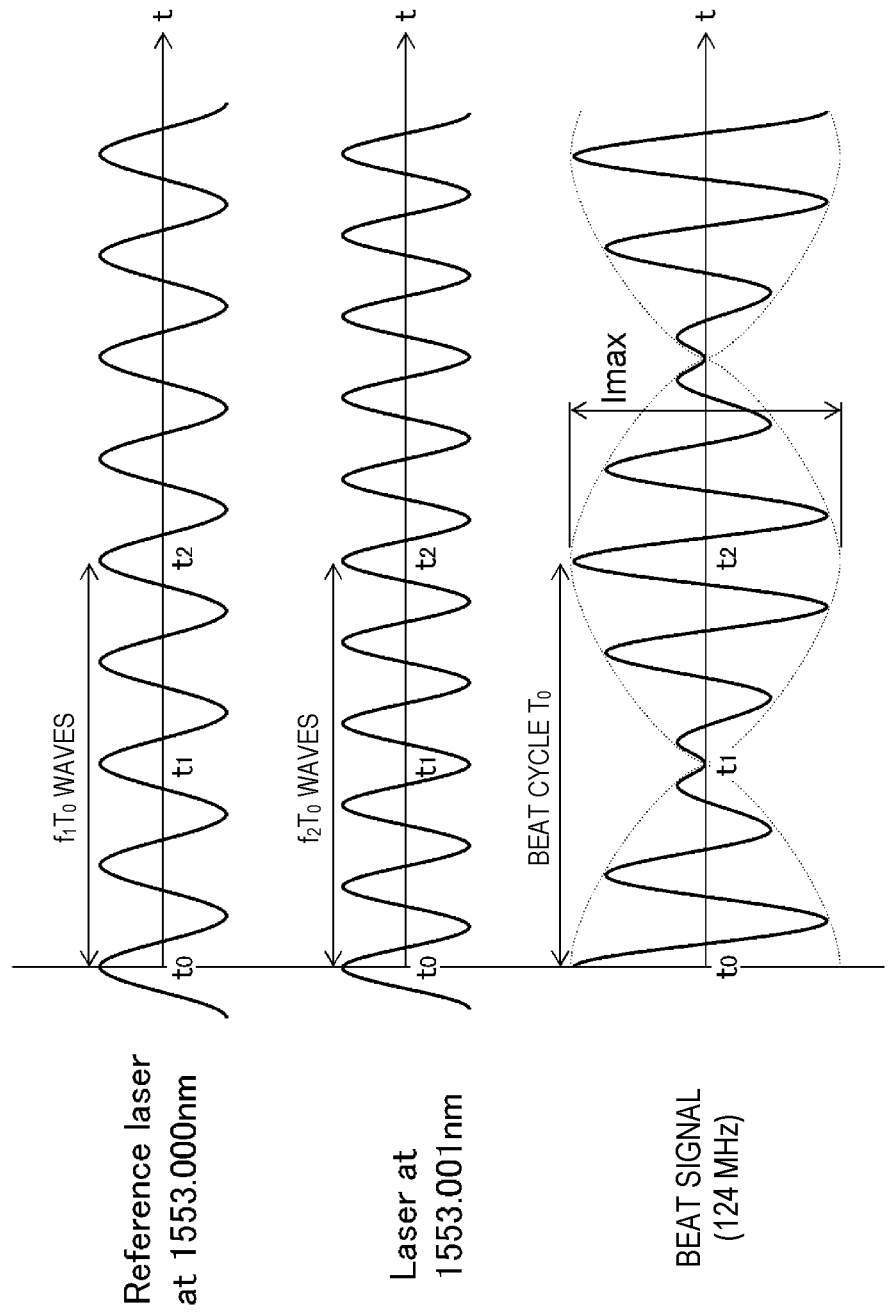
FIG. 68 illustrates detection of a beat signal using a heterodyne interferometer and calculation of a wavelength and light intensity.

FIG. 68 illustrates detection of a beat signal using the heterodyne interferometer and calculation of a wavelength and light intensity. The top waveform in FIG. 68 is a waveform of a signal indicating intensity of the reference laser beam. The horizontal axis represents time and the longitudinal axis represents light intensity. Here, an example is shown in which the reference laser beam has a wavelength of 1553.000 nm.

The middle waveform in FIG. 68 is a waveform of a signal indicating intensity of a laser beam as a beam to be detected output from the semiconductor laser. Here, an example is shown in which the laser beam has a wavelength of 1553.001 nm.

The bottom waveform in FIG. 68 is a waveform of a beat signal caused by interference between the reference laser beam and the beam to be detected (semiconductor laser beam). A frequency difference 1/T0 between the reference laser beam and the beam to be detected can be measured from a beat cycle of the beat signal. Also, light intensity I of the beam to be detected can be measured in accordance with a maximum amplitude value Imax of beat of the beat signal.

The light intensity I of the beam to be detected can be calculated by Expression (22) below.

$$I = I\max{}^2/(2 \cdot Is) \qquad (22)$$

where Is is light intensity of the reference laser beam.

As described above, the heterodyne interferometer can detect even a wavelength difference of 0.001 nm with high accuracy.

8.2.4 Variant

When the heterodyne interferometer is used to measure the wavelength and the light intensity of each semiconductor laser, a beat signal between part of the laser beam after being combined and the reference laser beam may be detected, and the beat signal may be analyzed using a fast Fourier transform (FFT) algorithm to measure the wavelength and the light intensity of each semiconductor laser.

9. Example of Excimer Amplifier 9.1 Multipath Amplification

Figure 69:
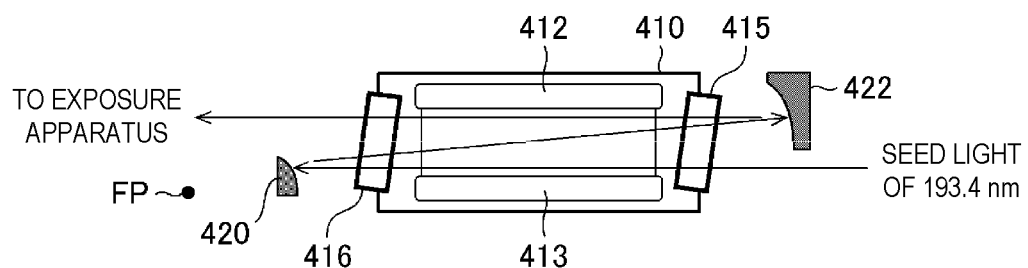
FIG. 69 schematically shows an exemplary configuration of an excimer amplifier.

FIG. 69 schematically shows an exemplary configuration of the excimer amplifier 14. The excimer amplifier 14 in FIG. 69 passes three times seed light having a wavelength of 193.4 nm through a discharge space between the discharge electrodes 412, 413 for amplification. Here, the seed light having the wavelength of 193.4 nm is the second pulse laser beam LP2 output from the solid-state laser system 10.

In FIG. 69, the excimer amplifier 14 includes a convex mirror 420 and a concave mirror 422 in an optical path of the seed light outside the chamber 410. The convex mirror 420 and the concave mirror 422 are arranged such that their focal points FP are substantially aligned with each other.

The seed light having entered the excimer amplifier 14 is reflected by the convex mirror 420 and the concave mirror 422 to pass three times through the discharge space between the discharge electrodes 412, 413. This expands and amplifies the seed light, which is output toward the exposure apparatus 20.

9.2 Amplification with Ring Resonator

Figure 70:
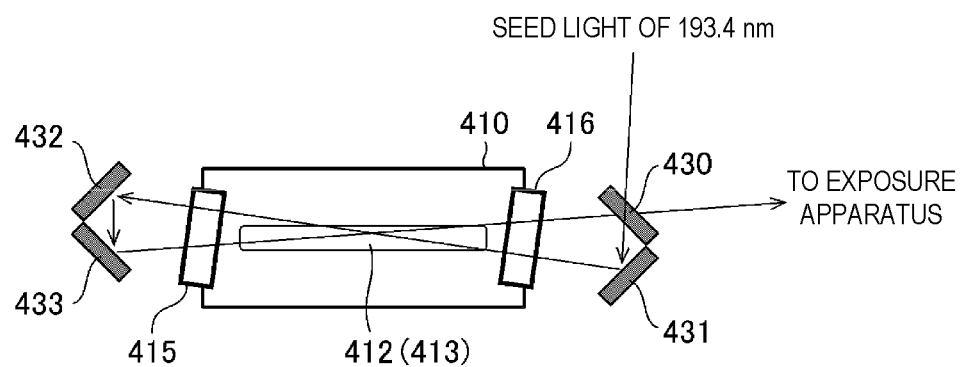
FIG. 70 schematically shows an exemplary configuration of an excimer amplifier using a ring resonator.

FIG. 70 shows an example in which a ring resonator is used as the excimer amplifier 14. The ring resonator includes an output coupling mirror 430 and high reflective mirrors 431 to 433. The excimer amplifier 14 may further include a high reflective mirror (not shown) that guides seed light having a wavelength of 193.4 nm to the ring resonator, and a high reflective mirror (not shown) that guides a pulse laser beam output from the ring resonator to the exposure apparatus 20.

The chamber 410 includes the windows 415, 416. The discharge electrodes 412, 413 are arranged in the chamber 410. In FIG. 70, the discharge electrodes 412, 413 are arranged to face each other in a direction perpendicular to the sheet surface. A discharge direction is perpendicular to the sheet surface.

In the excimer amplifier 14, the seed light repeatedly travels through the output coupling mirror 430, the high reflective mirror 431, the discharge space between the discharge electrodes 412, 413, the high reflective mirror 432, the high reflective mirror 433, and the discharge space between the discharge electrodes 412, 413 in this order, and is amplified.

10. Example of Spectrum Monitor Using Etalon Spectrometer

FIG. 71 schematically shows an exemplary configuration of a spectrum monitor using an etalon spectrometer. An etalon spectrometer 606A in FIG. 71 can be applied to the spectrum monitor 606 (see FIG. 20) that measures a spectrum of an excimer laser beam. The etalon spectrometer 606A is an example of "spectrometer" in the present disclosure.

As shown in FIG. 71, the etalon spectrometer 606A includes a diffusing element 610, an etalon 612, a light condensing lens 614, and an image sensor 616. The image sensor 616 may be, for example, one-dimensional or two-dimensional photodiode array.

The laser beam first enters the diffusing element 610. The diffusing element 610 may be a transmissive optical element having many irregularities on its surface. The diffusing element 610 transmits the laser beam having entered the diffusing element 610 as scattered light. The scattered light enters the etalon 612. The etalon 612 may be an air gap etalon including two partially reflective mirrors having predetermined reflectance. In the air gap etalon, the two partially reflective mirrors face each other with an air gap of a predetermined distance therebetween and are bonded together via a spacer.

Depending on an incident angle θ of the light having entered the etalon 612, an optical path difference differs between light passing through the etalon 612 without reciprocating between the two partially reflective mirrors and light reciprocating once between the two partially reflective mirrors and then passing through the etalon 612. When the optical path difference is an integer multiple of the wavelength, the light having entered the etalon 612 passes through the etalon 612 with high transmittance.

The light having passed through the etalon 612 enters the light condensing lens 614. The laser beam having passed through the light condensing lens 614 enters the image sensor 616 arranged in a position corresponding to a focal length f of the light condensing lens 614. Specifically, the transmitted light condensed by the light condensing lens 614 forms an interference pattern on a focal plane of the light condensing lens 614.

The image sensor 616 is arranged on the focal plane of the light condensing lens 614. The image sensor 616 receives the light having passed through the light condensing lens 614 and detects the interference pattern. The square of the radius of the interference pattern may be proportional to the wavelength of the laser beam. Thus, a spectral line width (spectrum profile) and a center wavelength of the entire laser beam are detected from the detected interference pattern.

The spectral line width and the center wavelength may be calculated from the detected interference pattern by an information processing device (not shown) or calculated by the laser control unit 18.

Figure 72:
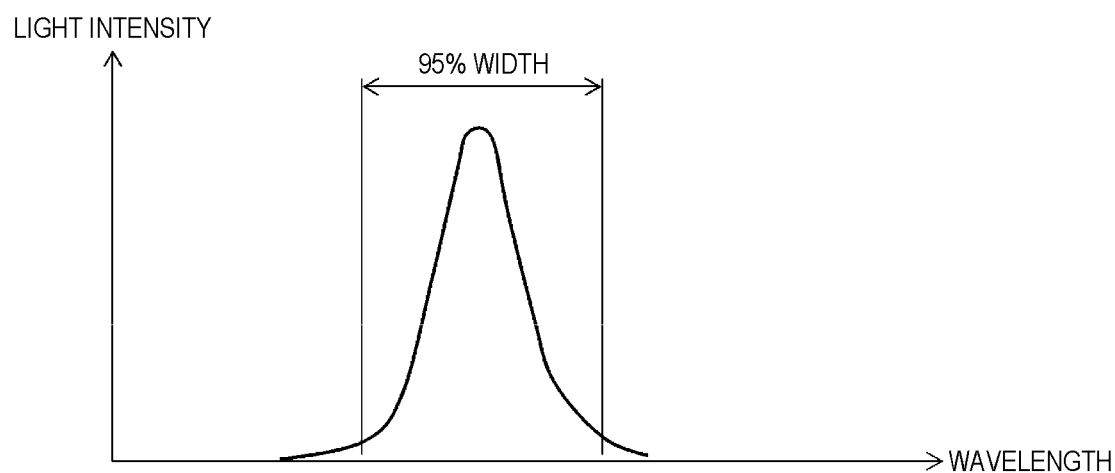
FIG. 72 shows an example of a spectrum of a laser beam.

A relationship between the radius r of the interference pattern and the wavelength λ is approximated by Expression (23) below.

$$\text{Wavelength } \lambda = \lambda c + \alpha \cdot r^2 \tag{23}$$

α: constant of proportionality
r: radius of interference pattern
λc: wavelength when light intensity at middle of interference pattern is maximum From Expression (23), the spectral line width Δλ may be calculated after conversion into a spectral waveform representing the relationship between the light intensity and the wavelength as shown in FIG. 72. The spectral line width Δλ may be a width (E95) containing 95% of total energy.

11. Example of Beam Combiner 11.1 Beam Combiner Including Optical Fiber

Figure 73:
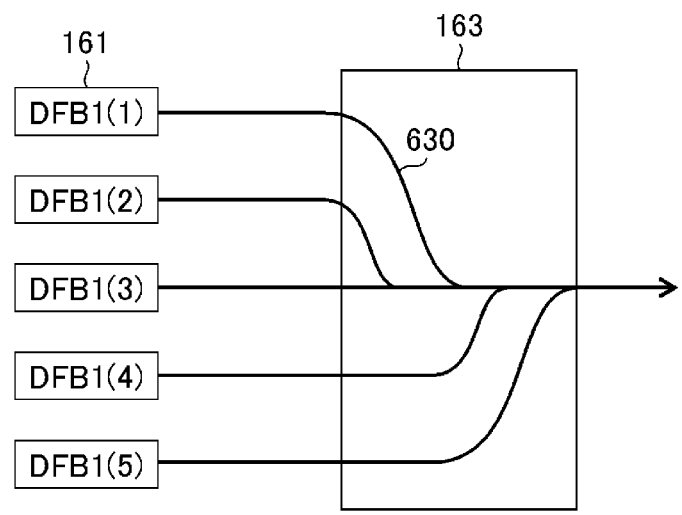
FIG. 73 schematically shows an example of a beam combiner including an optical fiber.

FIG. 73 schematically shows an example of a beam combiner including an optical fiber. Here, the first beam combiner 163 is exemplified, but the second beam combiner 263 may have the same configuration as in FIG. 73. As the first beam combiner 163, a beam combiner including a plurality of optical fibers 630 may be arranged. The optical fibers 630 that transmit the laser beams output from the semiconductor lasers DFB1(1) to DFB1(5) are connected by fusion.

11.2 Beam Combiner Including Half Mirror and High Reflective Mirror

Figure 74:
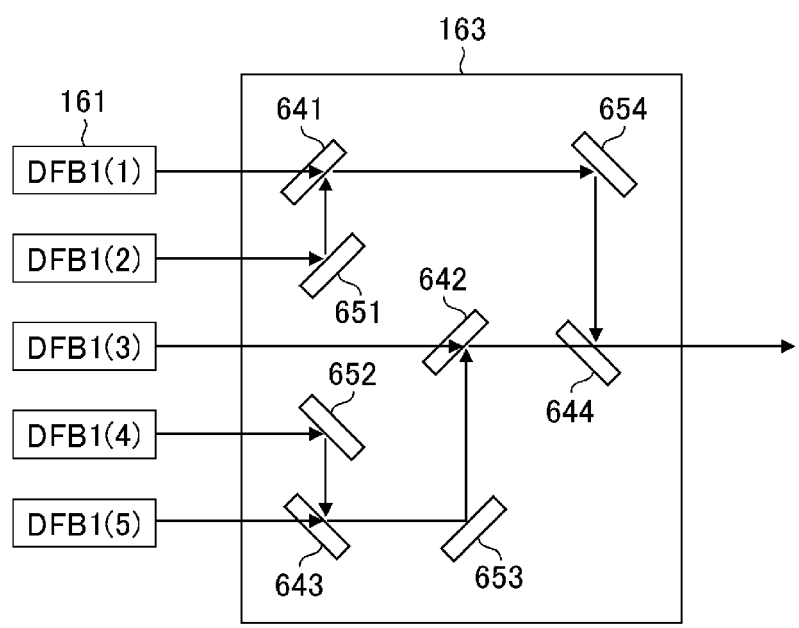
FIG. 74 schematically shows an example of a beam combiner including a half mirror and a high reflective mirror.

FIG. 74 schematically shows an example of a beam combiner including a half mirror and a high reflective mirror. Here, the first beam combiner 163 is exemplified, but the second beam combiner 263 may have the same configuration as in FIG. 74.

The first beam combiner 163 in FIG. 74 includes a combination of a plurality of half mirrors 641, 642, 643, 644 and a plurality of high reflective mirrors 651, 652, 653, 654. The mirrors are arranged as shown. Part or all of the mirrors may be formed on a silicon chip.

Figure 75:
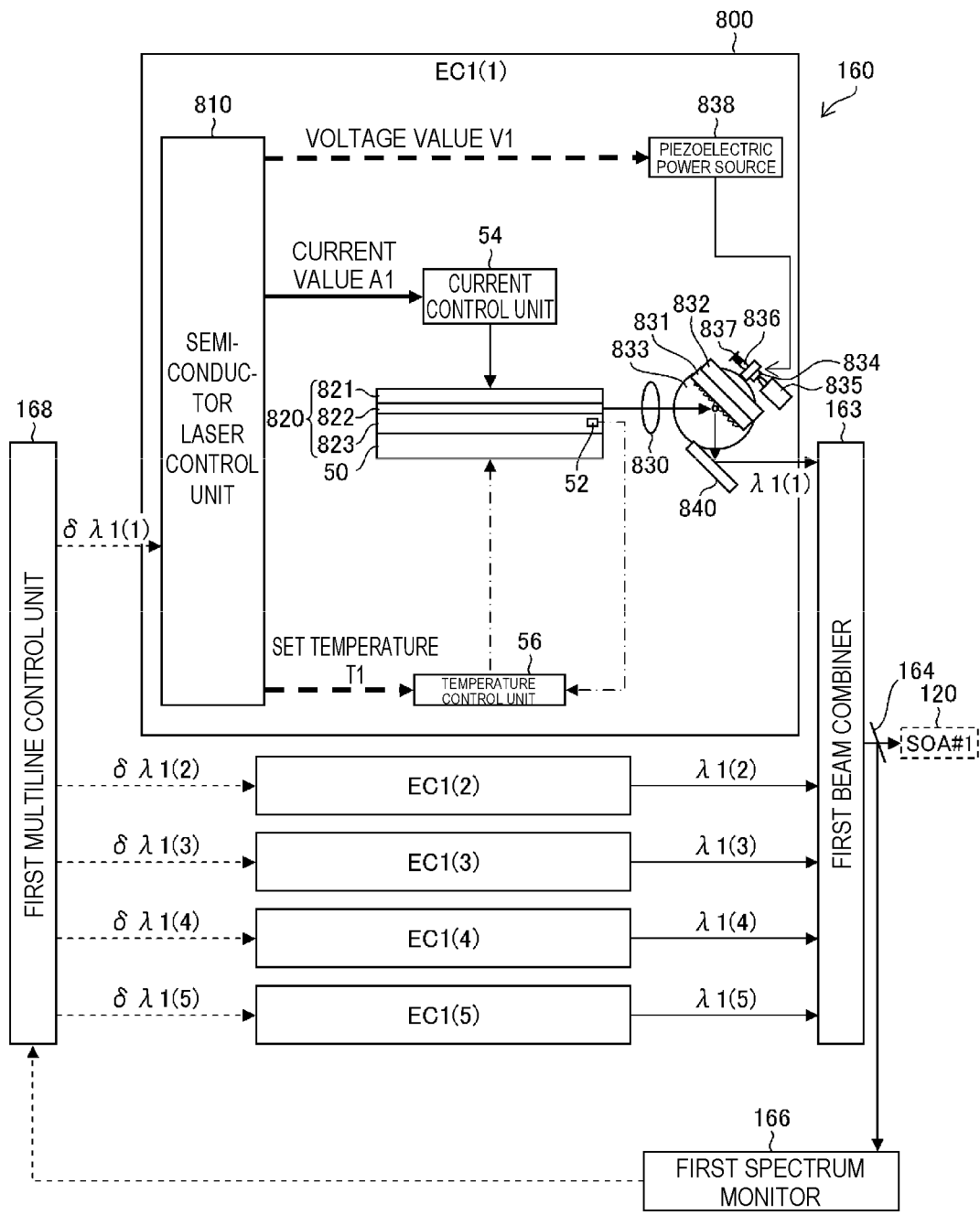
FIG. 75 schematically shows an example of a multiple semiconductor laser system using a single longitudinal mode external cavity semiconductor laser.

12. Another Example of Single Longitudinal Mode Semiconductor Laser 12.1 Configuration FIG. 75 schematically shows an example of a multiple semiconductor laser system using a single longitudinal mode external cavity (EC) semiconductor laser. Here, the first multiple semiconductor laser system 160 is exemplified, but the second multiple semiconductor laser system 260 may have the same configuration as in FIG. 75. As a semiconductor laser that oscillates in a single longitudinal mode, the external cavity semiconductor laser may be used, not limited to the DFB laser.

In FIG. 75, a plurality of external cavity semiconductor lasers 800 included in the first multiple semiconductor laser system 160 are denoted as EC1(1) to EC1(5). The external cavity semiconductor lasers EC1(1) to EC1(5) are set to perform CW oscillation with different wavelengths near a wavelength of about 1030 nm. The external cavity semiconductor lasers EC1(1) to EC1(5) are examples of "a plurality of first semiconductor lasers" in the present disclosure. FIG. 75 shows a configuration of the external cavity semiconductor laser EC1(1), but the other external cavity semiconductor lasers EC1(2) to EC1(5) each have the same configuration.

The external cavity semiconductor laser EC1($k$) includes a semiconductor laser control unit 810, a semiconductor laser element 820, the Peltier element 50, the temperature sensor 52, the current control unit 54, the temperature control unit 56, a collimator lens 830, a grating 831, and a grating holder 832. The external cavity semiconductor laser EC1($k$) further includes a rotation stage 833, a piezoelectric element 834, a micrometer 835, a pin 836, a reaction spring 837, a piezoelectric power source 838, and a steering mirror 840.

The semiconductor laser element 820 includes a layer structure including a first semiconductor layer 821, an active layer 822, and a second semiconductor layer 823. The Peltier element 50 and the temperature sensor 52 are fixed to the semiconductor laser element 820. The semiconductor laser control unit 810 includes a signal line for receiving, from the first multiline control unit 168, data of a difference $δλ1(k)$ between a target oscillation wavelength $λ1(k)$t and an oscillation wavelength $λ1(k)$.

The piezoelectric power source 838 includes a signal line for receiving, from the semiconductor laser control unit 810, data of a value of voltage V1 applied to the piezoelectric element 834. The current control unit 54 includes a signal line for receiving, from the semiconductor laser control unit 810, data of a current value A1. The temperature control unit 56 includes a signal line for receiving, from the semiconductor laser control unit 810, data of a set temperature T1.

The grating 831 is arranged on an output side of the semiconductor laser element 820 via the collimator lens 830 in a Littrow configuration in which a diffraction angle of first order diffracted light coincides with an incident angle. The grating 831 is fixed to the rotation stage 833 via the grating holder 832 such that an incident angle on the grating 831 changes.

The steering mirror 840 is arranged via a holder (not shown) such that its mirror surface is substantially parallel to a diffraction plane of the grating 831.

12.2 Operation

When receiving the data of $δλ1(k)$, the semiconductor laser control unit 810 controls the set temperature T1, the current value A1, and the incident angle on the grating 831 so as to suppress mode hopping, and thus can control an oscillation wavelength in a single longitudinal mode such that $δλ1(k)$ is brought close to 0.

The semiconductor laser control unit 810 previously controls a rotation angle of the rotation stage 833 and a temperature of the semiconductor laser element 820 so as to cause laser oscillation in a fine wavelength region. The semiconductor laser control unit 810 previously stores, as table data, a relationship between $δλ1(k)$, the value of current A1 passed through the semiconductor laser element 820, and the value of voltage V1 applied to the piezoelectric element 834 such that mode hopping does not occur.

When receiving the data of $δλ1(k)$ from the first multiline control unit 168, the semiconductor laser control unit 810 calculates, from the table data, the value of current A1 passed through the semiconductor laser element 820, and the value of voltage V1 applied to the piezoelectric element 834.

The semiconductor laser control unit 810 transmits, to the current control unit 54, data of the value of current A1 passed through the semiconductor laser element 820. The semiconductor laser control unit 810 also transmits, to the piezoelectric power source 838, data of the value of voltage V1 applied to the piezoelectric element 834 that controls a rotation angle of the grating 831.

The piezoelectric element 834 changes the incident angle on the grating 831, and the current passed through the semiconductor laser element 820 changes a refractive index of the active layer 822 of the semiconductor laser element 820. As a result, the oscillation wavelength of the semiconductor laser is brought close to the target oscillation wavelength $λ1(k)$t at high speed with mode hopping being suppressed. Then, zeroth order light of the grating 831 is output, and the steering mirror 840 outputs a CW laser beam to the outside.

12.3 Others

Examples of other semiconductor lasers that oscillate in a single longitudinal mode include a distributed Bragg reflector (DBR) laser, a volume holographic grating (VHG) laser, a discrete mode (DM) laser, and the like.

Figure 76:
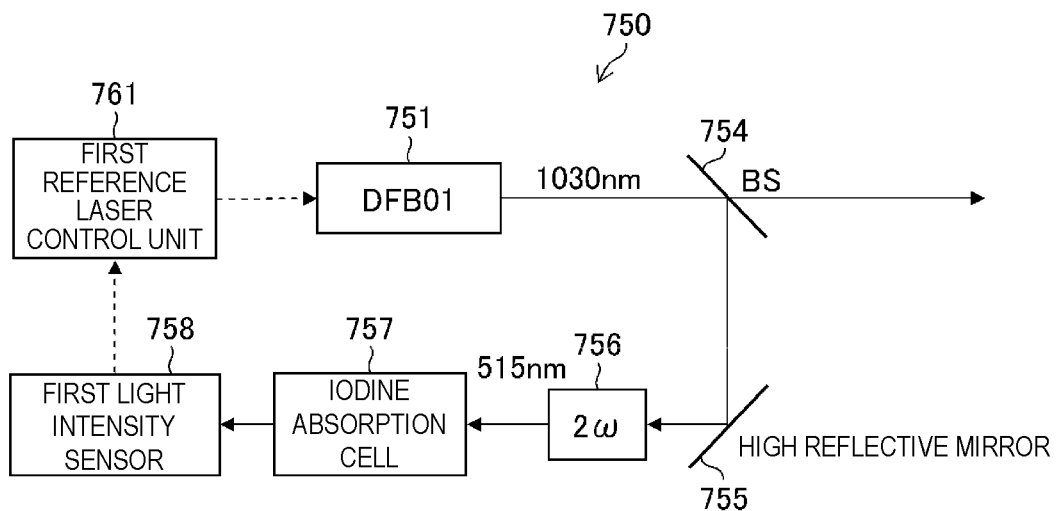
FIG. 76 is a block diagram of an example of a CW oscillation reference laser beam source.

13. Example of CW Oscillation Reference Laser Beam Source 13.1 CW Oscillation Reference Laser Beam Source of wavelength region of 1030 nm FIG. 76 is a block diagram of an example of a CW oscillation reference laser beam source. A CW oscillation reference laser beam source 750 includes a first reference semiconductor laser 751, a beam splitter 754, a high reflective mirror 755, a nonlinear crystal 756, an iodine absorption cell 757, a first light intensity sensor 758, and a first reference laser control unit 761.

The first reference semiconductor laser 751 performs CW oscillation of a laser beam in a wavelength region of 1030 nm. The laser beam reflected by the beam splitter 754 enters the nonlinear crystal 756 via the high reflective mirror 755. The nonlinear crystal 756 generates second harmonic light to obtain a laser beam having a wavelength of about 515 nm. The laser beam having the wavelength of about 515 nm enters the iodine absorption cell 757.

The iodine absorption cell 757 contains iodine gas. A specific absorption line of iodine in the iodine absorption cell 757 includes, for example, an absorption line of 514.581 nm. The laser beam having passed through the iodine absorption cell 757 enters the first light intensity sensor 758.

The first reference laser control unit 761 controls an oscillation wavelength of the first reference semiconductor laser 751 in accordance with a detected signal from the first light intensity sensor 758 such that the absorption line of the iodine absorption cell 757 coincides with the wavelength of the second harmonic light.

The CW oscillation reference laser beam source 750 can be applied as the CW oscillation reference laser beam source 706 of the first spectrum monitor 166 shown in FIGS. 66 and 67.

The iodine absorption cell 757 is an example of "first absorption cell" in the present disclosure. The absorption line of iodine is an example of "first absorption line" in the present disclosure. The CW oscillation reference laser beam source 750 is an example of "first reference laser beam source" in the present disclosure.

13.2 CW Oscillation Reference Laser Beam Source of Wavelength Region of 1554 nm

Figure 77:
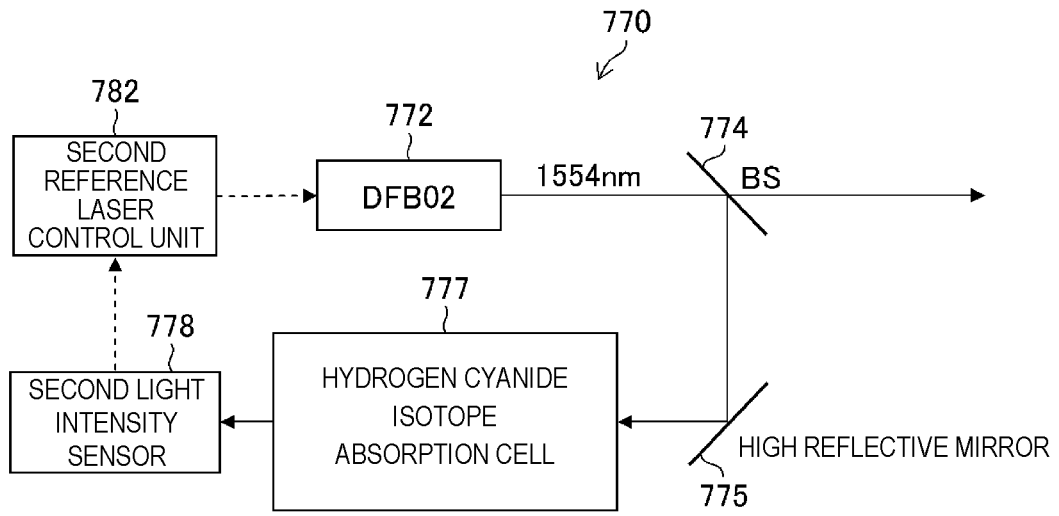
FIG. 77 is a block diagram of another example of the CW oscillation reference laser beam source.

FIG. 77 is a block diagram of another example of the CW oscillation reference laser beam source. A CW oscillation reference laser beam source 770 includes a second reference semiconductor laser 772, a beam splitter 774, a high reflective mirror 775, a hydrogen cyanide isotope absorption cell 777, a second light intensity sensor 778, and a second reference laser control unit 782.

The second reference semiconductor laser 772 performs CW oscillation of a laser beam in a wavelength region of 1554 nm. The laser beam reflected by the beam splitter 774 enters the hydrogen cyanide isotope absorption cell 777 via the high reflective mirror 775.

The absorption cell 777 contains isotope hydrogen cyanide gas. A specific absorption line of the hydrogen cyanide isotope includes, for example, an absorption line of 1553.756 nm. The absorption cell 777 is an example of "second absorption cell" in the present disclosure. The absorption line of the hydrogen cyanide isotope is an example of "second absorption line" in the present disclosure.

An acetylene isotope absorption cell may be used as the absorption cell of this wavelength region. Specifically, an absorption cell containing isotope acetylene gas may be used in place of the hydrogen cyanide isotope absorption cell 777.

The laser beam having passed through the hydrogen cyanide isotope absorption cell 777 enters the second light intensity sensor 778.

The second reference laser control unit 782 controls an oscillation wavelength of the second reference semiconductor laser 772 in accordance with a detected signal from the second light intensity sensor 778 such that the absorption line of the hydrogen cyanide isotope absorption cell 777 coincides with the wavelength of the laser beam of the second reference semiconductor laser 772.

The CW oscillation reference laser beam source 770 can be applied as the CW oscillation reference laser beam source of the second spectrum monitor 266. The CW oscillation reference laser beam source 770 is an example of "second reference laser beam source" in the present disclosure.

14. Example of Multi-Longitudinal Mode CW Oscillation Semiconductor Laser

The multiple semiconductor laser system including a plurality of single longitudinal mode CW oscillation semiconductor lasers has been described, but a multi-longitudinal mode CW oscillation semiconductor laser may be used as a semiconductor laser for outputting a spectrum at which SBS is suppressed.

The multi-longitudinal mode CW oscillation semiconductor laser can be used in place of either the first multiple semiconductor laser system 160 or the second multiple semiconductor laser system 260. For example, the multi-longitudinal mode CW oscillation semiconductor laser may be used in place of the first multiple semiconductor laser system 160 in Embodiment 2.

Figure 78:
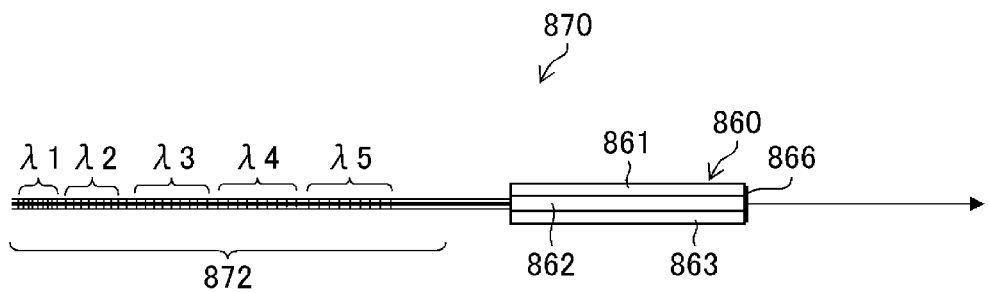
FIG. 78 schematically shows an example of a multi-longitudinal mode CW oscillation semiconductor laser.

FIG. 78 schematically shows an example of a multi-longitudinal mode CW oscillation semiconductor laser. FIG. 78 shows an example of a semiconductor laser including a chirped grating. In a semiconductor laser 870 in FIG. 78, an optical fiber 872 includes gratings having refractive index distribution with different pitches corresponding to wavelengths λ1 to λ5, and is connected to a rear side of a semiconductor laser element 860. Specifically, the optical fiber 872 includes a plurality of gratings with pitches corresponding to a plurality of oscillation wavelengths. Each grating has a high refractive index part and a low refractive index part periodically formed.

The semiconductor laser element 860 includes a layer structure including a first cladding layer 861, an active layer 862, and a second cladding layer 863, and a light output side is coated with a partially reflective film 866.

When current is passed through the semiconductor laser element 860 via an electrode (not shown), a laser beam is output having a plurality of wavelengths corresponding to the pitches of the refractive index distribution formed in the optical fiber 872.

Figure 79:
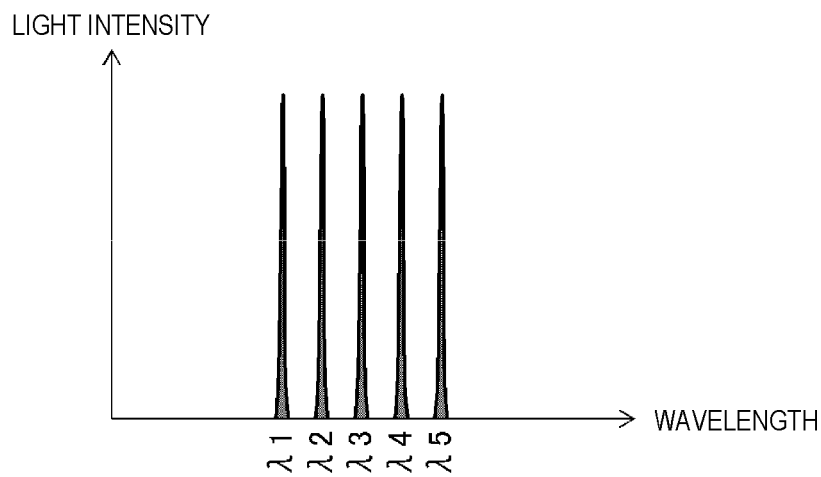
FIG. 79 shows an example of a spectrum of a laser beam output from the semiconductor laser in FIG. 78.

FIG. 79 shows an example of a spectrum of the laser beam output from the semiconductor laser 870 in FIG. 78. As shown in FIG. 79, multiline output is obtained from the semiconductor laser 870.

15. SBS Suppression by Chirping

In a semiconductor laser system using a single longitudinal mode DFB laser, chirping may be caused by passing current of a sum of a DC component and a high frequency AC component through the single longitudinal mode DFB laser, thereby suppressing SBS. The configuration of the single longitudinal mode DFB laser may be that shown in FIG. 16. In this case, the semiconductor laser control unit 34 provides an instruction for current modulation to the current control unit 54.

Figure 80:
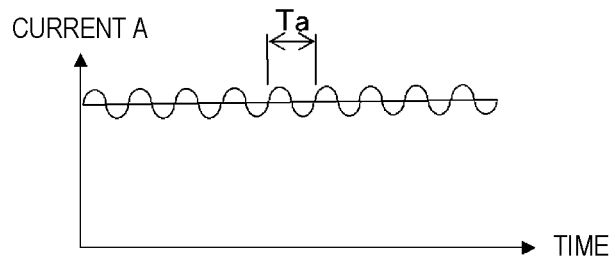
FIG. 80 shows an example of a waveform of a value of current passed through a DFB laser.
Figure 81:
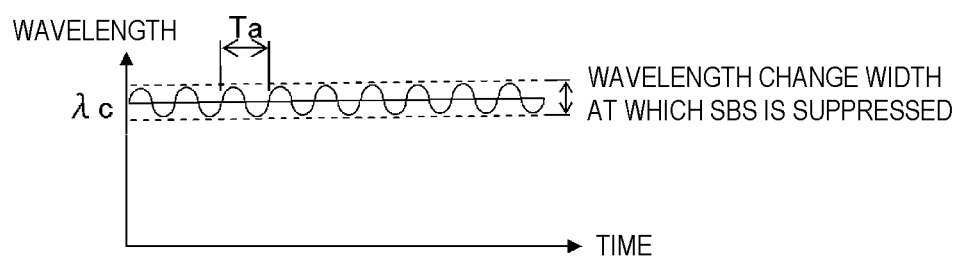
FIG. 81 is a graph showing a wavelength change of a laser beam output from the DFB laser by modulation current.

FIG. 80 shows an example of a waveform of a value of current passed through the DFB laser. FIG. 81 is a graph showing a wavelength change of a laser beam output from the DFB laser by modulation current.

A relationship between a cycle Ta of the AC component of the current passed through the DFB laser and an amplification pulse width D of the semiconductor optical amplifier is preferably as expressed below.

$$D = m \cdot Ta \quad (24)$$

where m is an integer of one or more.

As shown in FIG. 81, the current is controlled to obtain a wavelength change width at which SBS is suppressed.

Also, chirping may be caused by passing pulse current through the single longitudinal mode DFB laser, thereby suppressing SBS. Wavelength chirping is caused by high-speed current modulation of the semiconductor laser element 860.

16. Example of Semiconductor Optical Amplifier 16.1 Configuration

Figure 82:
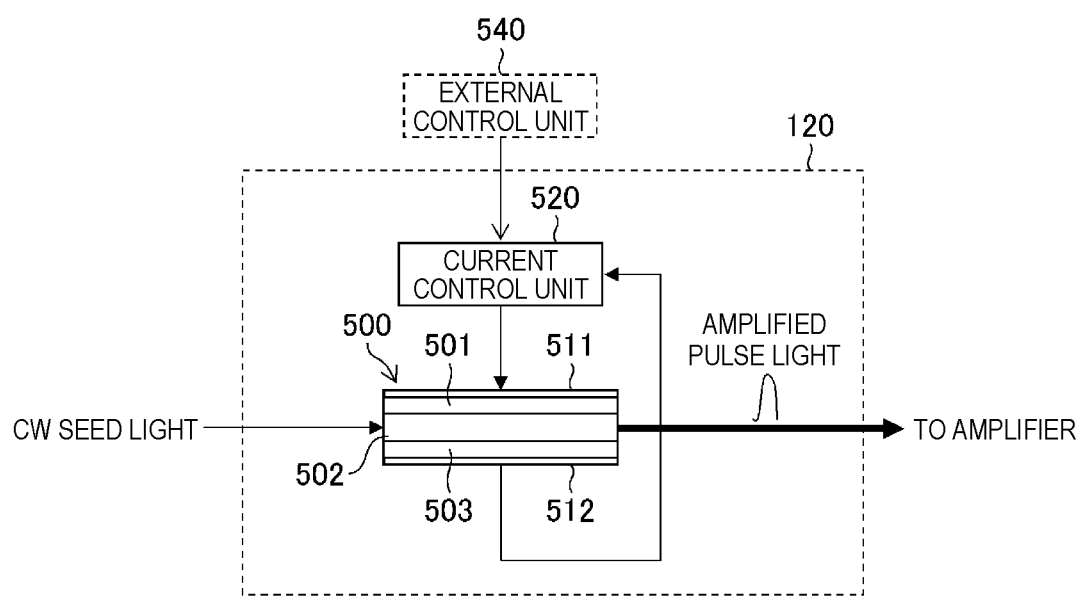
FIG. 82 schematically shows an exemplary configuration of a semiconductor optical amplifier.

FIG. 82 schematically shows an exemplary configuration of a semiconductor optical amplifier. Here, the first semiconductor optical amplifier 120 is exemplified, but other semiconductor optical amplifiers such as the second semiconductor optical amplifier 220 may have the same configuration as in FIG. 82.

The first semiconductor optical amplifier 120 includes a semiconductor element 500 and a current control unit 520. The semiconductor element 500 includes a P-type semiconductor element 501, an active layer 502, an N-type semiconductor element 503, a first electrode 511, and a second electrode 512. The current control unit 520 is connected to the first electrode 511 and the second electrode 512.

16.2 Operation

When current is passed from the first electrode 511 to the second electrode 512, the active layer 502 is excited. When seed light enters the excited active layer 502 and passes through the active layer 502, the seed light is amplified.

Pulse current is passed with the CW seed light entering the active layer 502, and thus the seed light having passed through the active layer 502 is output as a pulse laser beam.

As a result, for example, the current control unit 520 controls a value of current passing through the semiconductor element 500 in accordance with a control signal from an external control unit 540, and thus the seed light is amplified to light intensity of a laser beam according to the current value.

Pulse current is passed through the first semiconductor optical amplifier 120 and the second semiconductor optical amplifier 220 in FIG. 20, and thus CW seed light is amplified in a pulse shape.

Also, as in the case of SOA1(k) in FIGS. 60 and 63, DC current may be controlled to amplify seed light.

17. Embodiment 3

17.1 Configuration

Figure 83:
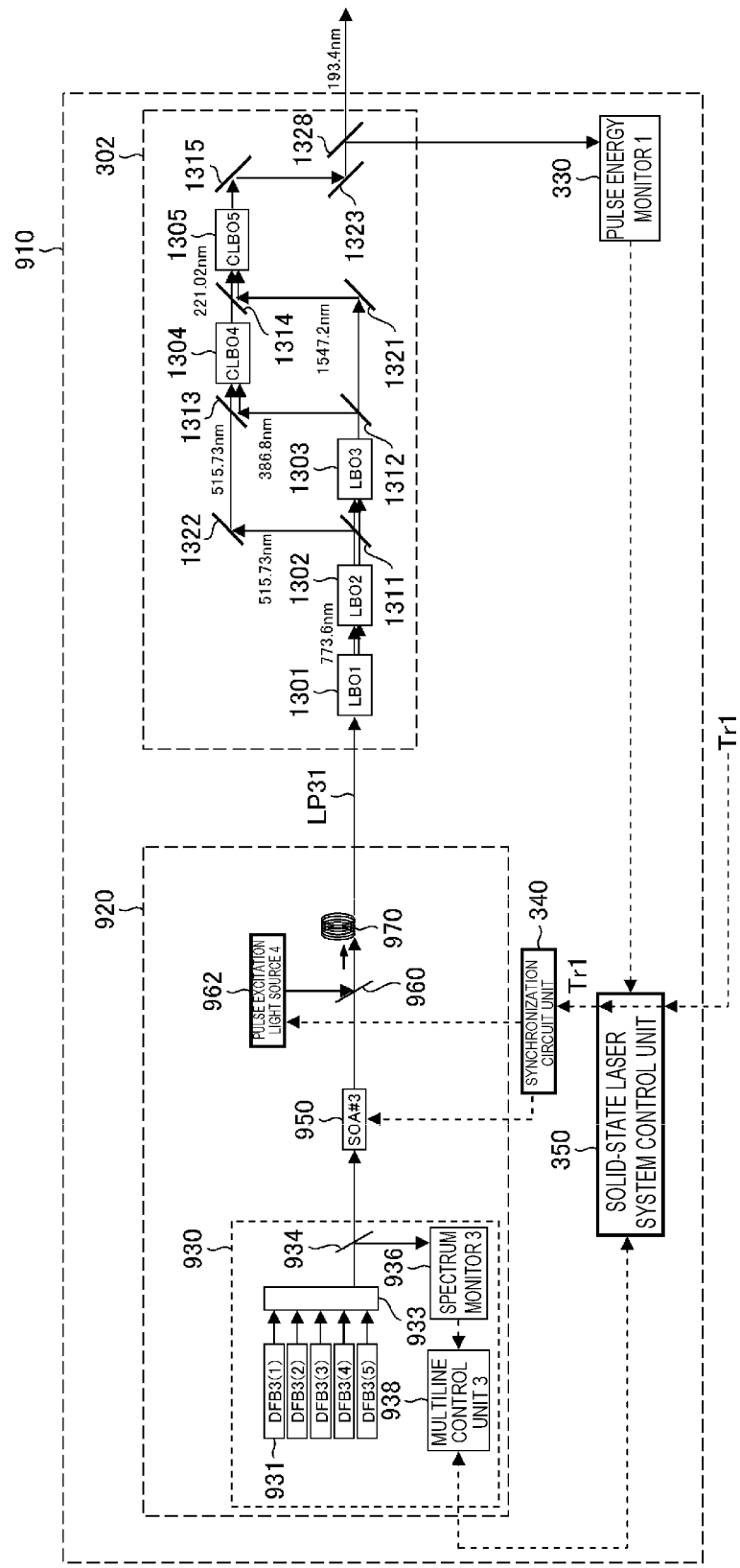
FIG. 83 schematically shows an example of a laser system according to Embodiment 3.

FIG. 83 schematically shows an example of a laser system according to Embodiment 3. Here, only a solid-state laser system 910 is shown. The solid-state laser system 910 in FIG. 82 may be applied in place of the solid-state laser system 10 in Embodiments 1 and 2 described with reference to FIG. 20.

The solid-state laser system 910 includes a third solid-state laser device 920, a second wavelength conversion system 302, the first pulse energy monitor 330, the synchronization circuit unit 340, and the solid-state laser system control unit 350. In the solid-state laser system 910, the third solid-state laser device 920 outputs a pulse laser beam LP31 having a wavelength of about 1547.2 nm, and the second wavelength conversion system 302 wavelength-converts the pulse laser beam LP31 into eighth harmonic light to obtain a pulse laser beam having a wavelength of about 193.4 nm.

The third solid-state laser device 920 has the same configuration as the second solid-state laser device 200 in FIG. 20, and a center wavelength of multiline is about 1547.2 nm. The center wavelength of the multiline of the third solid-state laser device 920 may be changed within a range of 1544 nm to 1548 nm.

The third solid-state laser device 920 includes a third multiple semiconductor laser system 930, a third semiconductor optical amplifier 950, a dichroic mirror 960, a fourth pulse excitation light source 962, and a third fiber amplifier 970.

The third multiple semiconductor laser system 930 includes a plurality of semiconductor lasers 931, a third beam combiner 933, a third beam splitter 934, a third spectrum monitor 936, and a third multiline control unit 938.

The semiconductor lasers 931 are distributed feedback semiconductor lasers that perform CW oscillation in a single longitudinal mode, and five semiconductor lasers 931 are shown herein. In FIG. 83, the semiconductor lasers 931 included in the third multiple semiconductor laser system 930 are denoted as DFB3(1) to DFB3(5). The DFB3(1) to DFB3(5) are set to oscillate near a wavelength of about 1554 nm.

The third fiber amplifier 970 is an Er fiber amplifier.

The second wavelength conversion system 302 wavelength-converts, using a nonlinear crystal, fundamental wave light having a wavelength of about 1547.2 nm output from the third solid-state laser device 920 into eighth harmonic light to generate ultraviolet light having a wavelength of about 193.4 nm.

As shown in FIG. 83, the second wavelength conversion system 302 includes a first LBO crystal 1301, a second LBO crystal 1302, a third LBO crystal 1303, a fourth CLBO crystal 1304, a fifth CLBO crystal 1305, dichroic mirrors 1311, 1312, 1313, 1314, 1315, high reflective mirrors 1321, 1322, 1323, and a beam splitter 1328.

17.2 Operation

Operation of the third solid-state laser device 920 in FIG. 83 is the same as that of the second solid-state laser device 200 described with reference to FIG. 20. Operation of the third multiple semiconductor laser system 930 may be, for example, the same as that of the second multiple semiconductor laser system 260 described in the second embodiment.

In the second wavelength conversion system 302, the first LBO crystal 1301 converts the pulse laser beam LP31 (wavelength of about 1547.2 nm) output from the third solid-state laser device 920 into second harmonic light (wavelength of about 773.6 nm).

The second LBO crystal 1302 generates third harmonic light (wavelength of about 515.78 nm) that is a sum frequency of the second harmonic light (wavelength of about 776.7 nm) and the fundamental wave light (wavelength of about 1547.2 nm). The third harmonic light is split by the dichroic mirror 1311, and one enters the third LBO crystal 1303 and the other enters the fourth CLBO crystal 1304 via the high reflective mirror 1322 and the dichroic mirror 1313.

The third LBO crystal 1303 performs wavelength conversion into fourth harmonic light (wavelength of about 386.8 nm). The fourth harmonic light output from the third LBO crystal 1303 enters the fourth CLBO crystal 1304 and the fifth CLBO crystal 1305 via the dichroic mirror 1312.

The fourth CLBO crystal 1304 performs wavelength conversion into seventh harmonic light (wavelength of about 221.01 nm) that is a sum frequency of the fourth harmonic light (wavelength of about 386.8 nm) and the third harmonic light (wavelength of about 515.78 nm).

The fifth CLBO crystal 1305 performs wavelength conversion into eighth harmonic light (wavelength of about 193.4 nm) that is a sum frequency of the seventh harmonic light (wavelength of about 221.01 nm) and the fundamental wave light (wavelength of about 1547.2 nm).

The operation of the second wavelength conversion system 302 will be further described in detail. Second harmonic generation when the fundamental wave light having the wavelength of about 1547.2 nm (frequency ($0$) output from the third solid-state laser device 920 passes through the first LBO crystal 1301 leads to generation of second harmonic light having a frequency $2w$ (wavelength of about 773.6 nm). Non-critical phase matching (NCPM), which is a method of adjusting a temperature of an LBO crystal, is used for phase matching for wavelength-converting the fundamental wave light into the second harmonic light.

The fundamental wave light having passed through the first LBO crystal 1301 and the second harmonic light generated by the wavelength conversion with the first LBO crystal 1301 enter the second LBO crystal 1302. The second LBO crystal 1302 uses NCPM at a temperature different from that of the first LBO crystal 1301.

The second LBO crystal 1302 generates the sum frequency of the fundamental wave light and the second harmonic light to generate the third harmonic light (wavelength of about 515.73 nm).

The third harmonic light obtained by the second LBO crystal 1302 and the fundamental wave light and the second harmonic light having passed through the second LBO crystal 1302 are split by the dichroic mirror 1311. The third harmonic light (wavelength of about 515.73 nm) reflected by the dichroic mirror 1311 enters the fourth CLBO crystal 1304 via the high reflective mirror 1322 and the dichroic mirror 1313.

The fundamental wave light and the second harmonic light having passed through the dichroic mirror 1311 enter the third LBO crystal 1303. The fundamental wave light passes through the third LBO crystal 1303 without being wavelength-converted, while the second harmonic light is converted into the fourth harmonic light (wavelength of about 386.8 nm) in the third LBO crystal 1303 because of second harmonic generation. The fourth harmonic light obtained by the third LBO crystal 1303 and the fundamental wave light having passed through the third LBO crystal 1303 are split by the dichroic mirror 1312.

The fourth harmonic light reflected by the dichroic mirror 1312 is coaxially combined with the third harmonic light by the dichroic mirror 1313 and enters the fourth CLBO crystal 1304.

The fundamental wave light having passed through the dichroic mirror 1312 is reflected by the high reflective mirror 1321 and enters the fifth CLBO crystal 1305 via the dichroic mirror 1314.

The fourth CLBO crystal 1304 generates the sum frequency of the third harmonic light and the fourth harmonic light to obtain the seventh harmonic light (wavelength of about 221.02 nm). The seventh harmonic light obtained by the fourth CLBO crystal 1304 is coaxially combined with the fundamental wave light by the dichroic mirror 1314 and enters the fifth CLBO crystal 1305.

The fifth CLBO crystal 1305 generates the sum frequency of the fundamental wave light and the seventh harmonic light to obtain the eighth harmonic light (wavelength of about 193.4 nm).

The eighth harmonic light obtained by the fifth CLBO crystal 1305 and the fundamental wave light and the seventh harmonic light having passed through the fifth CLBO crystal 1305 are split by the dichroic mirror 1315.

The eighth harmonic light (wavelength of about 193.4 nm) reflected by the dichroic mirror 1315 is output from the second wavelength conversion system 302 via the high reflective mirror 1323 and the beam splitter 1328. In this manner, the eighth harmonic light output from the second wavelength conversion system 302 is input to the excimer amplifier 14 via the first high reflective mirror 11 and the second high reflective mirror 12 in FIG. 20.

17.3 Control Example of Third Multiple Semiconductor Laser System

Figure 84:
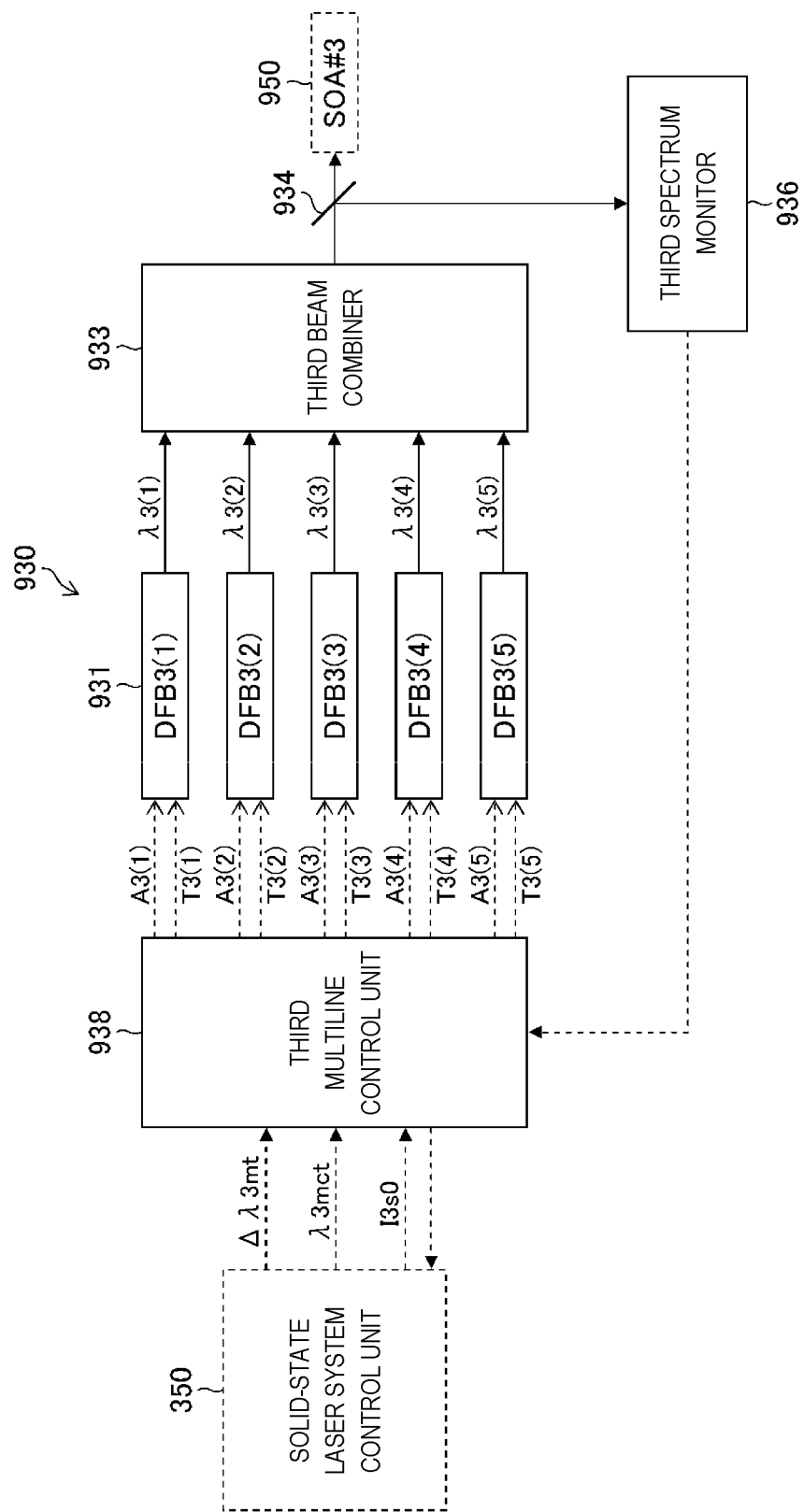
FIG. 84 is a block diagram of a control example of a third multiple semiconductor laser system.

FIG. 84 is a block diagram of a control example of the third multiple semiconductor laser system 930. In the third multiple semiconductor laser system 930, the center wavelength of the multiline may be variable and the spectral line width may be also variable. A multiline spectrum obtained by the third multiple semiconductor laser system 930 is referred to as "third multiline". Here, an example is shown in which control is performed to change a target center wavelength $\lambda 3mct$ and a target spectral line width $\Delta\lambda 3mt$ of the third multiline.

The solid-state laser system control unit 350 transmits, to the third multiline control unit 938, data of the target spectral line width $\Delta\lambda 3mt$, the target center wavelength $\lambda 3mct$, and target light intensity list (=I1s0) of the third multiline. The third multiline control unit 938 controls current values A3(1) to A3(5) and temperatures T3(1) to T3(5) of semiconductor lasers DFB3(1) to DFB3(5). Wavelengths of laser beams output from the semiconductor lasers DFB3(1) to DFB3(5) are denoted as $\lambda 3(1)$ to $\lambda 3(5)$. The plurality of laser beams having different wavelengths are combined by the third beam combiner 933.

The multiline laser beam output from the third beam combiner 933 enters the third beam splitter 934. The laser beam having passed through the third beam splitter 934 enters the third semiconductor optical amplifier 950. The laser beam reflected by the third beam splitter 934 enters the third spectrum monitor 936.

Figure 85:
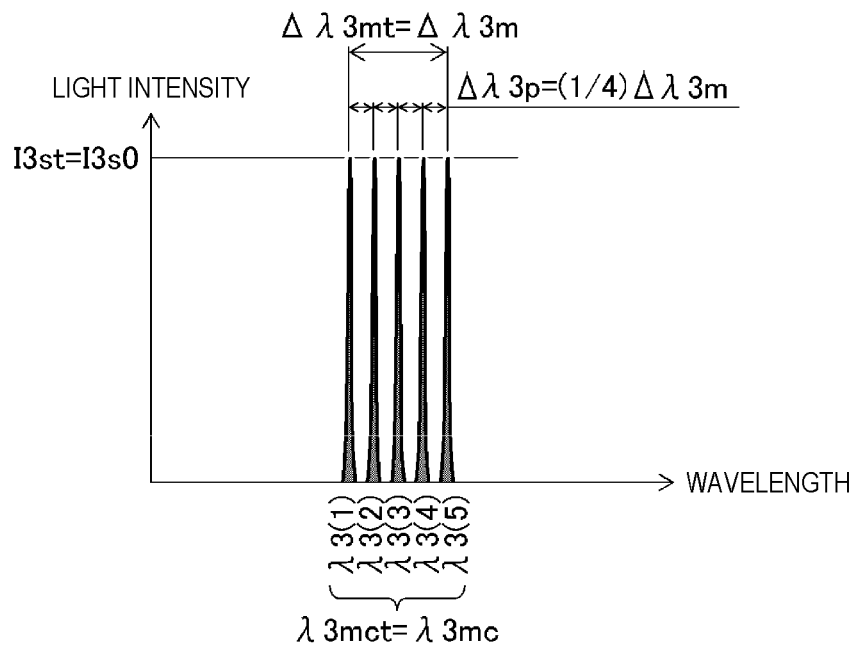
FIG. 85 shows an example of a multiline spectrum detected by a third spectrum monitor in the control example in FIG. 84.

FIG. 85 shows an example of a multiline spectrum detected by the third spectrum monitor 936 in the control example in FIG. 84. Here, an example is shown in which the target center wavelength $\lambda 3mct$ of the multiline is set to $\lambda 3mc$ and the target spectral line width $\Delta\lambda 3mt$ is set to $\Delta\lambda 3m$. A wavelength interval $\Delta\lambda 3p$ of the multiline is generally constant and one fourth of the spectral line width $\Delta\lambda 3m$.

Figure 86:
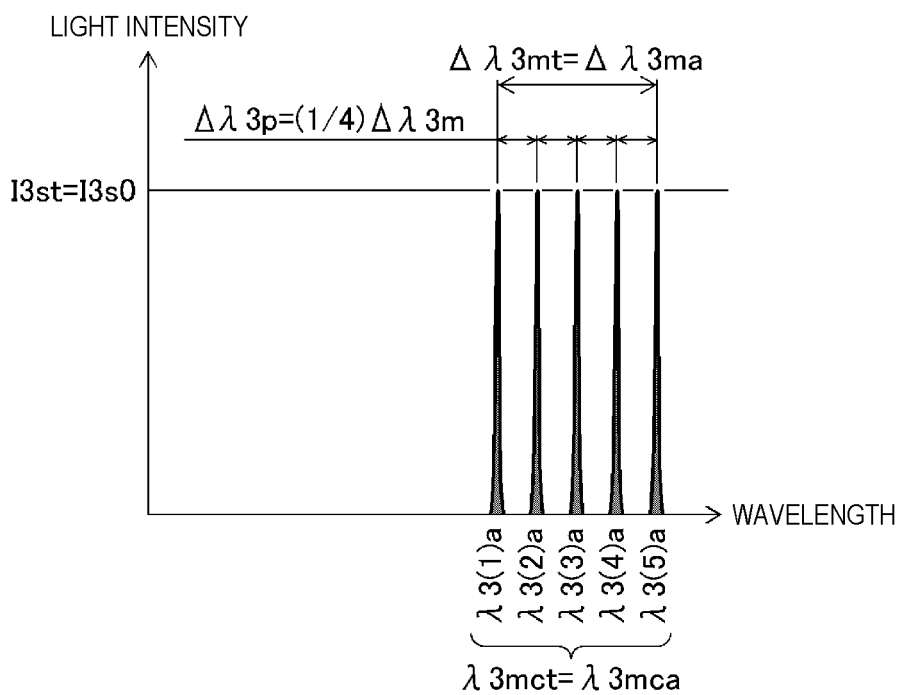
FIG. 86 shows an example of a multiline spectrum when control to change a center wavelength and a spectral line width of the multiline is performed in a spectral shape in FIG. 85.

FIG. 86 shows an example of a multiline spectrum when control to change the center wavelength and the spectral line width of the multiline is performed in a spectral shape in FIG. 85. In FIG. 86, as compared to FIG. 85, the target center wavelength $\lambda 3mct$ is changed to $\lambda 3mca$ and the target spectral line width $\Delta\lambda 3mt$ is changed to $\Delta\lambda 3ma$. As a result, the wavelengths of the semiconductor lasers are changed to $\lambda 3(1)a$ to $\lambda 3(5)a$, and the wavelength interval $\Delta\lambda 3p$ is one fourth of the spectral line width $\Delta\lambda 3ma$. In the multiline in FIG. 86, the lines of the wavelengths $\lambda 3(1)a$ to $\lambda 3(5)a$ have the same light intensity $I3s0$ as in FIG. 85.

17.4 Effect

According to Embodiment 3, the oscillation wavelength intervals of the semiconductor lasers can be constantly controlled while the multiline spectrum generated by the semiconductor lasers in the third multiple semiconductor laser system 930 is being monitored, thereby controlling the spectral line width of the pulse-amplified excimer laser beam with high accuracy.

Also, the oscillation wavelength intervals of the semiconductor lasers of the multiline generated by the semiconductor lasers are controlled to suppress SBS in the third fiber amplifier 970. This can suppress damage to the third fiber amplifier 970 and the third multiple semiconductor laser system.

The third solid-state laser device 920 in Embodiment 3 is an example of "first solid-state laser device" in the present disclosure. The pulse laser beam LP31 output from the third solid-state laser device 920 is an example of "first pulse laser beam" in the present disclosure. The third multiple semiconductor laser system 930 is an example of "first multiple semiconductor laser system" in the present disclosure. The semiconductor lasers 931 are examples of "a plurality of first semiconductor lasers" in the present disclosure.

17.5 Variant

As the third multiple semiconductor laser system 930, the same configuration as in FIG. 60 or FIG. 67 may be applied in place of the configuration in FIG. 84.

18. Electronic Device Manufacturing Method

Figure 87:
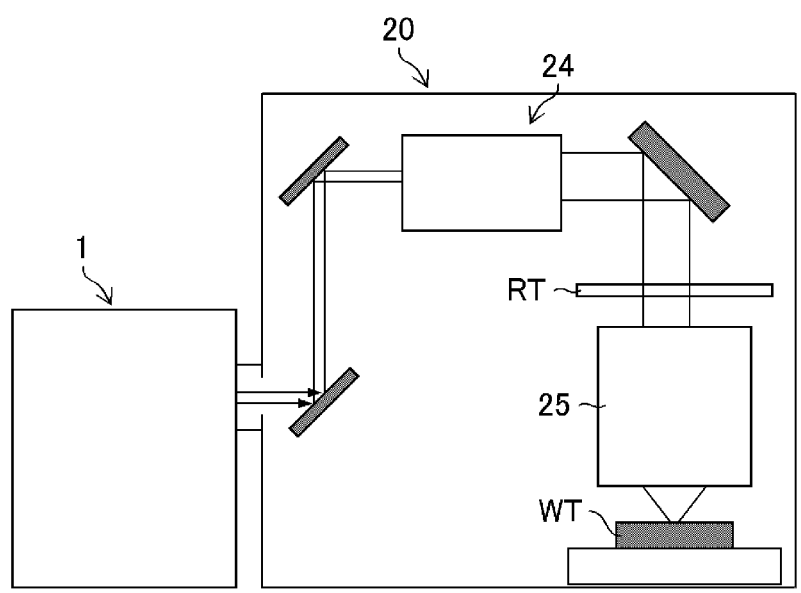
FIG. 87 schematically shows an exemplary configuration of an exposure apparatus.

FIG. 87 schematically shows an exemplary configuration of the exposure apparatus 20. In FIG. 87, the exposure apparatus 20 includes an illumination optical system 24 and a projection optical system 25. The illumination optical system 24 illuminates, with a laser beam incident from the laser system 1, a reticle pattern on a reticle stage RT. The projection optical system 25 reduces and projects the laser beam having passed though the reticle and forms an image thereof on a workpiece (not shown) arranged on a workpiece table WT. The workpiece is a photosensitive substrate such as a semiconductor wafer coated with photoresist. The exposure apparatus 20 synchronously translates the reticle stage RT and the workpiece table WT to expose the laser beam reflecting the reticle pattern onto the workpiece. Through the exposure process as described above, a device pattern is transferred onto the semiconductor wafer, thereby manufacturing a semiconductor device.

19. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser system comprising:
    a first solid-state laser device configured to output a first pulse laser beam;
    a wavelength conversion system configured to wavelength-convert the first pulse laser beam output from the first solid-state laser device;
    an excimer amplifier configured to amplify a second pulse laser beam wavelength-converted by the wavelength conversion system; and
    a control unit configured to control at least a center wavelength or a spectral line width of an excimer laser beam output from the excimer amplifier,
    the first solid-state laser device including:
        a first multiple semiconductor laser system;
        a first semiconductor optical amplifier configured to pulse-amplify a laser beam output from the first multiple semiconductor laser system; and
        a first fiber amplifier including a first optical fiber configured to amplify the pulse laser beam output from the first semiconductor optical amplifier,
    the first multiple semiconductor laser system including:
        a plurality of first semiconductor lasers configured to perform continuous wave oscillation in a single longitudinal mode with different wavelengths;
        a first beam combiner configured to combine laser beams output from the first semiconductor lasers and output a laser beam having a first multiline spectrum including a plurality of peak wavelengths; and
        a first spectrum monitor configured to receive part of the continuous wave laser beams output from the first semiconductor lasers and measure a wavelength and light intensity of each of the laser beams output from the first semiconductor lasers,
    the control unit controlling an oscillation wavelength and light intensity of each line of the first multiline spectrum generated by the first semiconductor lasers to obtain an excimer laser beam having at least a target center wavelength or a target spectral line width instructed by an external device.

2. The laser system according to claim 1, wherein the first spectrum monitor includes:
    a first reference laser beam source; and
    a first spectrometer, and
    the first spectrum monitor measures an oscillation wavelength and light intensity of each of the first semiconductor lasers by causing a reference laser beam output from the first reference laser beam source and the laser beams output from the first semiconductor lasers to enter the first spectrometer.

3. The laser system according to claim 1, wherein the first spectrum monitor includes:
    a first reference laser beam source; and
    a heterodyne interferometer, and
    the first spectrum monitor measures an oscillation wavelength and light intensity of each of the first semiconductor lasers from a beat signal between a reference laser beam output from the first reference laser beam source and each of the laser beams output from the first semiconductor lasers.

4. The laser system according to claim 1, wherein the control unit controls intervals between the oscillation wavelengths of the first semiconductor lasers that generate the first multiline spectrum.

5. The laser system according to claim 4, wherein the control unit controls the intervals between the oscillation wavelengths of the first semiconductor lasers to be the same.

6. The laser system according to claim 1, wherein the control unit controls, as a center wavelength of the first multiline spectrum, a centroid wavelength calculated from the oscillation wavelength and the light intensity of each of the first semiconductor lasers.

7. The laser system according to claim 1, further comprising a spectrometer configured to measure a spectrum of the excimer laser beam output from the excimer amplifier.

8. The laser system according to claim 1, wherein the control unit uses relationship data specifying a relationship between the spectral line width of the excimer laser beam output from the excimer amplifier and the first multiline spectrum to calculate a target spectral line width of the first multiline spectrum from the relationship data and the target spectral line width.

9. The laser system according to claim 1, wherein the center wavelength of the first multiline spectrum is within a range of 1028.5 nm to 1030.7 nm, and the first fiber amplifier is a Yb fiber amplifier using a Yb-doped optical fiber as the first optical fiber.

10. The laser system according to claim 9, wherein the first spectrum monitor includes a first reference laser beam source,
    the first reference laser beam source including:
        a first reference semiconductor laser configured to perform continuous wave oscillation in a single longitudinal mode;
        a nonlinear crystal configured to convert the laser beam output from the first reference semiconductor laser into second harmonic light;
        a first absorption cell configured to absorb the second harmonic light; and
        a first reference laser control unit configured to control an oscillation wavelength of the first reference semiconductor laser such that the second harmonic light coincides with a first absorption line of the first absorption cell.

11. The laser system according to claim 10, wherein the first absorption cell contains iodine gas.

12. The laser system according to claim 1, wherein the first multiple semiconductor laser system further includes a plurality of semiconductor optical amplifiers arranged in optical paths between the first semiconductor lasers and the first beam combiner.

13. The laser system according to claim 12, wherein the first multiple semiconductor laser system further includes a first multiline control unit configured to control current of each of the semiconductor optical amplifiers such that light intensity of each line of the first multiline spectrum has a desired value.

14. The laser system according to claim 1, further comprising a second solid-state laser device configured to output a third pulse laser beam that enters the wavelength conversion system,
the second solid-state laser device including:
    a second multiple semiconductor laser system;
    a second semiconductor optical amplifier configured to pulse-amplify a laser beam output from the second multiple semiconductor laser system; and
    a second fiber amplifier including a second optical fiber configured to amplify the pulse laser beam output from the second semiconductor optical amplifier,
the second multiple semiconductor laser system including:
    a plurality of second semiconductor lasers configured to perform continuous wave oscillation in a single longitudinal mode with different wavelengths;
    a second beam combiner configured to combine laser beams output from the second semiconductor lasers and output a laser beam having a second multiline spectrum including a plurality of peak wavelengths; and
    a second spectrum monitor configured to receive part of the continuous wave laser beams output from the second semiconductor lasers and measure a wavelength and light intensity of each of the laser beams output from the second semiconductor lasers.

15. The laser system according to claim 14, wherein the wavelength conversion system includes:
    a first nonlinear crystal and a second nonlinear crystal configured to wavelength-convert the first pulse laser beam into fourth harmonic light to generate a fourth pulse laser beam;
    a third nonlinear crystal configured to perform wavelength conversion into a sum frequency of the fourth pulse laser beam and the third pulse laser beam to generate a fifth pulse laser beam; and
    a fourth nonlinear crystal configured to perform wavelength conversion into a sum frequency of the fifth pulse laser beam and the third pulse laser beam to generate the second pulse laser beam.

16. The laser system according to claim 14, wherein a center wavelength of the second multiline spectrum is within a range of 1548 nm to 1557 nm, and
    the second fiber amplifier is an Er fiber amplifier using an Er-doped optical fiber as the second optical fiber.

17. The laser system according to claim 16, wherein the second spectrum monitor includes a second reference laser beam source,
the second reference laser beam source including:
    a second reference semiconductor laser configured to perform continuous wave oscillation in a single longitudinal mode;
    a second absorption cell configured to absorb a laser beam output from the second reference semiconductor laser; and
    a second reference laser control unit configured to control an oscillation wavelength of the second reference semiconductor laser to a second absorption line of the second absorption cell.

18. The laser system according to claim 17, wherein the second absorption cell contains isotope hydrogen cyanide gas.

19. The laser system according to claim 17, wherein the second absorption cell contains isotope acetylene gas.

20. An electronic device manufacturing method comprising:
generating an excimer laser beam with a laser system, the laser system including
    a first solid-state laser device configured to output a first pulse laser beam,
    a wavelength conversion system configured to wavelength-convert the first pulse laser beam output from the first solid-state laser device,
    an excimer amplifier configured to amplify a second pulse laser beam wavelength-converted by the wavelength conversion system, and
    a control unit configured to control at least a center wavelength or a spectral line width of an excimer laser beam output from the excimer amplifier,
the first solid-state laser device including
    a first multiple semiconductor laser system,
    a first semiconductor optical amplifier configured to pulse-amplify a laser beam output from the first multiple semiconductor laser system, and
    a first fiber amplifier including a first optical fiber configured to amplify the pulse laser beam output from the first semiconductor optical amplifier,
the first multiple semiconductor laser system including
    a plurality of first semiconductor lasers configured to perform continuous wave oscillation in a single longitudinal mode with different wavelengths,
    a first beam combiner configured to combine laser beams output from the first semiconductor lasers and output a laser beam having a first multiline spectrum including a plurality of peak wavelengths, and
    a first spectrum monitor configured to receive part of the continuous wave laser beams output from the first semiconductor lasers and measure a wavelength and light intensity of each of the laser beams output from the first semiconductor lasers,
the control unit controlling an oscillation wavelength and light intensity of each line of the first multiline spectrum generated by the first semiconductor lasers to obtain an excimer laser beam having at least a target center wavelength or a target spectral line width instructed by an external device;
outputting the excimer laser beam to an exposure apparatus; and
exposing the excimer laser beam onto a photosensitive substrate within the exposure apparatus to manufacture an electronic device.

* * * * *